(12) United States Patent
Nebashi et al.

(10) Patent No.: US 10,262,738 B2
(45) Date of Patent: Apr. 16, 2019

(54) CONTENT ADDRESSABLE MEMORY CELL AND CONTENT ADDRESSABLE MEMORY

(71) Applicant: NEC CORPORATION, Tokyo (JP)

(72) Inventors: Ryusuke Nebashi, Tokyo (JP); Noboru Sakimura, Tokyo (JP); Tadahiko Sugibayashi, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 360 days.

(21) Appl. No.: 14/392,273

(22) PCT Filed: Jun. 17, 2014

(86) PCT No.: PCT/JP2014/003248
§ 371 (c)(1),
(2) Date: Feb. 1, 2016

(87) PCT Pub. No.: WO2014/208051
PCT Pub. Date: Dec. 31, 2014

(65) Prior Publication Data
US 2016/0300614 A1 Oct. 13, 2016

(30) Foreign Application Priority Data
Jun. 26, 2013 (JP) ................................. 2013-133483

(51) Int. Cl.
*G11C 15/02* (2006.01)
*G11C 15/04* (2006.01)
*G11C 11/16* (2006.01)

(52) U.S. Cl.
CPC .......... *G11C 15/02* (2013.01); *G11C 11/1657* (2013.01); *G11C 11/1659* (2013.01); *G11C 11/1675* (2013.01); *G11C 15/046* (2013.01)

(58) Field of Classification Search
CPC . G11C 15/02; G11C 11/1675; G11C 11/1657; G11C 11/1659; G11C 15/046
See application file for complete search history.

(56) References Cited

U.S. PATENT DOCUMENTS 9,502,114 B1 * 11/2016 Lin ...................... G11C 15/046
2011/0051483 A1 3/2011 Chang et al.
(Continued)

FOREIGN PATENT DOCUMENTS

| JP | 2011-48894 A | 3/2011 |
|----|--------------|--------|
| JP | 2011-76688 A | 4/2011 |
| WO | 2010/137573 A1 | 12/2010 |

OTHER PUBLICATIONS

International Search Report of PCT/JP2014/003248, dated Sep. 9, 2014. [PCT/ISA/210].
(Continued)

*Primary Examiner* — Mohammed A Bashar
(74) *Attorney, Agent, or Firm* — Sughrue Mion, PLLC

(57) ABSTRACT

In order to provide a technique for reducing an area of a content addressable memory cell and suppressing a leak current in a content addressable memory which calculates similarity, a content addressable memory cell of the present invention, comprising: a resistance network which includes plural current paths, a logic circuit for selecting a current path in response to input data, and a variable-resistance-type non-volatile memory element that is arranged on at least one current path and stores data and whose resistance value is changed according to a result of logical calculation based on the input data and the stored data; and a charge/discharge circuit which is connected with the resistance network and a match line and whose delay time from inputting a signal through the match line until outputting the signal is changed
(Continued)

according to the result of logical calculation based on the input data and the stored data.

10 Claims, 44 Drawing Sheets

(56) References Cited

U.S. PATENT DOCUMENTS

2015/0206586 A1* 7/2015 Chang .................. G11C 15/046
  365/49.17
2016/0372197 A1* 12/2016 Roy ..................... G11C 15/046

OTHER PUBLICATIONS

Written Opinion of PCT/JP2014/003248, dated Sep. 9, 2014. [PCT/ISA/237].

* cited by examiner

Fig. 4

19 LOGICAL CALCULATION TABLE

| R0 | R1 | Stored Data A | Input Data B | Delay |
|----|----|---------------|--------------|-------|
| RH | RL | 0 | 0 | t(1) |
| RH | RL | 0 | 1 | t(0) |
| RL | RH | 1 | 0 | t(0) |
| RL | RH | 1 | 1 | t(1) |

DELAY TIME OF WORD CIRCUIT
(t(0)+t(1))/2+(N−1−d)·t(1)+d·t(0)

Fig. 17

28 LOGICAL CALCULATION TABLE

| R0 | Stored Data A | Input Data B | Delay |
|----|---------------|--------------|-------|
| RH | 0 | 0 | t(0,tr) |
| RH | 0 | 1 | t(0) |
| RL | 1 | 0 | t(0,tr) |
| RL | 1 | 1 | t(1) |

Fig. 24

29 LOGICAL CALCULATION TABLE

| R1 | R0 | Stored Data A |
|---|---|---|
| RL | RH | 1 |
| RL | RL | 0 |
| RH | RL | −1 |

Fig. 44

| R1 | R0 | Stored Data A |
|---|---|---|
| RL | RH | 1 |
| RH | RH | 0 |
| RH | RL | -1 |

69 LOGICAL CALCULATION TABLE

CONTENT ADDRESSABLE MEMORY CELL AND CONTENT ADDRESSABLE MEMORY

CROSS REFERENCE TO RELATED APPLICATIONS

This application is a National Stage of International Application No. PCT/JP2014/003248 filed Jun. 17, 2014, claiming priority based on Japanese Patent Application No. 2013-133483, filed Jun. 26, 2013, the contents of all of which are incorporated herein by reference in their entirety.

TECHNICAL FIELD

The present invention relates to a content addressable memory cell and a content addressable memory. Especially, the present invention relates to a content addressable memory cell and a content addressable memory each of which uses a variable-resistance-type non-volatile memory element.

BACKGROUND ART

In the case of the pattern recognition, a calculation of similarity between data is a fundamental calculation. As a general association memory, the content addressable memory (hereinafter, denoted as CAM) is well-known. In the case of the general CAM, if input data are coincident with stored data, it is possible to retrieve the stored data with reference to the input data, but it is impossible to retrieve data which are similar to the input data.

PTL 1 discloses an association memory which calculates degrees of similarity in parallel by use of hardware to retrieve data which has the maximum degree of similarity.

The association memory described in PTL 1 includes a storage circuit which stores reference data, a comparison circuit which compares input data with the reference data, and a pulse generating circuit which generates a pulse corresponding to the comparison result outputted by the comparison circuit.

CITATION LIST

Patent Literature

[PTL 1] Japanese Patent Application Laid-Open Publication No. 2011-76688

SUMMARY OF INVENTION

Technical Problem

The association memory described in PTL 1 has a problem that it is difficult to make an area of an association memory cell small in comparison with a CAM cell which includes only the storage circuit and the comparison circuit.

Moreover, since the association memory cell described in PTL 1 includes a CMOS (Complementary Metal Oxide Semiconductor) circuit, data are lost when stopping electric power feed. Therefore, there is a problem that it is necessary to make an electric power source always ON, and consequently it is difficult to suppress a leak current.

An object of the present invention is to provide a technique for reducing an area of a content addressable memory cell and suppressing a leak current in a content addressable memory which calculates similarity.

Solution to Problem

A content addressable memory cell of the present invention includes: a resistance network which includes a plurality of current paths, a logic circuit that is connected with the plural current paths and a pair of search lines and selects the current path in response to input data provided through the pair of search lines, and a variable-resistance-type non-volatile memory element that is arranged on at least one current path out of the plural current paths and stores data and whose resistance value is changed according to a result of logical calculation based on the input data and the stored data; and a charge/discharge circuit which is connected with the resistance network and a match line and whose delay time from inputting a signal through the match line until outputting the signal is changed according to the result of logical calculation based on the input data and the stored data.

An content addressable memory of the present invention includes: a plurality of content addressable memory cells which are arranged in a form of grid; a plurality of pairs of search lines which are connected with the plural content addressable memory cells arranged in a first direction; a plurality of match lines which connect the plural content addressable memories, that are arranged in a second direction, in series; a word circuit which includes the plural content addressable memory cells that are arranged in the second direction, and the match line; a column side circuit which is connected with the plural search lines and drives the pair of search lines according to input data at a time of calculation; a row side circuit which is connected with the plural match lines and drives the plural match lines; and a sense circuit which is connected with the plural match lines and senses potential of the plural match lines. The content addressable memory cell includes: a resistance network which includes a plurality of current paths, a logic circuit that is connected with the plural current paths and the pair of search lines and selects the current path in response to the input data provided through the pair of search lines, and a variable-resistance-type non-volatile memory element that is arranged on at least one current path out of the plural current paths and stores data and whose resistance value is changed according to a result of logical calculation based on the input data and the stored data; and a charge/discharge circuit which is connected with the resistance network and the match line and whose delay time from inputting a signal through the match line until outputting the signal is changed according to the result of logical calculation based on the input data and the stored data.

Advantageous Effects of Invention

According to the present invention, it is possible to reduce the area of the content addressable memory cell and to suppress the leak current in the content addressable memory which calculates similarity.

BRIEF DESCRIPTION OF DRAWINGS

FIG. 4 is a logical calculation table showing a logical calculation which is carried out in the content addressable memory cell according to the first exemplary embodiment of the present invention.

FIG. 17 is a logical calculation table showing a logical calculation which is carried out in the content addressable memory cell according to the second exemplary embodiment of the present invention.

FIG. 24 is a logical calculation table showing correspondence between a logical value of a three-level content addressable memory cell and a resistance value of a variable-resistance-type non-volatile memory element according to the second exemplary embodiment of the present invention.

FIG. 44 is a logical calculation table showing correspondence between a logical value of the three-level content addressable memory cell and a resistance value of the variable-resistance-type non-volatile memory element according to the sixth exemplary embodiment of the present invention.

DESCRIPTION OF EMBODIMENTS

Figure 1:
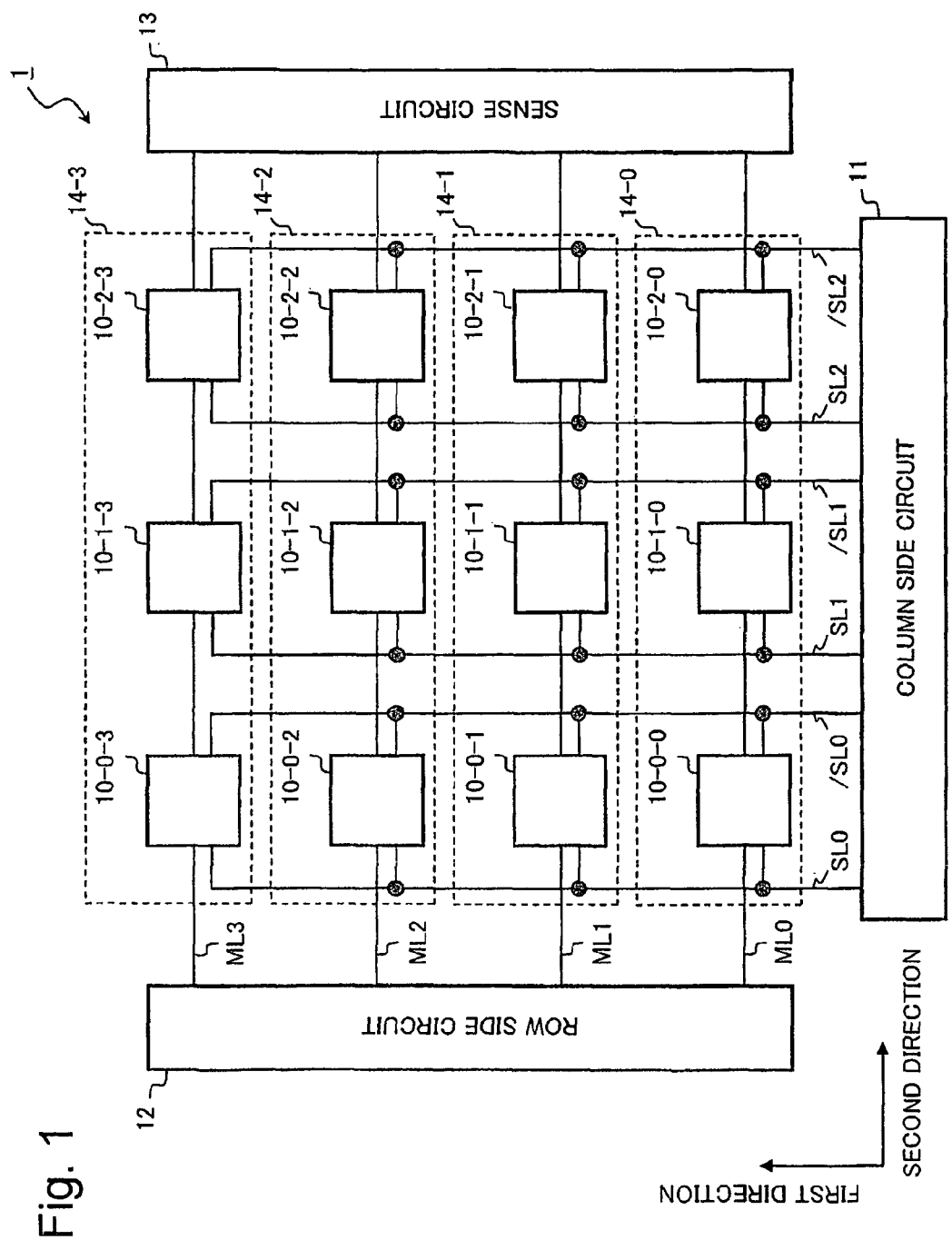
FIG. 1 is a block diagram showing schematic composition of a content addressable memory according to a first exemplary embodiment of the present invention.

Hereinafter, an exemplary embodiment of the present invention will be explained with reference to drawings. While the exemplary embodiment mentioned in the following has preferable limitation from a technical point of view, the scope of the present invention is not limited by the preferable limitation.

First Exemplary Embodiment

Firstly, a first exemplary embodiment will be explained in detail with reference to drawings. Here, in the following explanation, with respect to a component which is assigned a symbol or a code in the drawing, a name of the component includes the symbol or the code at an end of the name except for a case that the component appears firstly in DESCRIPTION.

(Composition)

FIG. 1 is a block diagram showing schematic composition of a content addressable memory 1 according to the first exemplary embodiment of the present invention. Here, in the explanation of the present exemplary embodiment, a content addressable memory in a modification, which includes a content addressable memory cell having a different form, is also denoted as the content addressable memory 1. Here, in FIG. 1, a direction from a row side circuit 12 toward a sense circuit 13 is defined as a second direction, and a direction from a column side circuit 11 toward each content addressable memory cell 10 which is vertical to the second direction is defined as a first direction. The definitions on the first direction and the second direction are applied also in other drawings.

The content addressable memory 1 according to the first exemplary embodiment includes the plural content addressable memory cells 10 which are arranged in a form of two-dimensional matrix (a form of grid), and the plural content addressable memory cells 10 which are arranged in the second direction compose a word circuit 14. Here, in FIG. 1, in order to distinguish the plural content addressable memory cells 10 and the plural word circuits 14, an end of a code, which is assigned to each component, includes a column number and a row number. In the case that the distinction is unnecessary, the end number of the code is omitted.

Moreover, the content addressable memory 1 includes a plurality of pairs of search lines SL and /SL and a plurality of match lines ML, where the pair of search lines SL and /SL is commonly connected with the content addressable memory cells 10 which are arranged in the first direction, and the match line ML connects the content addressable memory cells 10, which are arranged in the second direction, in series. Here, in FIG. 1, in order to distinguish the plural wirings, an end of a code, which is assigned to each wiring, includes a column number and a row number. In the case that the distinction is unnecessary, the end number of the code is omitted.

Furthermore, the content addressable memory 1 includes the column side circuit 11, the row side circuit 12 and the sense circuit 13. The column side circuit 11 is connected with the plural pairs of search lines SL and /SL, and drives the pair of search lines SL and /SL according to input data at a time of calculation. The row side circuit 12 is connected with the plural match lines ML, and drives the match line ML. The sense circuit 13 is connected with the plural match lines ML, and senses potential of the match line ML.

(Content Addressable Memory Cell)

Figure 2:
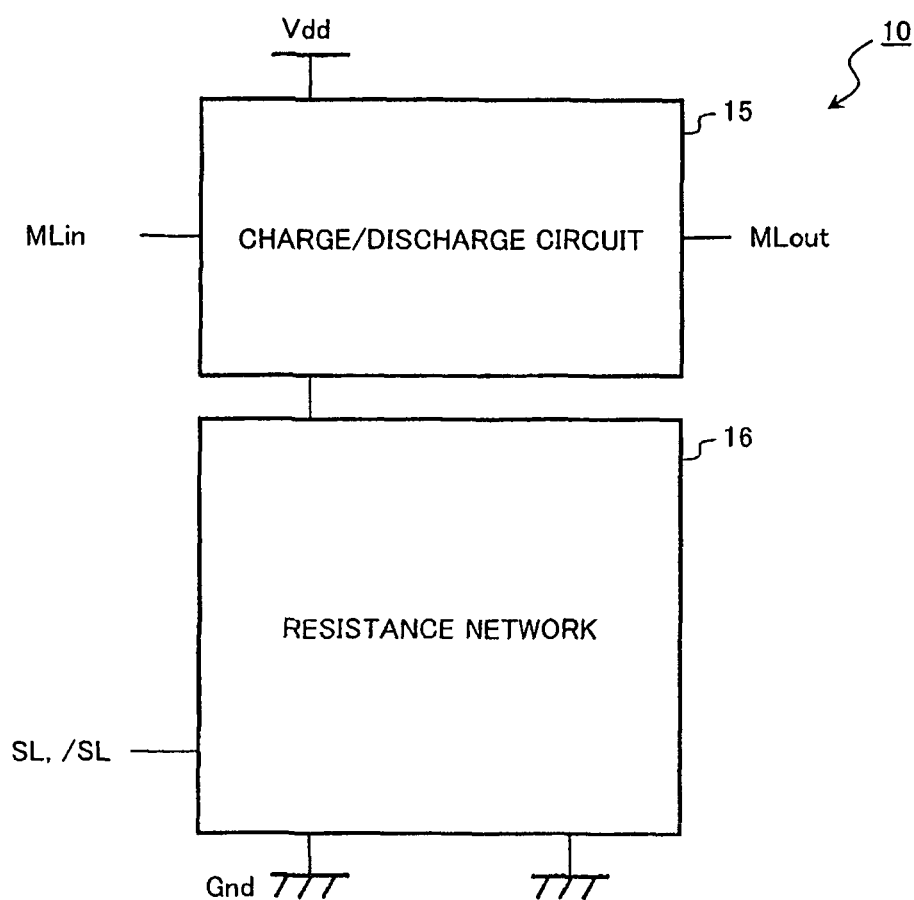
FIG. 2 is a block diagram showing composition of a content addressable memory cell according to the first exemplary embodiment of the present invention.

FIG. 2 is a block diagram showing schematic composition of the content addressable memory cell 10 according to the first exemplary embodiment of the present invention.

The content addressable memory cell 10 includes a charge/discharge circuit 15 and a resistance network 16.

The pair of search lines SL and /SL is connected with the resistance network 16.

The match line ML connected with one content addressable memory cell 10 out of the content addressable memory cells 10, which are arranged in the second direction and which are adjacent each other, is corresponding to a match line input terminal MLin of the charge/discharge circuit 15. The match line ML connected with the other content addressable memory cell 10 out of content addressable memory cells 10, which are arranged in the second direction and which are adjacent each other, is corresponding to a match line output terminal MLout of the charge/discharge circuit 15. That is, the match line input terminal MLin is connected with the row side circuit 12, or MLout of the content addressable memory 10 which is adjacent in a direction toward the row side circuit 12. Moreover, the match line output terminal MLout is connected with the sense side circuit 13, or MLin of the content addressable memory 10 which is adjacent in a direction toward the sense side circuit 13.

Figure 3:
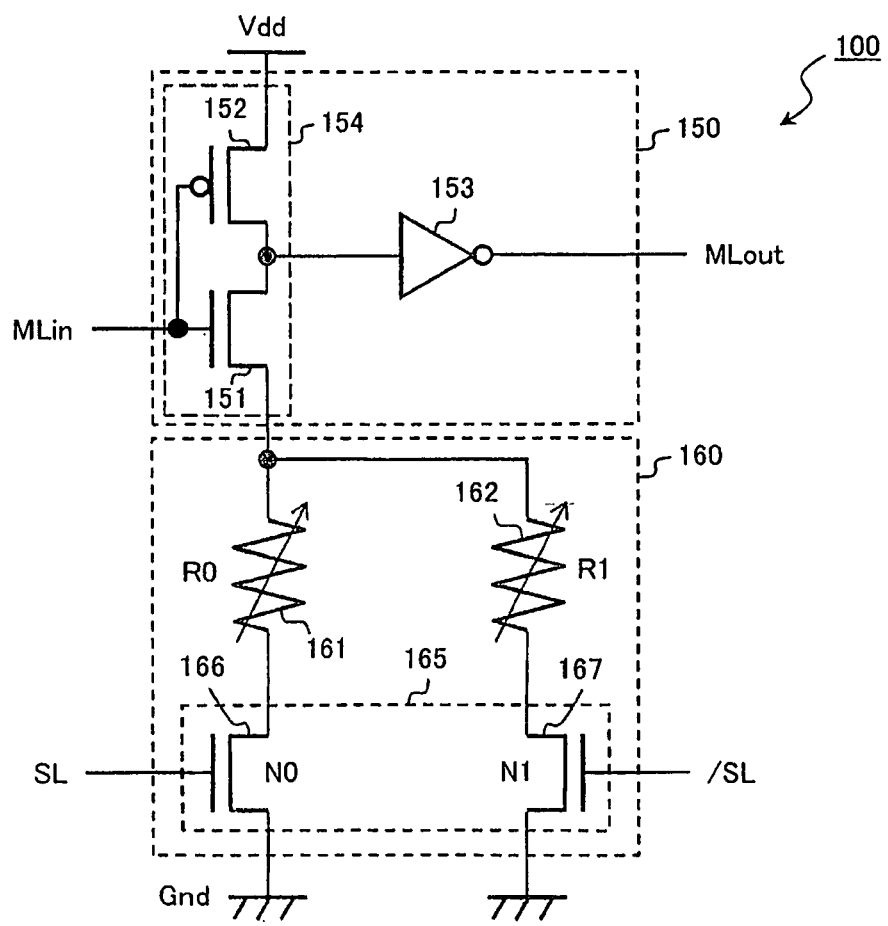
FIG. 3 is a specific circuit diagram of the content addressable memory cell according to the first exemplary embodiment of the present invention.

FIG. 3 is a specific circuit diagram of a content addressable memory cell 100 according to the first exemplary embodiment of the present invention. The content addressable memory cell 100 includes a charge/discharge circuit 150 and a resistance network 160.

The word circuit 14, which includes the content addressable memory cell 100 having the above-mentioned circuit composition, can reflect the hamming distance between stored data and input data in a delay time of the word circuit 14.

The charge/discharge circuit 150 includes a NMOS transistor 151, a PMOS transistor 152 and an inverter 153. The NMOS transistor 151 and the PMOS transistor 152 form a CMOS inverter 154.

The match line input terminal MLin is connected with a gate of the NMOS transistor 151 and a gate of the PMOS transistor 152. An input terminal of the inverter 153 is connected with a drain of the PMOS transistor 152 and a drain of the NMOS transistor 151. An output terminal of the inverter 135 is connected with the match line output terminal MLout. A source of the PMOS transistor is connected with an electric power source voltage Vdd. A source of the NMOS transistor 151 is connected with one end of a variable-resistance-type non-volatile memory element R0 of the resistance network 160.

The resistance network 160 includes the variable-resistance-type non-volatile memory element R0, a variable-resistance-type non-volatile memory element R1 and a NMOS logic circuit 165 (logic circuit) Here, in FIG. 3, the variable-resistance-type non-volatile memory element R0 is a variable-resistance-type non-volatile memory element 161, and the variable-resistance-type non-volatile memory element R1 is a variable-resistance-type non-volatile memory element 162. The NMOS logic circuit 165 includes a NMOS transistor N0 which is a first NMOS transistor, and a NMOS transistor N1 which is a second NMOS transistor. Here, the NMOS transistor N0 is a NMOS transistor 166, and the NMOS transistor N1 is a NMOS transistor 167

The one end of the variable-resistance-type non-volatile memory element R0 is connected with the source of the NMOS transistor 151 of the charge/discharge circuit 150, and the other end is connected with a drain of the NMOS transistor N0. One end of the variable-resistance-type non-volatile memory element R1 is connected with the source of the NMOS transistor 151 of the charge/discharge circuit 150, and the other end is connected with a drain of the NMOS transistor N1. Here, the one end of the variable-resistance-type non-volatile memory element R0 and the one end of the variable-resistance-type non-volatile memory element R1 are connected each other.

A gate of the NMOS transistor N0 is connected with the search line SL, and the drain is connected with the other end of the variable-resistance-type non-volatile memory element R0, and a source is grounded. A gate of the NMOS transistor N1 is connected with the other search line /SL which forms a pair with the search line SL, and a drain is connected with the other end of the variable-resistance-type non-volatile memory element R1, and a source is grounded.

The variable-resistance-type non-volatile memory element, which is used in the present exemplary embodiment, is a memory element which is used in a variable-magnetic-resistance-type random access memory, a variable-phase-type random access memory, a variable-resistance-type random access memory, a conductance bridge-type random access memory, or the like. In general, the variable-resistance-type non-volatile memory element can be in two states of a high resistance state RH and a low resistance state RL.

At a time of calculation, a sense current of the resistance network 160 of the content addressable memory cell 100 flows from the charge/discharge circuit 150.

A current path of the resistance network 160 is switched by the input data which exists on the search line. A resistance value of the current path of the resistance network 160 is changed according to the input data, and data of the variable-resistance-type non-volatile memory element R0 and the variable-resistance-type non-volatile memory element R1.

In a circuit of the content addressable memory cell 100, a calculation result based on the input data, and the stored data of the variable-resistance-type non-volatile memory element R0 and the variable-resistance-type non-volatile memory element R1, is expressed by use of a delay time. That is, in the case of the circuit of the content addressable memory cell 100, the calculation result on the stored data is expressed by use of a delay time from input timing into the match line input terminal MLin until output timing onto the match line output terminal MLout which is based on information on a charge/discharge time of the sense current.

A logical calculation table 19 in FIG. 4 shows a logical calculation, which is carried out in the content addressable memory cell 10, in the first exemplary embodiment of the present invention.

A first column of the logical calculation table 19 shows a resistance value of the variable-resistance-type non-volatile memory element R0. The high resistance state and the low resistance state are denoted as RH and RL respectively. A second column shows a resistance value of the variable-resistance-type non-volatile memory element R1. A third column shows a data A which is stored in the content addressable memory cell 10. A fourth column shows an input data B which exists on the search line SL. A fifth column shows a delay time from the input timing into the input match line ML until the output timing onto the output match line ML according to a logical value of the not-exclusive-OR (XNOR) between the data A and the data B.

Next, an operation, which is related to each row of the logic operation table 19 shown in FIG. 4, will be explained with reference to FIG. 3. Here, it is assumed in the following explanation that, since a row number is counted with excluding a row of items shown in FIG. 4, a second row shown in FIG. 4 is converted to a first row.

(First Row)

According to a first row which is converted in the logic operation table 19, the stored data A is 0. At this time, R0 and R1 are in the high resistance state RH and the low resistance state RL respectively.

Before carrying out the logical calculation, a level of the match line input terminal MLin is a Low level, and a level of the match line output terminal MLout is a Low level. Moreover, each of levels of the search line SL and the search line /SL, which form a pair, is the Low level.

Just after the logical calculation is started, the level of the search line SL and the level of the search line /SL are driven to the Low level and the High level respectively according to the input data B=0.

When the level of the match line input terminal MLin transits to the High level by propagation of a signal which is provided by a content addressable memory cell 10 existing at a front position, the sense current flows from the charge/discharge circuit 15 to Gnd through the variable-resistance-type non-volatile memory element R1 and the NMOS transistor N1.

As a result, the level of the match line output terminal MLout transits to the High level with a delay time t(1) which is corresponding to the low resistance state RL.

(Second Row)

According to a second row of the logical calculation table 19 shown in FIG. 4, the stored data A is 0. At this time, R0 and R1 are in the high resistance state RH and the low resistance state RL respectively.

Before carrying out the logical calculation, the level of the match line input terminal MLin is the Low level, and the level of the match line output terminal MLout is the Low level. Moreover, each of the levels of the search line SL and /SL, which form a pair, is the Low level.

Just after the logical calculation is started, the level of the search line SL and the level of the search line /SL are driven to the High level and the Low level respectively according to the input data B=1.

When the level of the match line input terminal MLin transits to the High level by propagation of the signal which is provided by the content addressable memory cell 10 existing at the front position, the sense current flows from the charge/discharge circuit 15 to Gnd through the variable-resistance-type non-volatile memory element R0 and the NMOS transistor N0.

As a result, the level of the match line output terminal MLout transits to the High level with a delay time t(0) which is corresponding to the high resistance state RH.

(Third Row)

According to a third row of the logical calculation table 19 shown in FIG. 4, the stored data A is 1. At this time, R0 and R1 are in the low resistance state RL and the high resistance state RH respectively.

Before carrying out the logical calculation, the level of the match line input terminal MLin is the Low level, and the level of the match line output terminal MLout is the Low level. Moreover, each of the levels of the search lines SL and /SL, which form a pair, is the Low level.

Just after the logical calculation is started, the level of the search line SL and the level of the search line /SL are driven to the Low level and the High level respectively according to the input data B=0.

When the level of the match line input terminal MLin transits to the High level by propagation of the signal which is provided by the content addressable memory cell 10 existing at the front position, the sense current flows from the charge/discharge circuit 15 to Gnd through the variable-resistance-type non-volatile memory element R1 and the NMOS transistor N1.

As a result, the level of the match line output terminal MLout transits to the High level with the delay time t(0) which is corresponding to the high resistance state RH.

(Fourth Row)

According to a fourth row of the logical calculation table 19 shown in FIG. 4, the stored data A is 1. At this time, R0 and R1 are in the low resistance state RL and the high resistance state RH respectively.

Before carrying out the logical calculation, the level of the match line input terminal MLin is the Low level, and the level of the match line output terminal MLout is the Low level. Moreover, each of the levels of the search lines SL and /SL, which form a pair, is the Low level.

Just after the logical calculation is started, the level of the search line SL and the level of the search line /SL are driven to the High level and the Low level respectively according to the input data B=1.

When the level of the match line input terminal MLin transits to the High level by propagation of the signal which is provided by the content addressable memory cell 10 existing at the front position, the sense current flows from the charge/discharge circuit 15 to Gnd through the variable-resistance-type non-volatile memory element R0 and the NMOS transistor N0.

As a result, the level of the match line output terminal MLout transits to the High level with the delay time t(1) which is corresponding to the low resistance state RL.

Since the delay time t(1) is shorter than the delay time t(0), a case that the stored data A and the input data B are coincident has a shorter delay time than a case that the stored data A and the input data B are not coincident has.

The association memory cell, which is described in PTL 1, is realized by different circuits one of which has a function of storing the data, and the other of which has a function of generating the delay. In contrast, according to the content addressable memory cell 10 of the present exemplary embodiment, it is possible to realize both of the function of storing the data and the function of generating the delay by use of the variable-resistance-type non-volatile memory element. As a result, it is possible an area of the cell small.

Moreover, according to the association memory cell which is described in PTL 1, in the case that the electric power source is turned off at a waiting time, the stored data disappears. Accordingly, it is impossible to turn the electric power source off with ease. In contrast, according to the content addressable memory cell 10 of the present exemplary embodiment, the stored data are held by the variable-resistance-type non-volatile memory element R0 and the variable-resistance-type non-volatile memory element R1 even if the electric power source is turned off at the waiting time. Therefore, according to the content addressable memory 1 of the present exemplary embodiment, it is possible to suppress the leak current by turning the electric power source off, while the general association memory has a fear that a value of the leak current becomes large.

Figure 5:
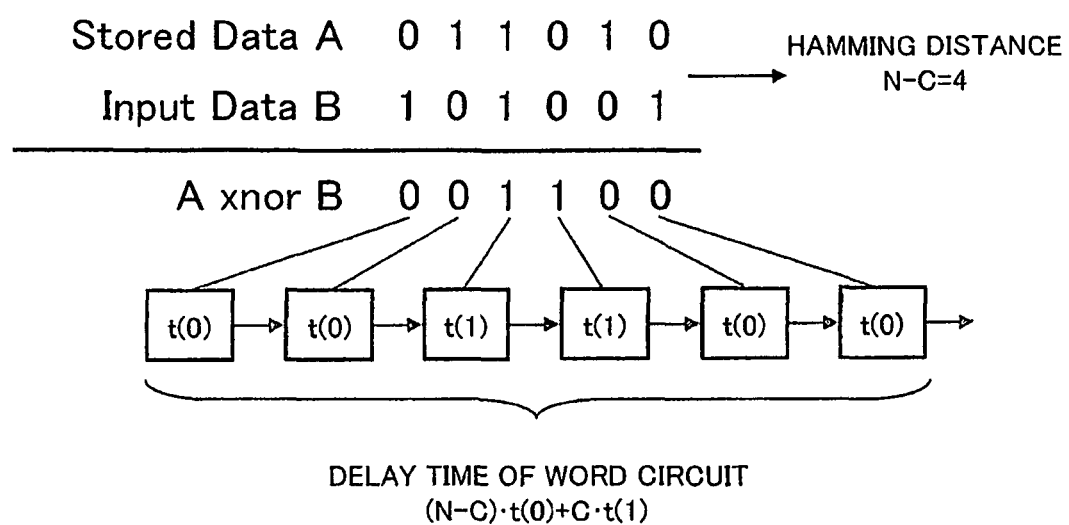
FIG. 5 is a conceptual diagram showing a calculation operation of a word circuit according to the first exemplary embodiment of the present invention.

FIG. 5 is a conceptual diagram showing an example of a calculation operation of a word circuit of the content addressable memory 1 according to the first exemplary embodiment. Here, the word circuit shown in FIG. 5 includes 6 content addressable memory cells 10, and number of bits N is 6.

According to the word circuit exemplified in FIG. 5, in the case that the stored data A is '011010', and the input data B is '101001', AxnorB is '001100'.

That is, C which is number of '1' in AxnorB (001100) is 2. Moreover, the hamming distance H, which is defined by the following Formula (1), is 4.

$$H = N - C \quad (1)$$

A delay time D1 of the word circuit shown in FIG. 5 is expressed as Formula (2). That is, the delay time is short as the hamming distance between the stored data and the input data becomes short.

$$D1 = (N-C) \cdot t(0) + C \cdot t(1) \quad (2)$$

Figure 6:
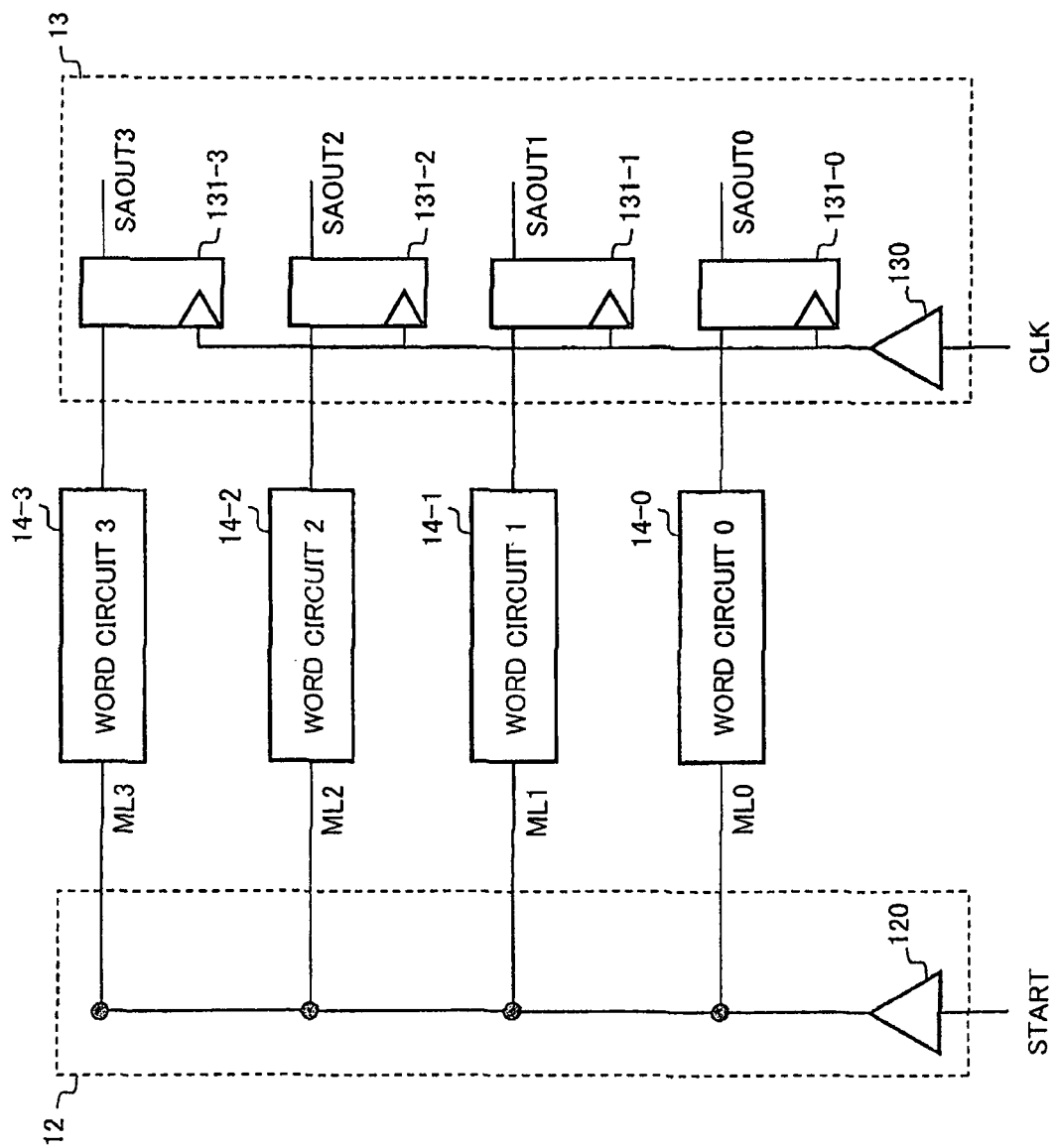
FIG. 6 is a block diagram showing schematic composition of the content addressable memory according to the first exemplary embodiment of the present invention.

FIG. 6 is a block diagram showing schematic composition of the content addressable memory 1 according to the first exemplary embodiment of the present invention. For simplification of FIG. 6, the column side circuit 11 and the pair of search lines SL and /SL, which are shown in FIG. 1, are omitted in FIG. 6.

A calculation start signal START is provided to an input terminal of a buffer 120 of the row side circuit 12, and an output terminal of the buffer 120 is connected with the match line ML. The sense circuit 13 includes DFF (Data Flip-Flop: hereinafter, denoted as DFF 131) which is corresponding to each word circuit 14.

A clock signal CLK is provided to an input terminal of a buffer 130 of the sense circuit 13, and an output terminal of the buffer 130 is connected with a clock terminal of DFF 131. The match line of each row is connected with a data input terminal of DFF 131. An output terminal of DFF 131 outputs a sense amplifier output signal SAOUT.

Figure 7:
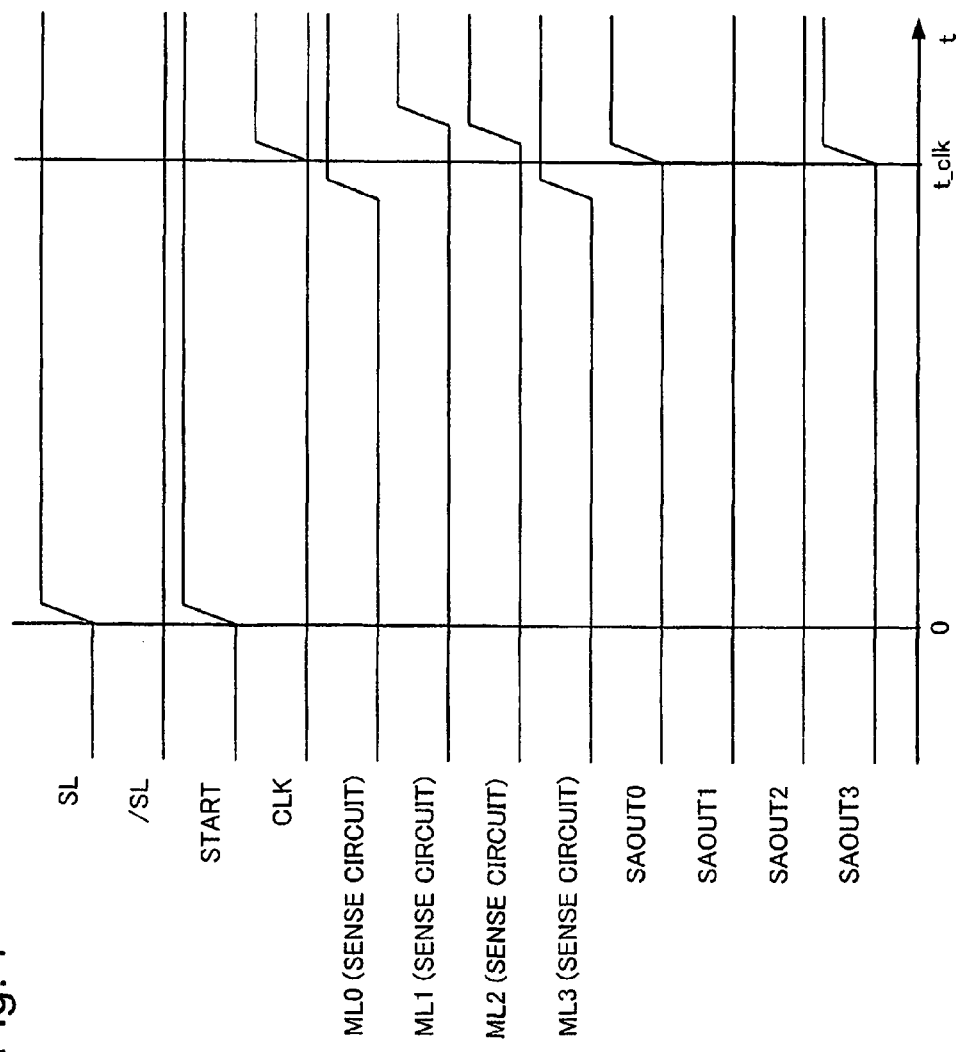
FIG. 7 is a diagram showing an operation of the content addressable memory according to the first exemplary embodiment of the present invention.

FIG. 7 is a diagram showing an example of an operation of the content addressable memory 1 according to the first exemplary embodiment of the present invention.

With reference to FIG. 6 and FIG. 7, the operation of the content addressable memory 1 according to the first exemplary embodiment of the present invention, which is carried out at a time of calculation, will be explained in the following.

Before carrying out the calculation, each of the levels of the search lines SL and /SL, which form a pair, is the Low level, and a level of the calculation start signal START is the Low level, and a level of the clock signal CLK is the Low level.

When the level of the calculation start signal START is changed to the High level, the calculation is started. A time t at which the calculation is started is defined to be 0.

The row side circuit 12 receives the calculation start signal START to drive the match line ML so as to be the High level. Then, the search line SL is driven so as to be the High level or the Low level according to the input data.

The word circuit 14 provides the match line ML with the output signal which is delayed by the delay time corresponding to the hamming distance between the stored data and the input data as mentioned above.

When the level of the clock signal CLK is changed to be the High level at a time t_clk, the sense circuit 13 samples data which exists on the match line ML connected with the sense circuit 13, and outputs the sampled data as the sense amplifier output signal SAOUT.

Figure 8:
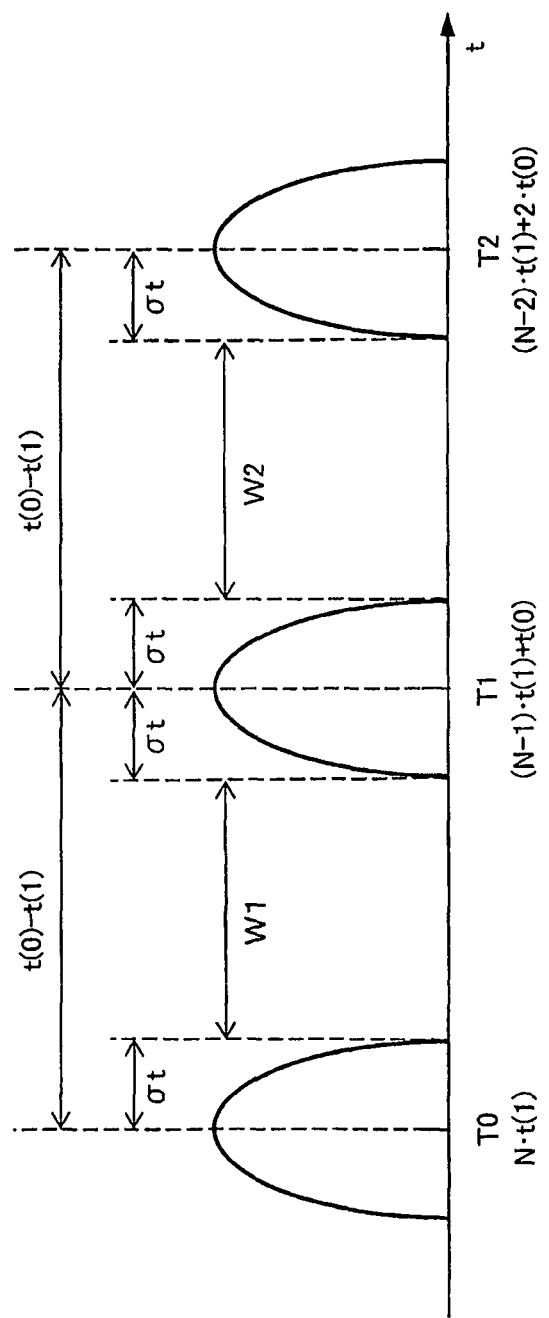
FIG. 8 is a diagram showing distribution of timing at which a level of a match line is changed to a High level according to the first exemplary embodiment of the present invention.

FIG. 8 is a histogram showing timing at which the level of the match line ML is changed to the High level. Here, it is assumed that number of bits of the word circuit 14 is N.

In the case that the hamming distance between the stored data and the input data is 0, the timing when the level of the match line ML is changed to the High level is distributed so that a distribution center may be a time T0 shown by the following Formula 3.

$$T0 = N \cdot t(1) \quad (3)$$

Similarly, in the case that the hamming distance between the stored data and the input data is 1, the timing when the level of the match line ML is changed to the High level is distributed so that a distribution center may be a time T1 shown by the following Formula 4.

$$T1 = (N-1) \cdot t(1) + t(0) \quad (4)$$

Similarly, in the case that the hamming distance between the stored data and the input data is 2, the timing when the level of the match line ML is changed to the High level is distributed so that a distribution center may be a time T2 shown by the following Formula 5.

$$T2 = (N-2) \cdot t(1) + 2 \cdot t(0) \quad (5)$$

Since distribution, which is generated in the case that the hamming distance is equal to 3 or longer than 3, is similar to the distribution which is generated in each case mentioned above, explanation on the case that the hamming distance is equal to 3 or longer than 3 is omitted.

A time interval between the distributions is t(0)-t(1).

It is assumed that a deviation of each distribution is σt. For example, in the case of retrieving the word circuit whose hamming distance is 0, the level of the clock signal CLK may transit to the High level in a window w1 which is a time interval from T0+σt until T1−σt. Here, the window W1 is expressed as Formula 6.

$$W1 = t(0) - t(1) - 2 \cdot \sigma t \quad (6)$$

Then, the level of the sense amplifier output signal SAOUT, which is corresponding to the word circuit 14 whose hamming distance between the stored data and the input data is 0, is changed to the High level, and each of the levels of the other sense amplifier output signals SAOUT is the Low level. That is, it is possible to detect only the word circuit 14 whose hamming distance is 0.

Similarly, in the case of retrieving the word circuit whose hamming distance is 1 or 0, the level of the clock signal CLK may transit to the high level in a window w2 which is a time interval from T1+σt until T2−σt.

Then, the level of the sense amplifier output signal SAOUT, which is corresponding to the word circuit 14 whose hamming distance between the stored data and the input data is equal to 1 or 0, is changed to the High level, and each of the levels of the other sense amplifier output signals SAOUT is the Low level. That is, it is possible to detect only the word circuit 14 whose hamming distance is equal to 1 or 0.

Similarly, according to the content addressable memory 1 of the first exemplary embodiment, it is possible to detect the word circuit 14 whose hamming distance is equal to d bits or shorter than d bits (d is 0 or a positive integer which is equal to N or smaller than N.).

As mentioned above, according to the first exemplary embodiment of the present invention, it is possible to detect the word circuit whose calculation result based on the stored data and the input data is equal to d bits or shorter than d bits. In the present exemplary embodiment, the calculation of the hamming distance is exemplified as the specific calculation of similarity.

Moreover, according to the first exemplary embodiment of the present invention, it is possible to make the area of the content addressable memory cell small furthermore by realizing both of the function of storing the data and the function of generating the delay time by use of the variable-resistance-type non-volatile memory element.

Furthermore, if a content addressable memory uses the content addressable memory cell according to the first exemplary embodiment of the present invention, it is possible to turn the electric power source off with ease. As a result, it is possible to suppress the leak current.

Here, the case that the variable-resistance-type non-volatile memory element of the present exemplary embodiment has two values (digital values) of the low resistance state and the high resistance state has been shown, but number of the values which the variable-resistance-type non-volatile memory element can have is not always limited to two. The variable-resistance-type non-volatile memory element may have any analog value between two values of the low resistance state and the high resistance state. As the variable-resistance-type non-volatile memory element which has the analog value, the variable-resistance-type non-volatile memory element, which is shown in WO 2009/101827 or the like, may be used. In the case that the content addressable memory according to the present exemplary embodiment uses the variable-resistance-type non-volatile memory element which has the analog value, a point to be changed is that the content addressable memory has an analog delay time. But, since the delay time is additive, it is easy to use the variable-resistance-type non-volatile memory element which has the analog value.

(Modification 1)

Next, a modification 1 of the content addressable memory 1 according to the first exemplary embodiment will be explained.

Figure 9:
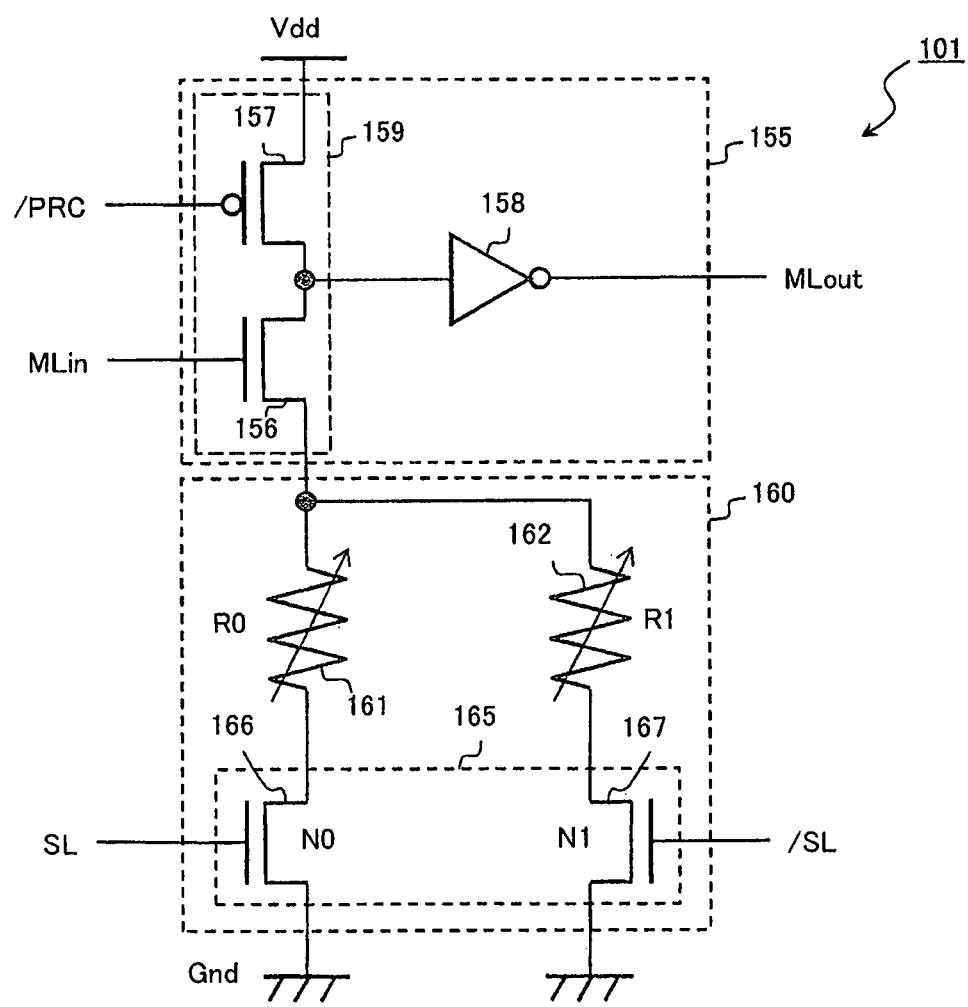
FIG. 9 is a charge/discharge circuit diagram of a modification 1 according to the first exemplary embodiment of the present invention.

The content addressable memory 1 of the modification 1 includes a content addressable memory cell 101 shown in FIG. 9. The content addressable memory 1 of the modification 1 has composition that the charge/discharge circuit 150 of the content addressable memory cell 100 is replaced by a charge/discharge circuit 155. Here, explanation on overlapping composition is omitted.

The charge/discharge circuit 155 of the modification 1 includes a NMOS transistor 156, a PMOS transistor 157 and an inverter 158. The NMOS transistor 156 and the PMOS transistor 157 form a CMOS inverter 159.

The match line input terminal MLin is connected with a gate of the NMOS transistor 156. An inversion signal of pre-charge signal /PRC is provided to a gate of the PMOS transistor 157. An input terminal of the inverter 158 is connected with a drain of the PMOS transistor 157 and a drain of the NMOS transistor 156. An output terminal of the inverter 158 is connected with the match line output terminal MLout. A source of the PMOS transistor 157 is connected with an electric power source voltage Vdd. A source of the NMOS transistor 156 is connected with one end of each of the variable-resistance-type non-volatile memory elements 161 and 162 which are included in the resistance network 160.

According to the modification 1, at a time of calculation, the inversion signal of pre-charge signal /PRC has the same waveform as the calculation start signal START has.

In the word circuit 14 of the content addressable memory 1, after the calculation is completed, the match line input terminal MLin and the match line output terminal MLout of each content addressable memory cell 10 are reset so as to have the Low level. In the case of applying the content addressable memory cell 100, it is necessary to prepare a time for resetting the content addressable memory cells 10, which are connected in series, in turn. On the other hand, in the case of applying the content addressable memory 101 of the modification 1, by setting the inversion signal of pre-charge signal /PRC so as to have the Low level, it is possible to simultaneously reset the match line input terminal MLin and the match line output terminal MLout of each content addressable memory cell 101 so as to have the Low level.

Accordingly, in the case of the content addressable memory 1 which uses the content addressable memory cell 101 according to the modification 1 of the present exemplary embodiment, it is possible to shorten the reset time of the word circuit 14 by using the inversion signal of pre-charge signal /PRC.

As mentioned above, in the case of applying the content addressable memory cell 101 according to the modification 1 of the present exemplary embodiment, it is possible to shorten the reset time of the word circuit 14, and consequently it is possible to enhance throughput of the calculation.

(Modification 2)

Next, a modification 2 of the content addressable memory 1 according to the first exemplary embodiment will be explained.

Figure 10:
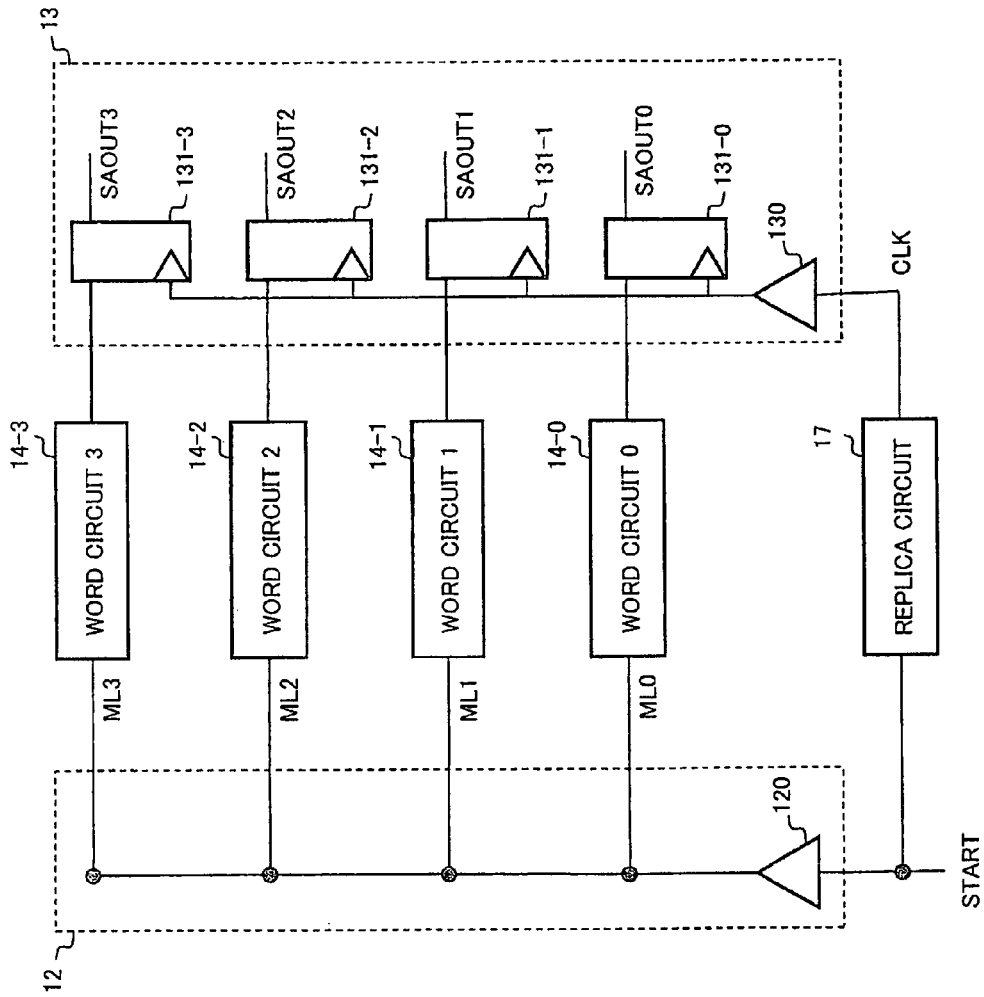
FIG. 10 is a block diagram showing composition of a content addressable memory cell of a modification 2 according to the first exemplary embodiment of the present invention.

The content addressable memory 1 of the modification 2 has circuit composition shown in FIG. 10. The circuit composition shown in FIG. 10 is different from the circuit composition shown in FIG. 6 only in a point that the CLK signal is generated by a replica circuit 17. Here, explanation on overlapping component is omitted.

FIG. 10 is a block diagram showing schematic composition of the content addressable memory 1 according to the modification 2 of the present exemplary embodiment. In FIG. 10, the column circuit 11 and the pair of the search lines SL and /SL, which are shown in FIG. 1, are omitted. Moreover, a component which is the same as the component shown in FIG. 6, is assigned the same code used in FIG. 6.

The calculation start signal START is provided to the input terminal of the buffer 120, and the output terminal of the buffer 120 is connected with the match line ML. Furthermore, the calculation start signal START is provided to the replica circuit 17. The replica circuit 17 generates the clock signal CLK after elapse of a predetermined delay time. The sense circuit 13 includes Data Flip-Flop (DFF 131) which is corresponding to the word circuit 14. The clock signal CLK is provided to the input terminal of the buffer 130 of the sense circuit 13. The output terminal of the buffer 130 is connected with the clock terminal of DFF 131. The match line ML of each row is connected with the data input terminal of DFF 131. The output terminal of DFF 131 outputs the sense amplifier output signal SAOUT.

(Replica Circuit)

Figure 11:
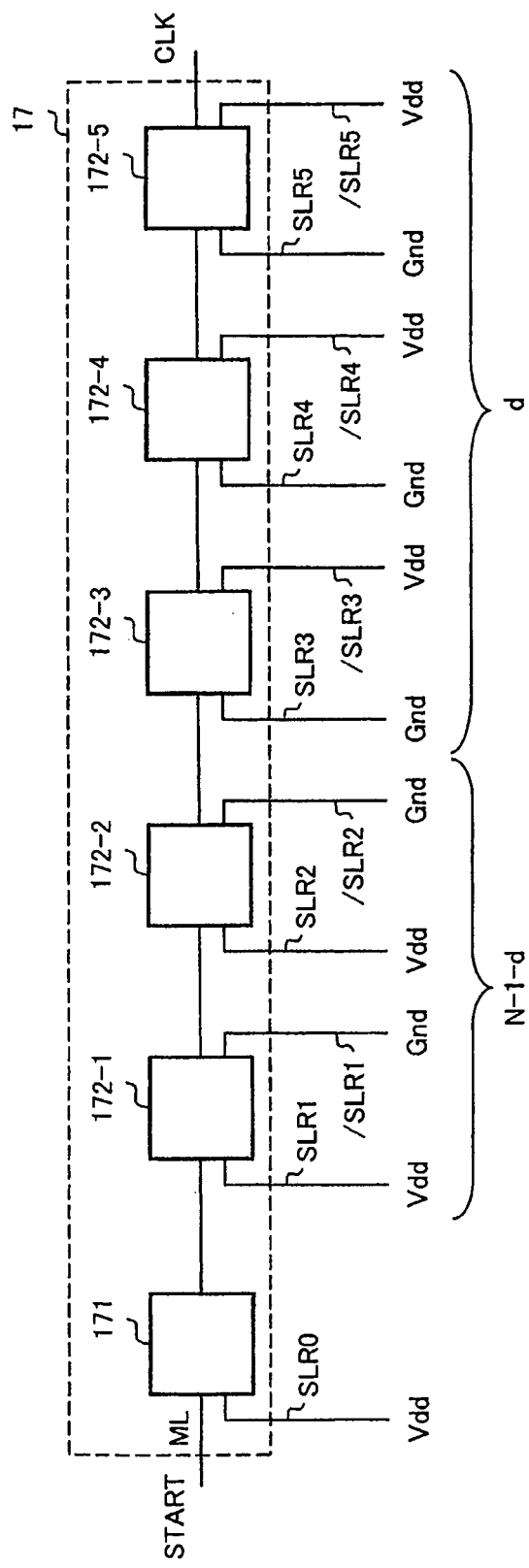
FIG. 11 is a block diagram of a replica circuit of the modification 2 according to the first exemplary embodiment of the present invention.

FIG. 11 is a block diagram showing an example of the replica circuit 17 which is included in the content addressable memory 1 of the modification 2 of the present exemplary embodiment. FIG. 11 shows an example that the replica circuit 17 is used for detecting a word whose hamming distance is equal to 3 or shorter than 3. Here, it is assumed that number of bits of the replica circuit 17 is the same as the number of bits of the word circuit 14.

The replica circuit 17 includes one replica cell circuit A 171, and replica cell circuits B 172 whose number is (N−1). The replica cell circuit A 171 and the replica cell circuits B 172, whose number is (N−1), are connected in series through the match line ML. The replica cell circuit A 171 receives the START signal which exists on the match line ML. The replica cell circuit B 172 (172-5) which exists at the last position outputs the CLK signal onto the match line ML. A search line for replica SLR 0 is connected with the replica cell circuit 171. A pair of search lines for replica SLR n and /SLR n is connected with a replica cell circuit B 172-n (n is positive integer).

In the case that the replica circuit 17 is used for detecting a word whose hamming distance is equal to d or shorter than d, SLR which includes d search lines connected with d replica cell circuits B 172 is set so as to have the Low level, and /SLR is set so as to have the High level. In FIG. 11, it is assumed that the High level is an electric power source voltage Vdd, and the Low level is a ground voltage Gnd. SLR connected with (N−1−d) replica cell circuits B 172 is set so as to have the High level, and /SLR is set so as to have the Low level. SLR 0 which is connected with the replica cell circuit A 171 is set so as to have the High level.

(Replica Cell Circuit A)

Figure 12:
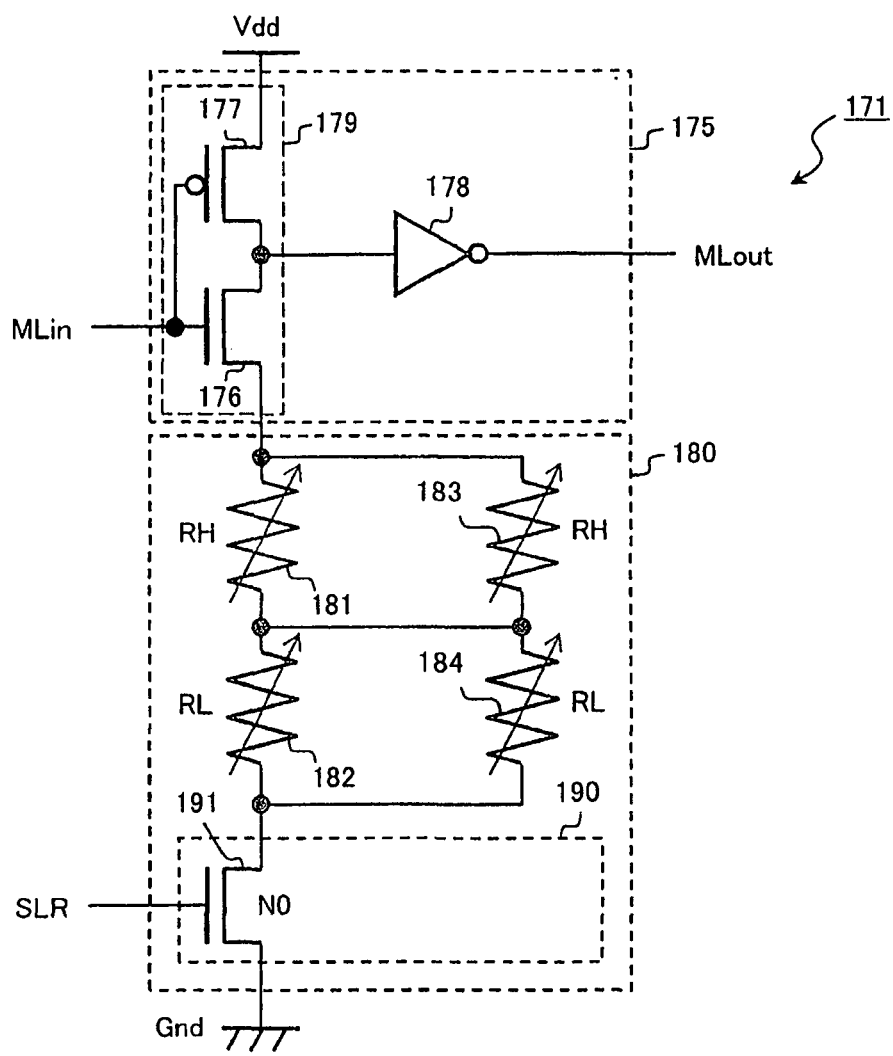
FIG. 12 is a circuit diagram of a replica cell circuit 1 of the modification 2 according to the first exemplary embodiment of the present invention.

FIG. 12 is a circuit diagram showing the replica cell circuit A 171 of the content addressable memory 1 of the modification 2 of the present exemplary embodiment. The replica cell circuit A 171 includes a charge/discharge circuit 175 and a resistance network 180.

The charge/discharge circuit 175 includes a NMOS transistor 176, a PMOS transistor 177 and an inverter 178. The NMOS transistor 176 and the PMOS transistor 177 form a CMOS inverter 179.

The match line input terminal MLin is connected with a gate of the NMOS transistor 176 and a gate of the PMOS transistor 177. An input terminal of the inverter 178 is connected with a drain of the PMOS transistor 177 and a drain of the NMOS transistor 176. An output terminal of the inverter 178 is connected with the match line output terminal MLout. A source of the PMOS transistor 177 is connected with an electric power source voltage Vdd. A source of the NMOS transistor 176 is connected with one end of the variable-resistance-type non-volatile memory element RH of the resistance network 180.

The resistance network 180 of the replica cell circuit A 171 includes four variable-resistance-type non-volatile memory elements 181 to 184, and a NMOS logic circuit 190 which has one NMOS transistor 191.

One end of the variable-resistance-type non-volatile memory element 181 and one end of the variable-resistance-type non-volatile memory element 183 are connected with the source of the NMOS transistor 176 of the charge/discharge circuit 175. The other end of the variable-resistance-type non-volatile memory element 181 and the other end of the variable-resistance-type non-volatile memory element 183 are connected with one end of the variable-resistance-type non-volatile memory element 182 and one end of the variable-resistance-type non-volatile memory element 184 respectively. Moreover, the other end of the variable-resistance-type non-volatile memory element 182 and the other end of the variable-resistance-type non-volatile memory element 184 are connected with a drain of the NMOS transistor N0. The four variable-resistance-type non-volatile memory elements 181 to 184 are connected in series and parallel, and consequently a synthetic resistance of the variable-resistance-type non-volatile memory elements 181 to 184 is (RH+RL)/2.

The search line for replica SLR is connected with a gate of the NMOS transistor N0 (191). A drain of the NMOS transistor N0 is connected with the variable-resistance-type non-volatile memory element 182 and a source is grounded. A delay time of the replica cell circuit A 171 is (t(0)+t(1))/2 which is corresponding to a discharge time of the sense current flowing through the variable-resistance-type non-volatile memory elements 181 to 184 connected in series and parallel.

(Replica Cell Circuit B)

Figure 13:
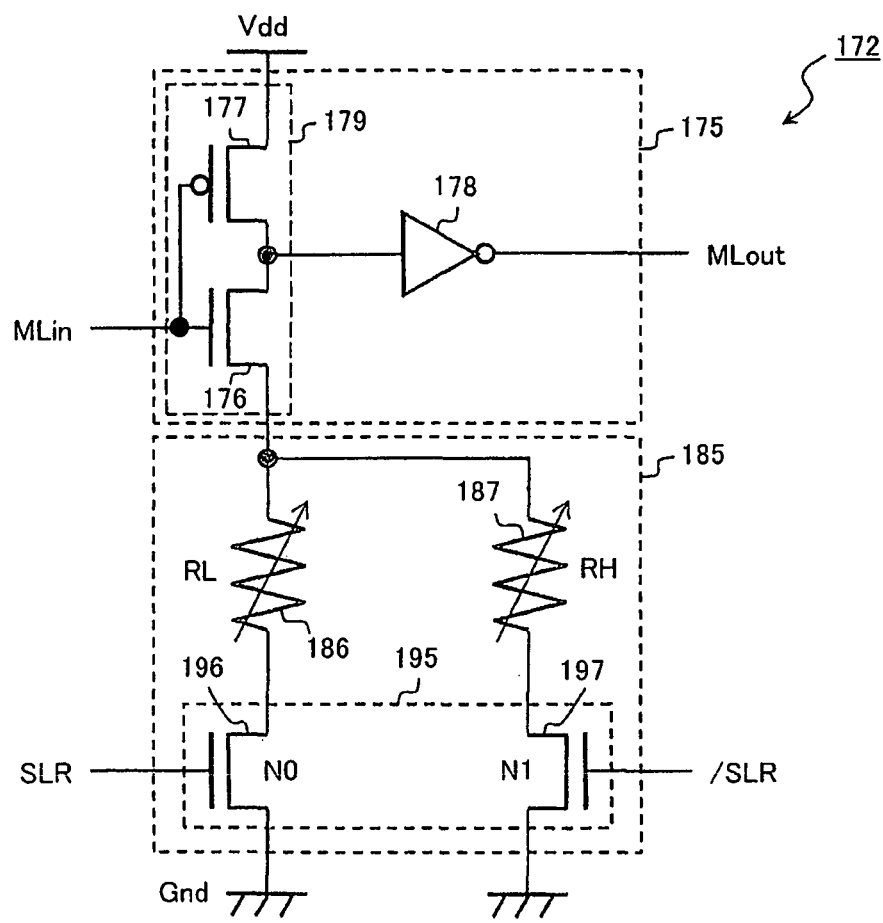
FIG. 13 is a circuit diagram of a replica cell circuit 2 of the modification 2 according to the first exemplary embodiment of the present invention.

FIG. 13 is a circuit diagram showing the replica cell circuit B 172 in the content addressable memory 1 of the modification 2 of the present exemplary embodiment. The replica cell circuit B 172 includes the charge/discharge 175 and a resistance network 185. Here, since the charge/discharge circuit 175 of the replica cell circuit A 171 and the charge/discharge 175 of the replica cell circuit B 172 are identical each other, detailed explanation on the charge/discharge 175 is omitted.

The resistance network 185 of the replica cell circuit B 172 includes a variable-resistance-type non-volatile memory element 186, a variable-resistance-type non-volatile memory element 187 and a NMOS logic circuit 195 which includes a NMOS transistor N0 and a NMOS transistor N1. Here, in FIG. 13, the NMOS transistor N0 is a NMOS transistor 196, and the NMOS transistor N1 is a NMOS transistor 197.

One end of the variable-resistance-type non-volatile memory element 186 and one end of the variable-resistance-type non-volatile memory element 187 are connected with the NMOS transistor 176 of the charge/discharge circuit 175. The other end of the variable-resistance-type non-volatile memory element 186, which is in the low resistance state RL, is connected with a drain of the NMOS transistor N0, and the other end of the variable-resistance-type non-volatile memory element 187, which is in the high resistance state RH, is connected with a drain of the NMOS transistor N1. A gate of the NMOS transistor N0 is connected with the search line for replica SLR, and a drain is connected with the other end of the variable-resistance-type non-volatile memory element 186 which is in the low resistance state RH, and a source is grounded. A gate of the NMOS transistor N1 is connected with the search line for replica /SLR which forms a pair with the search line for replica SLR, and a drain is connected with the variable-resistance-type non-volatile memory element 187 which is in the high resistance state RL, and a source is grounded.

In the case that SLR has the High level, and /SLR has the Low level, a delay time of the replica cell circuit B 172 is t(1) corresponding to a discharge time of the sense current flowing through the variable-resistance-type non-volatile memory element 186 which is in the low resistance state RL. In the case that SLR has the Low level, and /SLR has the High level, a delay time of the replica cell circuit B 172 is t(0) corresponding to a discharge time of the sense current flowing through the variable-resistance-type non-volatile memory element 187 which is in the high resistance state RH.

Figure 14:
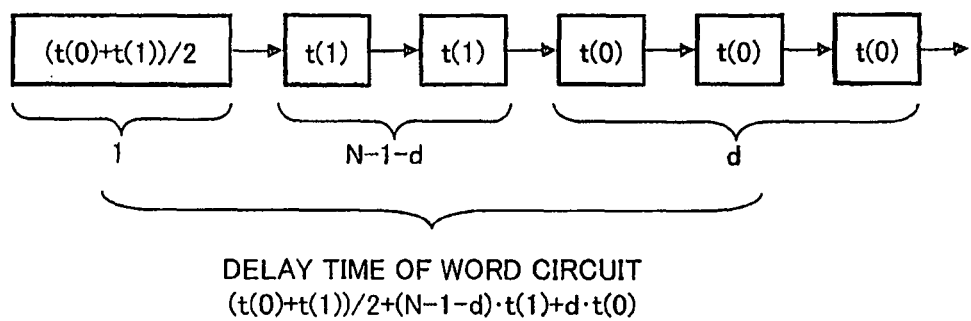
FIG. 14 is a conceptual diagram showing a schematic delay time of the replica circuit of the modification 2 according to the first exemplary embodiment of the present invention.

FIG. 14 is a conceptual diagram showing a schematic delay time which is generated in the content addressable memory 1 of the modification 2 of the present exemplary embodiment. Here, FIG. 14 is corresponding to FIG. 10.

A delay time t1 which is generated in the replica cell circuit A 171 is expressed by Formula 7.

$$t1=(t(0)+t(1))/2 \quad (7)$$

A delay time which is generated in each of the d replica cell circuits B 172 is t(0). Accordingly, a total delay time t2 which includes the delay times of the d replica cell circuits B 172 is expressed by Formula 8.

$$t2=d\cdot t(0) \quad (8)$$

Moreover, a delay time which is generated in each of the (N−1−d) replica cell circuits B 172 is t(1). Accordingly, a total delay time t3 which includes the delay times of the (N−1−d) replica cell circuits is expressed by Formula 9.

$$t3=(N-1-d)\cdot t(1) \quad (9)$$

Accordingly, a delay time which is generated in the replica circuit 17, that is, a delay time t_clk from a rise point of time of the START signal until a rise point of time of the CLK signal is expressed by Formula 10.

$$t\_clk=t1+t2+t3 \quad (10)$$

Since t_clk exists between (N−d)·t(1)+d·t(0) and (N−d−1)·t(1)+(d+1)·t(0), it is possible to detect a word circuit whose hamming distance is equal to d or shorter than d.

As mentioned above, the replica circuit 17 in the modification 2 of the present exemplary embodiment works at the same environmental temperature and with the same electric power source voltage as the word circuit 14 works. As a result, it is possible to generate the clock at appropriate timing even when the environmental temperature and the electric power source voltage are changed. Moreover, in the case of the replica circuit 17 in the modification 2, since a distance between the replica circuit 17 and the word circuit 14 is short, there is no global variation in characteristics of the transistor and a resistance value of MTJ (Magnetic Tunnel Junction), and there is only local variation. Therefore, according to the replica circuit 17 in the modification 2, it is possible to carry out accurate comparison between the input data and the comparison data and to prevent an error in reading data.

Second Exemplary Embodiment

Figure 15:
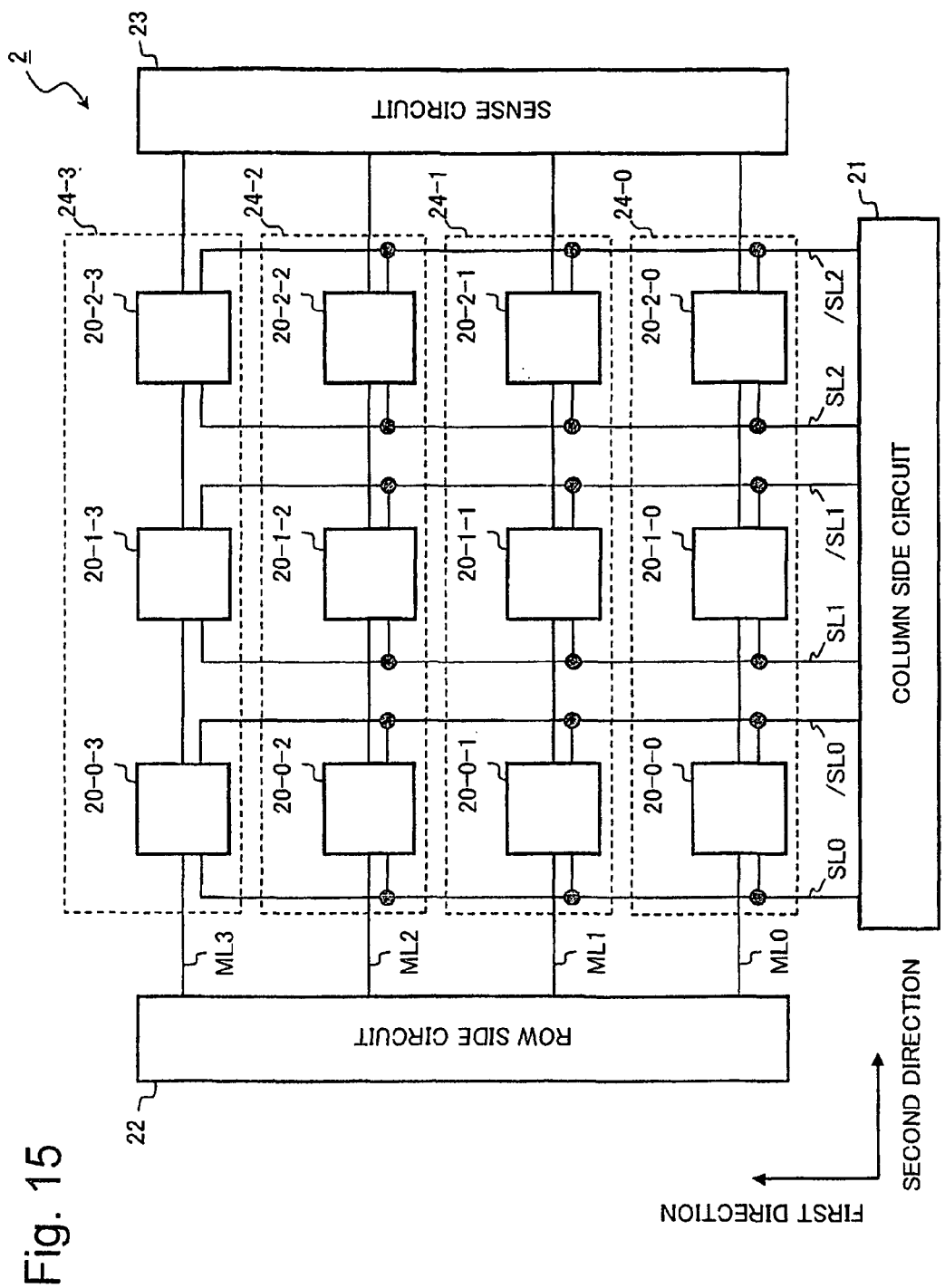
FIG. 15 is a block diagram showing schematic composition of a content addressable memory according to a second exemplary embodiment of the present invention.

FIG. 15 is a block diagram showing schematic composition of a content addressable memory 2 according to a second exemplary embodiment of the present invention.

The content addressable memory 2 according to the second exemplary embodiment includes a plurality of content addressable memory cells 20 which are arranged in a form of two-dimensional matrix, and the plural content addressable memory cells 20, which are arranged in the second direction, compose a word circuit 24. Here, in FIG. 15, in order to distinguish the plural content addressable memory cells 20 and the plural word circuits 24, an end of a code, which is assigned to each component, includes a column number and a row number. In the case that the distinction is unnecessary, the end number of the code is omitted.

Moreover, the content addressable memory 2 includes a plurality of pairs of search lines SL and /SL and a plurality of match lines ML, where the pair of search lines SL and /SL is commonly connected with the content addressable memory cells 20 which are arranged in the first direction, and the match line ML connects the content addressable memory cells 20, which are arranged in the second direction, in series. Here, in FIG. 15, in order to distinguish the plural pairs of wirings, an end of a code, which is assigned to each pair of wirings, includes a column number and a row number. In the case that the distinction is unnecessary, the numbers are omitted.

Furthermore, the content addressable memory 2 includes a column side circuit 21, a row side circuit 22 and a sense circuit 23. The column side circuit 21 is connected with the plural pairs of search lines SL and /SL, and drives the pair of search lines according to an input data at a time of calculation. The row side circuit 22 is connected with the plural match lines ML, and drives the match line ML. The sense circuit 23 is connected with the plural match lines ML, and senses potential of the match line ML.

(Content Addressable Memory Cell)

Figure 16:
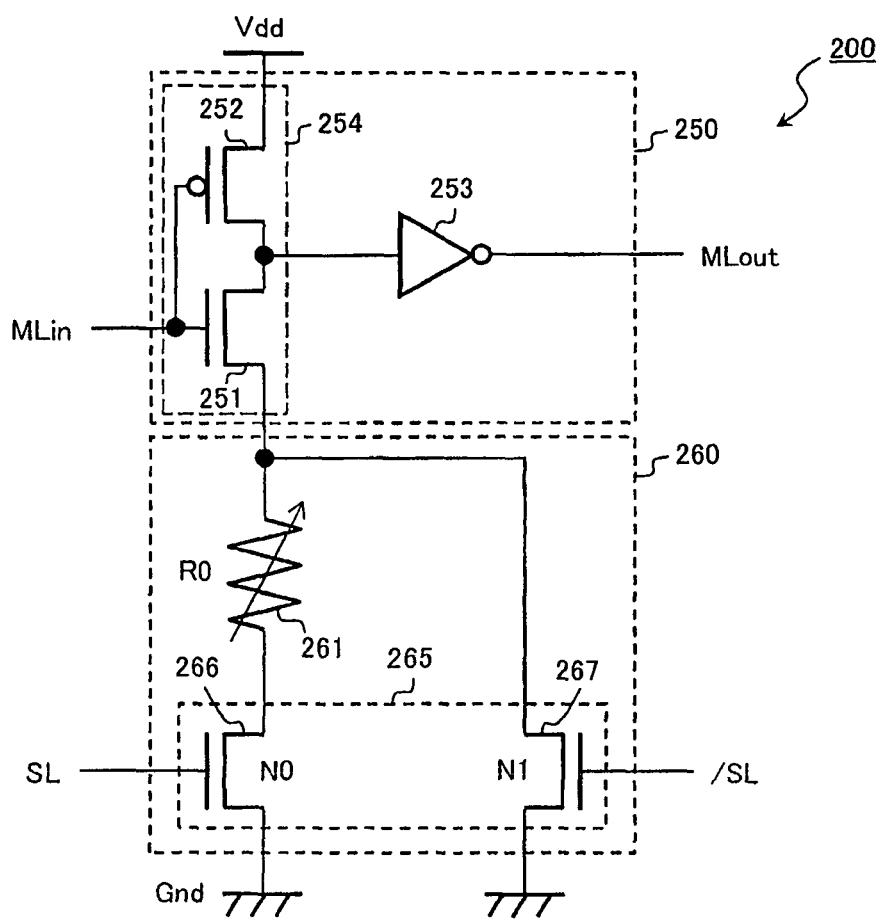
FIG. 16 is a circuit diagram of a content addressable memory cell according to the second exemplary embodiment of the present invention.

FIG. 16 is a specific circuit diagram of the content addressable memory cell 20 (content addressable memory cell 200) in the second exemplary embodiment of the present invention.

The word circuit 24 which includes the content addressable memory cell 200 having the above-mentioned circuit composition can reflect an inner product of stored data and input data in a delay time of the word circuit 24.

A charge/discharge circuit 250 includes a NMOS transistor 251, a PMOS transistor 252 and an inverter 253. The NMOS transistor 251 and the PMOS transistor 252 form a CMOS inverter 254.

The match line input terminal MLin is connected with a gate of the NMOS transistor 251 and a gate of the PMOS transistor 252. An input terminal of the inverter 253 is connected with a drain of the PMOS transistor 252 and a drain of the NMOS transistor 251. An output terminal of the inverter 253 is connected with the match line output terminal MLout. A source of the NMOS transistor 251 is connected with one end of the variable-resistance-type non-volatile memory element R0 of a resistance network 260, and a source of the PMOS transistor 252 is connected with an electric power source voltage Vdd.

The resistance network 260 includes the variable-resistance-type non-volatile memory element R0 (261), and a NMOS logic circuit 265 (logic circuit). The NMOS logic circuit 265 includes a NMOS transistor N0 which is a first NMOS transistor, and a NMOS transistor N1 which is a second NMOS transistor. Here, in FIG. 16, the NMOS transistor N0 is a NMOS transistor 266, and the NMOS transistor N1 is a NMOS transistor 267.

One end of the variable-resistance-type non-volatile memory element R0 is connected with the source of the NMOS transistor 251 of the charge/discharge circuit 250, and a drain of the NMOS transistor N1, and the other end is connected with a drain of the NMOS transistor N0.

A gate of the NMOS transistor N0 is connected with the search line SL, and a drain is connected with the other end of the variable-resistance-type non-volatile memory element R0, and a source is grounded. The drain of the NMOS transistor N1 is connected with the source of the NMOS transistor 251 of the charge/discharge circuit 250, and the one end of the variable-resistance-type non-volatile memory element R0, and a gate is connected with the search line /SL which forms a pair with the search line SL, and a source is grounded.

When carrying out calculation, a sense current of the resistance network 260 of the content addressable memory cell 200 flows from the charge/discharge circuit 250.

A current path, which is set in the resistance network 260, is switched according to the input data on the search line. A resistance value of the current path in the resistance network 260 is changed according to the input data, and data (stored data) which is stored in the variable-resistance-type non-volatile memory element R0.

In a circuit of the content addressable memory cell 200, a calculation result, which is based on the stored data of the variable-resistance-type non-volatile memory element and the input data, is expressed by use of a delay time. That is, the calculation result is expressed by use of a delay time from input timing into the match line input terminal MLin until output timing onto the match line output terminal MLout which is based on information on a charge/discharge time of the sense current.

A logical calculation table 28 in FIG. 17 shows a logical calculation, which is carried out by the content addressable memory cell 20, in the second exemplary embodiment of the present invention.

A first column of the logical calculation table 28 indicates a resistance value of the variable-resistance-type non-volatile memory element R0. The high resistance state is denoted as RH, and the low resistance state is denoted as RL. A second column of the logical calculation table 28 indicates data A which are stored in the content addressable memory cell. A third column of the logical calculation table 28 indicates input data on the search line SL. A fourth column of the logical calculation table 28 indicates the delay time from input timing into the match line ML until output timing onto the match line ML which is corresponding to a logical value of an AND operation between the data A and the data B Next, an operation in each row of the logical calculation table 28 shown in FIG. 17 will be explained with reference to FIG. 16.

(First Row)

According to a first row of the logical calculation table 28, the stored data A is 0. At this time, R0 is in the high resistance state RH.

Before carrying out the logical calculation, the level of the match line input terminal MLin is the Low level, and the level of the match line output terminal MLout is the Low level. Moreover, each of the levels of the search lines SL and /SL, which form a pair, is the Low level.

Just after the logical calculation is started, the level of the search line SL and the level of the search line /SL are driven to the Low level and the High level respectively according to the input data B=0.

When the level of the match line input terminal MLin transits to the High level by propagation of a signal which is provided by the content addressable memory cell 200 existing at a front position, the sense current flows from the charge/discharge circuit 250 to Gnd through the NMOS transistor N1.

As a result, the level of the match line output terminal MLout transits to the High level with a delay time t(0, tr) which is corresponding to the transistor N1.

(Second Row)

According to a second row of the logical calculation table 28 shown in FIG. 17, the stored data A is 0. At this time, R0 is in the high resistance state RH.

Before carrying out the logical calculation, the level of the match line input terminal MLin is the Low level, and the level of the match line output terminal MLout is the Low level. Each of the levels of the search lines SL and /SL, which form a pair, is the Low level.

Just after the logical calculation is started, the level of the search line SL and the level of the search line /SL are driven to the High level and the Low level respectively according to the input data B=1.

When the level of the match line input terminal MLin transits to the High level by propagation of the signal which is provided by the content addressable memory cell existing at the front position, the sense current flows from the charge/discharge circuit 250 to Gnd through the variable-resistance-type non-volatile memory element R0 and the NMOS transistor N0.

As a result, the level of the match line output terminal MLout transits to the High level with a delay time t(0) which is corresponding to the high resistance state RH.

(Third Row)

According to a third row of the logical calculation table 28 shown in FIG. 17, the stored data A is 1. At this time, R0 is in the low resistance state RL.

Before carrying out the logical calculation, the level of the match line input terminal MLin is the Low level, and the level of the match line output terminal MLout is the Low level. Moreover, each of the levels of the search lines SL and /SL, which form a pair, is the Low level.

Just after the logical calculation is started, the level of the search line SL and the level of the search line /SL are driven to the Low level and the High level respectively according to the input data B=0.

When the level of the match line input terminal MLin transits to the High level by propagation of the signal which is provided by the content addressable memory cell 200 existing at the front position, the sense current flows from the charge/discharge circuit 250 to Gnd through the NMOS transistor N1.

As a result, the level of the match line output terminal MLout transits to the High level with the delay time t(0, tr) which is corresponding to the transistor N1.

(Fourth Row)

According to a fourth row of the logical calculation table 28 shown in FIG. 17, the stored data A is 1. At this time, R0 is in the low resistance state RL.

Before carrying out the logical calculation, the level of the match line input terminal MLin is the Low level, and the level of the match line output terminal MLout is the Low level. Moreover, each of the levels of the search lines SL and /SL, which form a pair, is the Low level.

Just after the logical calculation is started, the level of the search line SL and the level of the search line /SL are driven to the High level and the Low level respectively according to the input data B=1.

When the level of the match line input terminal MLin transits to the High level by propagation of the signal which is provided by the content addressable memory cell 200 existing at the front position, the sense current flows from the charge/discharge circuit 250 to Gnd through the variable-resistance-type non-volatile memory element R0 and the NMOS transistor N0.

As a result, the level of the match line output terminal MLout transits to the High level with a delay time t(1) which is corresponding to the low resistance state RL.

Figure 18:
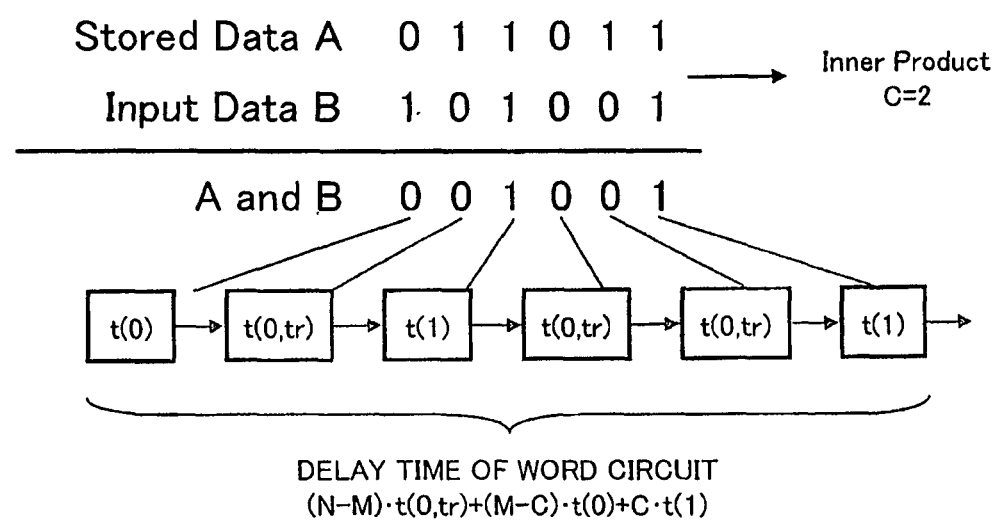
FIG. 18 is a conceptual diagram showing an example of a calculation operation of a word circuit according to the second exemplary embodiment of the present invention.

FIG. 18 is a conceptual diagram showing an example of a calculation operation of a word circuit 24 of the content addressable memory 2 according to the second exemplary embodiment. Here, the word circuit 24 shown in FIG. 18 includes 6 content addressable memory cells, and consequently number of bits N is 6.

According to the word circuit 24 exemplified in FIG. 18, in the case that the stored data A is '011011', and the input data B is '101001', then A and B is '001001'.

Here, C which is defined as number of '1' in A and B (001001) is 2. Moreover, M which is defined as number of '1' in the input data B is 3. At this time, a delay time D2 of the word circuit is expressed by Formula 11.

$$D2=(N-M)\cdot t(0,tr)+(M-C)\cdot t(0)+C\cdot t(1) \quad (11)$$

Figure 19:
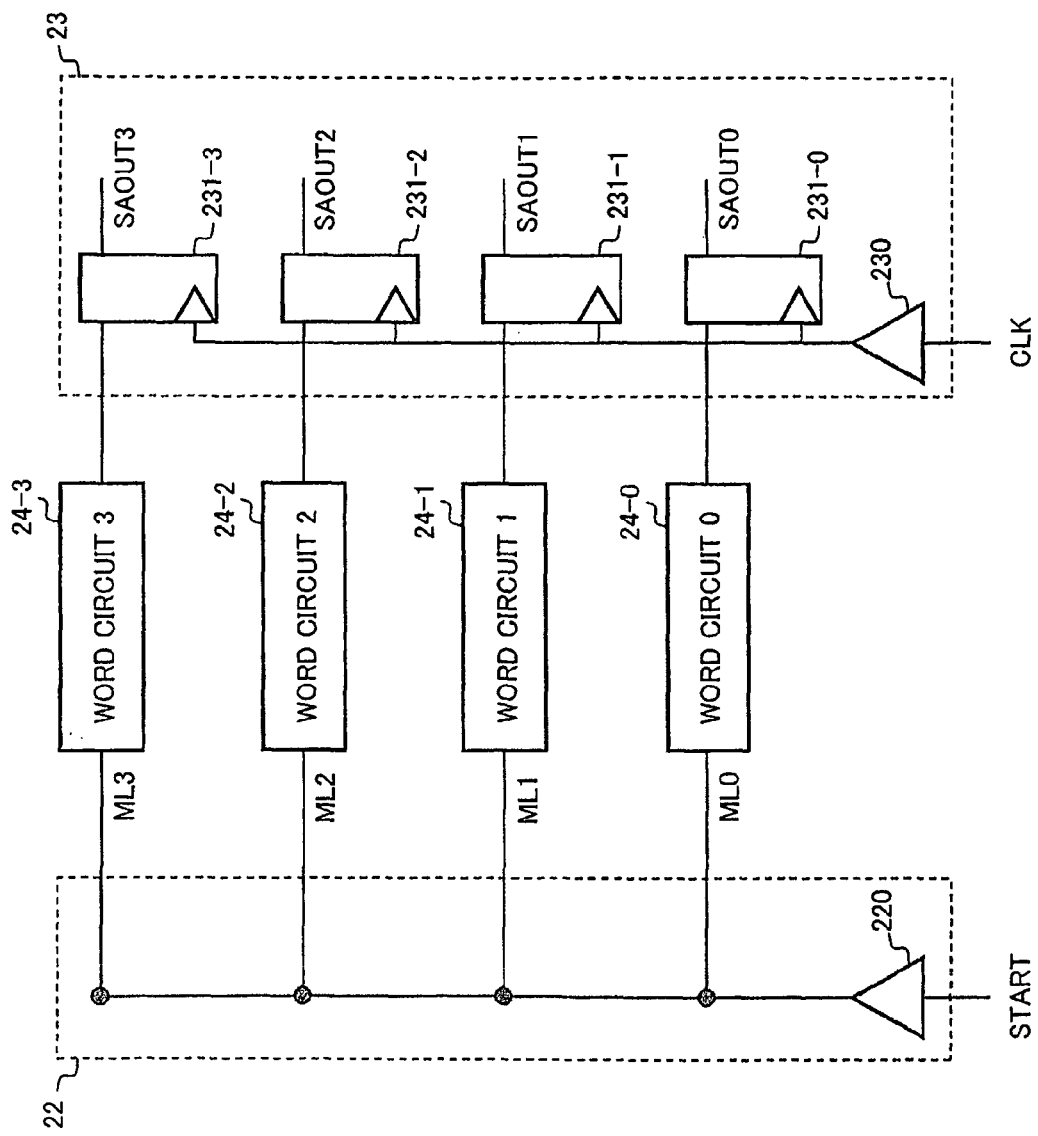
FIG. 19 is a block diagram showing schematic composition of the content addressable memory according to the second exemplary embodiment of the present invention.

FIG. 19 is a block diagram showing schematic composition of the content addressable memory 2 according to the second exemplary embodiment of the present invention. For simplification of FIG. 19, the column side circuit 21, and the pair of search lines SL and /SL are omitted in FIG. 19.

The calculation start signal START is provided to an input terminal of a buffer 220 of the row side circuit 22, and an output terminal of the buffer 220 is connected with the match line ML. The sense circuit 23 includes Data Flip-Flop (DFF 231) which is corresponding to the word circuit 24.

A clock signal CLK is provided to an input terminal of a buffer 230 of the sense circuit 23, and an output terminal of the buffer 230 is connected with a clock terminal of DFF 231. The match line ML of each row is connected with a data input terminal of DFF 231. An output terminal of DFF 231 outputs the sense amplifier output signal SAOUT.

Figure 20:
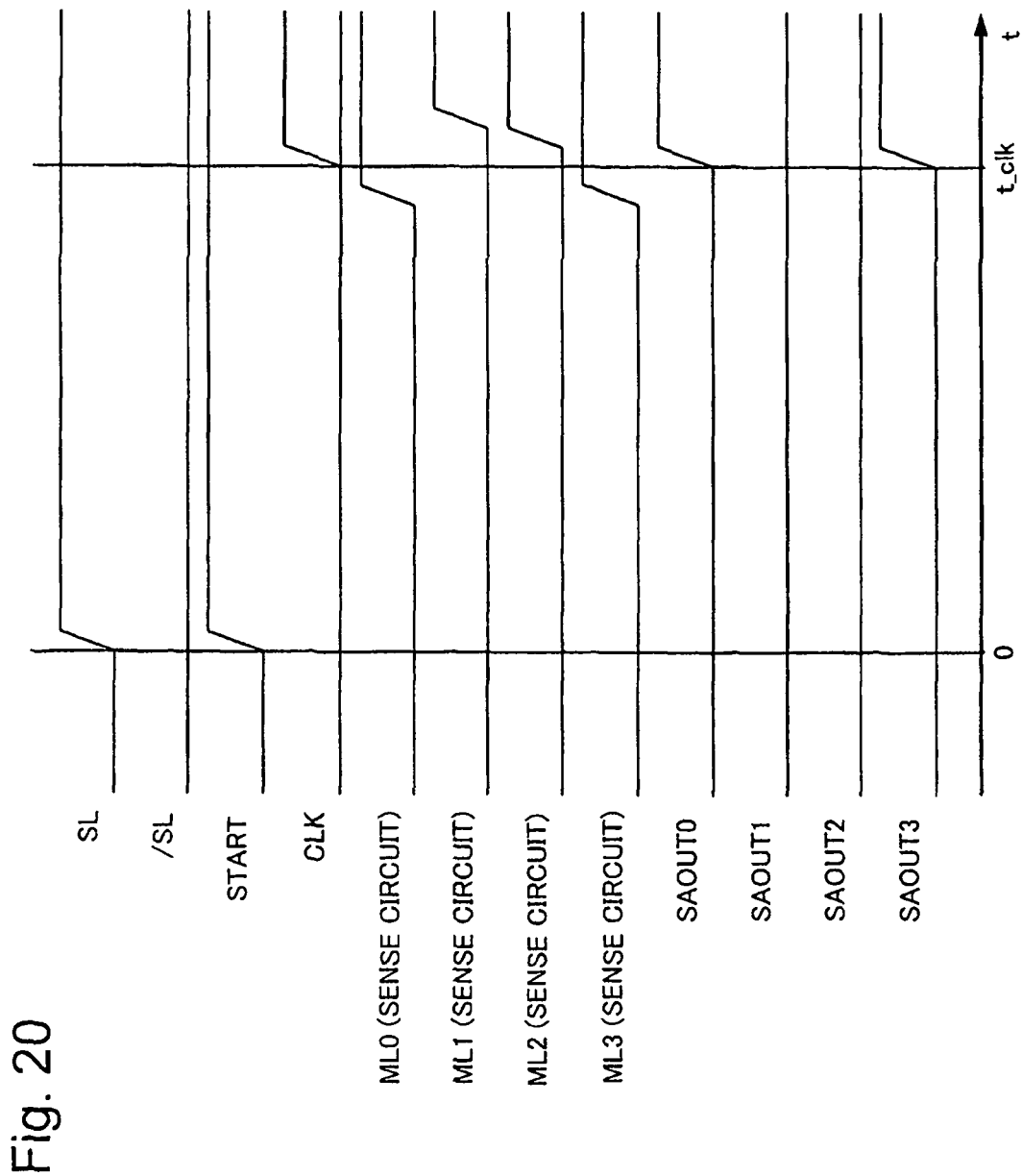
FIG. 20 is a diagram showing an operation of the content addressable memory according to the second exemplary embodiment of the present invention.

FIG. 20 is a diagram showing an example of an operation of the content addressable memory 2 according to the second exemplary embodiment of the present invention.

With reference to FIG. 19 and FIG. 20, an operation of the content addressable memory in the second exemplary embodiment of the present invention, which is carried out at a time of calculation, will be explained in the following.

Before carrying out the calculation, each of the levels of the search lines SL and /SL, which form a pair, is the Low level, and a level of the calculation start signal START is the Low level, and a level of the clock signal CLK is the Low level.

When the level of the calculation start signal START is changed to the High level, the calculation is started. It is assumed that a time t at which the calculation is started is 0.

The row side circuit 22 receives the calculation start signal START to drive the match line ML so as to have the High level. Then, the search line SL is driven so as to have the High level or the Low level according to the input data.

The word circuit 24 provides an output signal to the match line ML with the delay time which is corresponding to the inner product of the stored data and the input data as mentioned above.

When the level of the clock signal CLK is changed to the High level at a time t_clk, the sense circuit 23 samples data which exists on the match line ML connected with the sense circuit 23, and outputs the sampled data as the sense amplifier output signal SAOUT.

Figure 21:
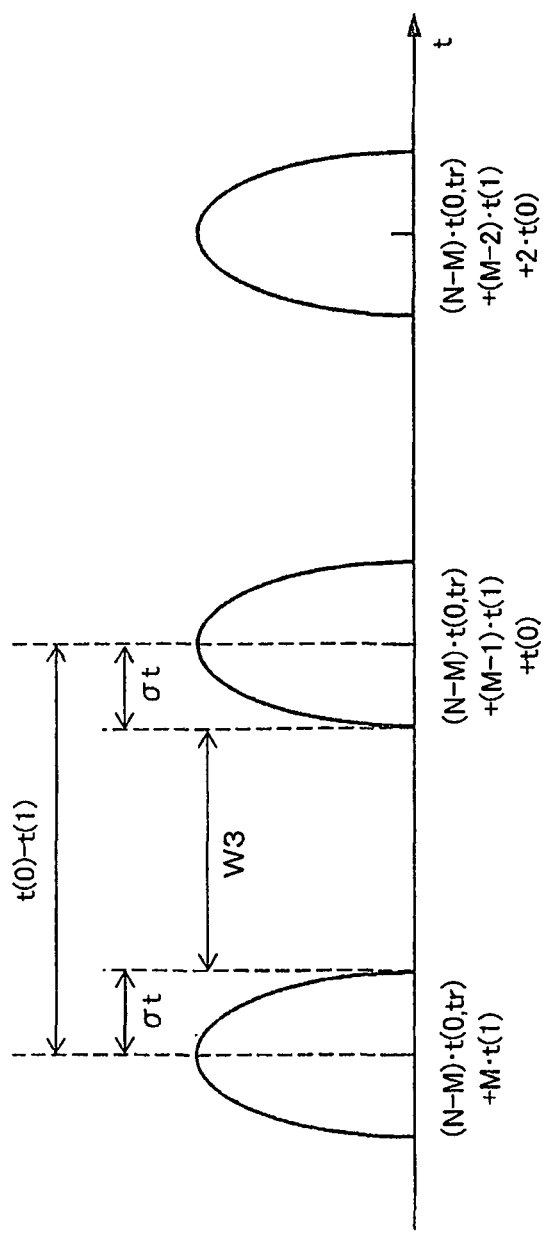
FIG. 21 is a diagram showing distribution of timing at which a level of a match line is changed to a High level according to the second exemplary embodiment of the present invention.

FIG. 21 is a histogram showing timing at which the level of the match line ML is changed to the High level. Here, it is assumed that number of bits of the word circuit is N.

In the case that the inner product of the stored data and the input data is M, timing at which the level of the match line ML is changed to the High level is distributed so that a distribution center may be a time TM0 shown by the following Formula 12.

$$TM0=(N-M)\cdot t(0,tr)+M\cdot t(1) \quad (12)$$

Similarly, in the case that the inner product of the stored data and the input data is M−1, timing at which the level of the match line ML is changed to the High level is distributed so that a distribution center may be a time TM1 shown by the following Formula 13.

$$TM1=(N-M)\cdot t(0,tr)+(M-1)\cdot t(1)+t(0) \quad (13)$$

Similarly, in the case that the inner product of the stored data and the input data is M−2, timing at which the level of the match line ML is changed to the High level is distributed so that a distribution center may be a time TM2 shown by the following Formula 14.

$$TM2=(N-M)\cdot t(0,tr)+(M-2)\cdot t(1)+2\cdot t(0) \quad (14)$$

Moreover, cases that the inner product of the stored data and the input data is equal to M−3, or smaller than M−3 are not shown in FIG. 21.

A time interval between the distributions t(0)-t(1).

It is assumed that a deviation of each distribution is σt. At this time, a time interval between (N−M)·t(0, tr)+M·t(1)+σt, and (N−M)·t(0, tr)+(M−1)·t(1)+t(0)−σt is a window W3. For example, in the case of retrieving the word circuit whose inner product is M, the level of the clock signal CLK may transit to the High level in the window W3 shown in FIG. 21. Here, the window W3 is expressed by Formula 15.

$$W3=t(0)-t(1)-2\cdot \sigma t \quad (15)$$

Then, the level of the sense amplifier output signal SAOUT, which is corresponding to the word circuit 24 whose inner product of the stored data and the input data is M, is changed to the High level, and each of the levels of the other sense amplifier output signals SAOUT is the Low level. That is, it is possible to detect only the word circuit 24 whose inner product is M.

Similarly, according to the content addressable memory of the second exemplary embodiment, it is possible to detect the word circuit 24 whose inner product is equal to d bits or larger than d bits (d is a positive integer which is equal to N or smaller than N).

As mentioned above, according to the second exemplary embodiment of the present invention, it is possible to detect the word circuit whose result of the calculation based on the input data and the stored data is equal to d bits or larger than d bits. According to the present exemplary embodiment, the calculation of the inner product is exemplified as the specific calculation of similarity.

Moreover, according to the second exemplary embodiment of the present invention, it is possible to make an area of the content addressable memory small by realizing both of the function of storing the data and the function of generating the delay time by use of the variable-resistance-type non-volatile memory element.

Furthermore, if a content addressable memory uses the content addressable memory cell according to the second exemplary embodiment of the present invention, it is possible to turn the electric power source off with ease. As a result, it is possible to suppress the leak current.

(Modification 1)

Next, a modification 1 of the content addressable memory 2 according to the second exemplary embodiment will be explained.

Figure 22:
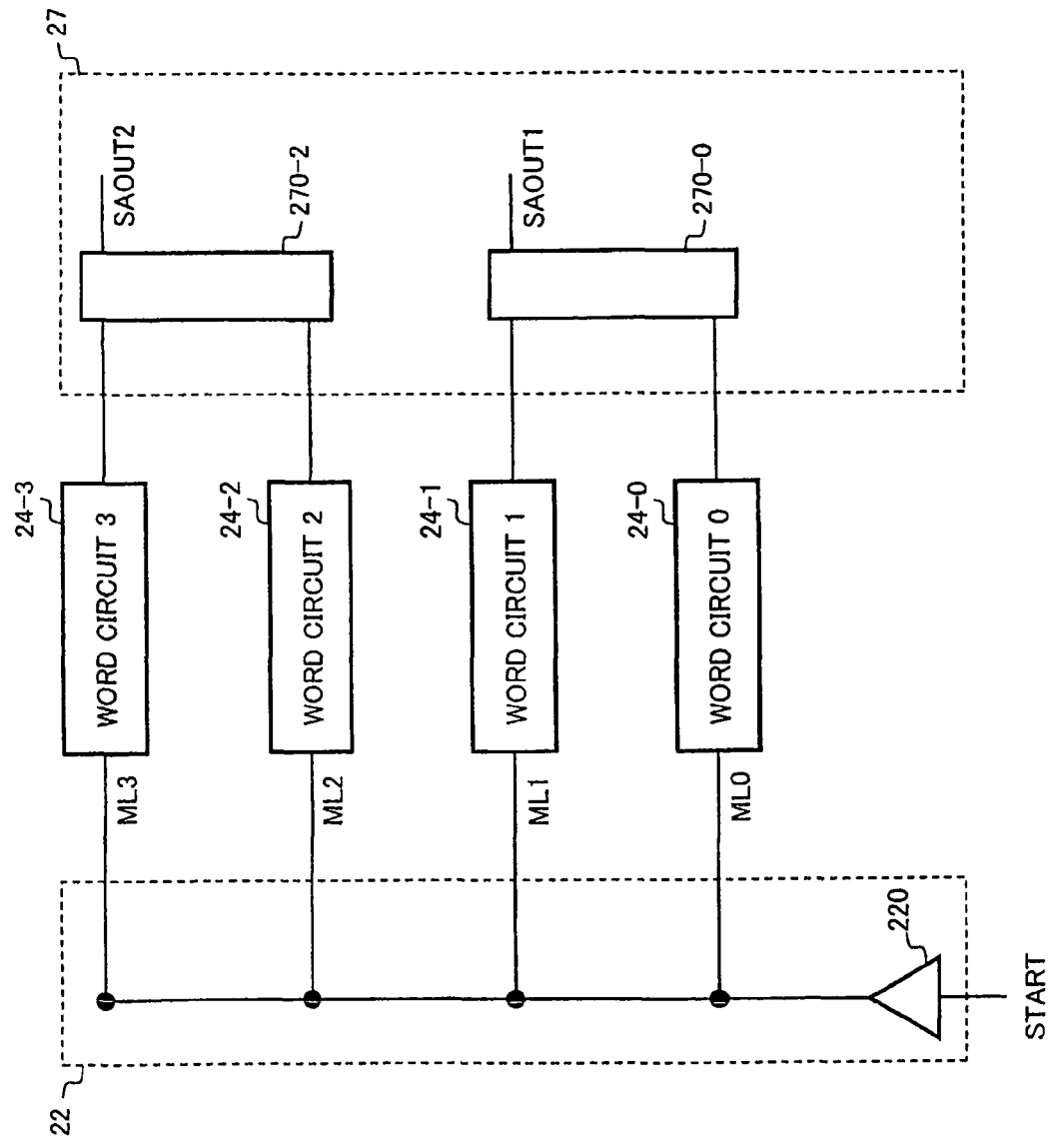
FIG. 22 is a block diagram showing schematic composition of a content addressable memory in a modification 1 according to the second exemplary embodiment of the present invention.

The content addressable memory 2 of the modification 1 has circuit composition shown in FIG. 22. The circuit composition in FIG. 22 is different from the circuit composition in FIG. 19 only in a point that a sense circuit 27 includes a comparison circuit 270. Here, explanation on overlapping composition is omitted appropriately.

According to the modification 1 of the second exemplary embodiment, calculation of the step function is carried out to a difference between inner products shown in Formula 16.

$$SAOUTn = \begin{cases} 1 & \text{if } A^*_{2n+1}\ B - A^*_{2n}\ B > 0 \\ 0 & \text{if } A^*_{2n+1}\ B - A^*_{2n}\ B \leq 0 \end{cases} \quad (16)$$

Here, $A_{2n}$ is a data which is stored in the word circuit 24 shown in a 2n'th row, where n is a positive integer. $A_{2n+1}$ is a data which is stored in the word 24 shown in a 2n+1'th row. B is input data. SAOUTn is an output of a n'th comparison circuit 270.

According to the modification 1 of the second exemplary embodiment, calculation of Formula 16 is carried out by comparison of the delay times of the word circuits 24 which are adjacent each other. Hereinafter, it will be shown that the calculation of Formula 16 can, be carried out by comparison of the delay times.

A sense amplifier of the modification 1 compares a delay time of the word circuit 24 shown in the 2n'th row and a delay time of the word circuit 24 shown in the 2n+1'th row, and outputs a comparison result which is expressed by Formula 17.

$$SAOUTn = \begin{cases} 1 & \text{if } [(N-M)*t(0,tr)+(M-C_{2n+1})*t(0)+C_{2n+1}*t(1)] \\ & -[(N-M)*t(0,tr)+(M-C_{2n})*t(0)+C_{2n}*t(1)] < 0 \\ 0 & \text{if } [(N-M)*t(0,tr)+(M-C_{2n+1})*t(0)+C_{2n+1}*t(1)] \\ & -[(N-M)*t(0,tr)+(M-C_{2n})*t(0)+C_{2n}*t(1)] \geq 0 \end{cases}$$

Here, in each inequality of Formula 17, a first term (first square brackets) means the delay time of the 2n+1'th row, and a second term (second square brackets) means the delay time of the 2n'th row Here, N is number of bits of the word circuit 24, and M is number of '1' included in the input data B, and $C_{2n}$ is an inner product $A_{2n}\cdot B$ of the stored data and the input data of the word circuit 24 shown in the 2n'th row, and $C_{2n+1}$ is an inner product $A_{2n+1}\cdot B$ of the stored data and the input data of the word circuit 24 shown in the 2n+1'th row. Delay times t(0, tr), t(0) and t(1) are the delay times which are shown in the fourth column of the logical calculation table 28 shown in FIG. 17. Here, it is assumed that there is no delay variation. By rewriting Formula 17, Formula 18 is acquired.

$$SAOUTn = \begin{cases} 1 & \text{if } ((C_{2n+1}-C_{2n})(t(0)-t(1))) > 0 \\ 0 & \text{if } ((C_{2n+1}-C_{2n})(t(0)-t(1))) \leq 0 \end{cases}$$

Since t(0) is larger than t(1), Formula 18 is equivalent to Formula 16.

With reference to FIG. 22, the content addressable memory 1 of the modification 1 according to the second exemplary embodiment of the present invention will be explained in the following. Here, in order to explain a process which is carried out between the word circuits 24 adjacent each other, the word circuit 24 shown in the row having an odd number, and the word circuit 24 shown in the row having an even number are denoted as the word circuit 24-2n+1, and the word circuit 24-2n respectively (n is integer). Furthermore, other components are denoted in the same way.

The calculation start signal START is provided to the input terminal of the buffer 220 of the row side circuit 22, and the output terminal of the buffer 220 is connected with the match line ML. The sense circuit 27 includes the comparison circuit 270. A comparison circuit 270-n receives outputs of the word circuit 24-2n and the word circuit 24-2n+1 through the match lines ML respectively. The comparison circuit 270-n detects which match line out of the match line ML2n and ML2n+1 transits earlier to the High level. In the case that a level of the match line 2n transits earlier to the High level, a level of an output signal SAOUTn of the comparison circuit 270-n is the Low level. In the case that a level of the match line ML2n+1 transits earlier to the High level, the level of the output signal SAOUTn of the comparison circuit 270-n is the High level.

Figure 23:
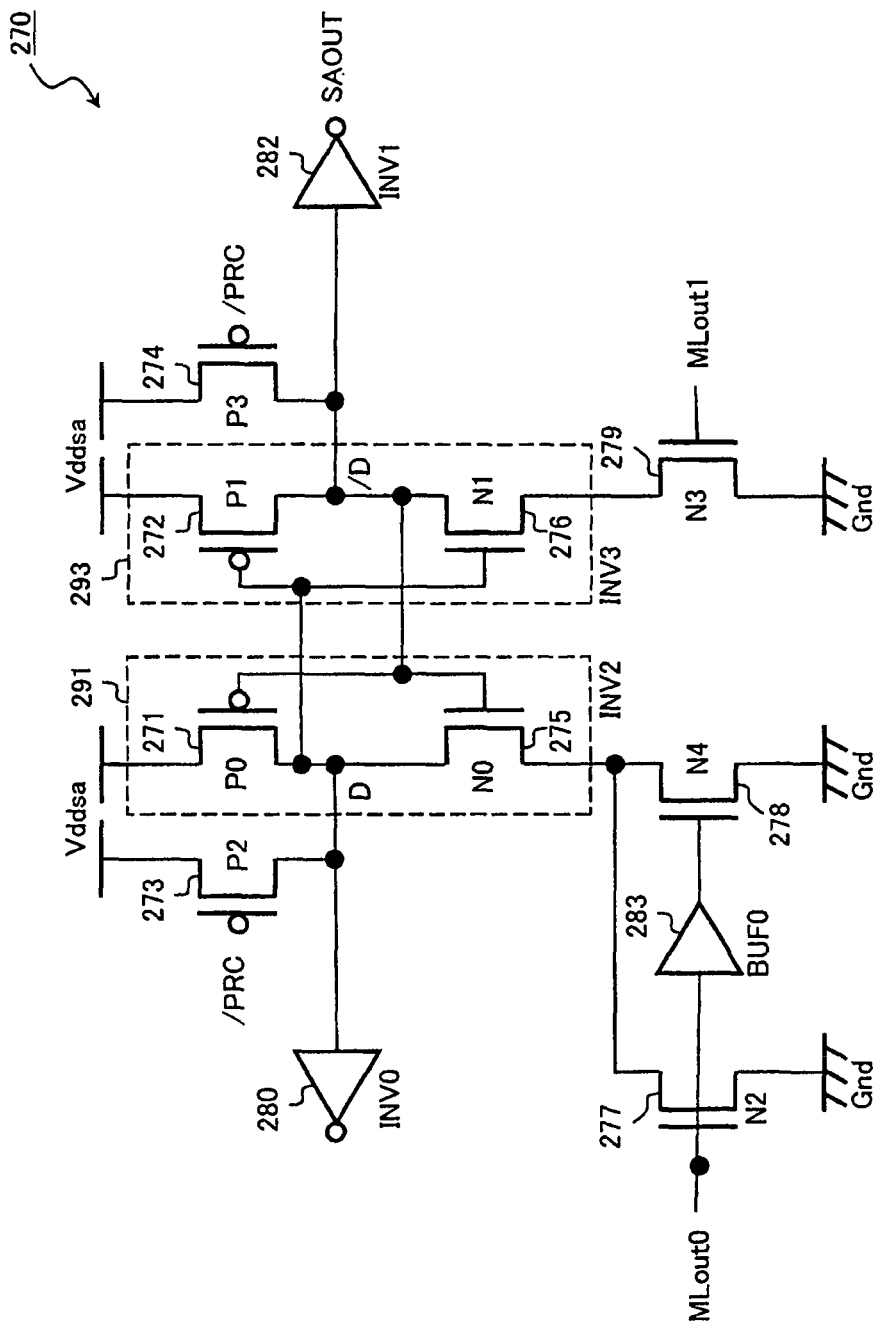
FIG. 23 is a circuit diagram of a comparison circuit in the modification 1 according to the second exemplary embodiment of the present invention.

FIG. 23 is a circuit diagram of the comparison circuit 270 which is included the content addressable memory 1 according to the modification 1 of the present exemplary embodiment.

The comparison circuit 270 is a circuit for detecting which match line out of a match line MLout 0 and a match line MLout 1 transits earlier to the High level.

The comparison circuit 270 includes four PMOS transistors P0 to P3 (271 to 274), five NMOS transistors N0 to N4 (275 to 279), an inverter INV0 (inverter 280), an inverter INV1 (inverter 282) and a buffer BUF0 (buffer 283). Here, in FIG. 23, the PMOS transistors P0 to P3 are the PMOS transistors 271 to 274, and the NMOS transistors N0 to N4 are the NMOS transistors 275 to 279. Moreover, in FIG. 23, the inverter INV0 is the inverter 280, and the inverter INV1 is the inverter 282, and the buffer BUF0 is the buffer 283.

The PMOS transistor P0 and the NMOS transistor N0 form an inverter INV2 (inverter 291), and the PMOS transistor P1 and the NMOS transistor N1 form an inverter INV3 (inverter 293). The inverter INV2 and the inverter INV3 are cross-coupled so as to hold one bit data.

An electric power source terminal of the inverter INV2 is connected with an electric power source voltage Vddsa of a sense amplifier, and a Gnd terminal of the inverter INV2 is connected with a drain of the NMOS transistor N2. An electric power source terminal of the inverter INV3 is connected with the electric power source voltage Vddsa of the sense amplifier, and a Gnd terminal of the inverter INV3 is connected with a drain of the NMOS transistor N3. An output terminal of the inverter INV2 is connected with an input terminal of the inverter INV0, and the PMOS transistor P2. An output terminal of the inverter INV3 is connected with an input terminal of the inverter INV1, and the PMOS transistor P3. The inverter INV1 outputs the sense amplifier output signal SAOUT.

A gate of the NMOS transistor N2 is connected with the match line MLout 0, and a source is grounded. A gate of the NMOS transistor N3 is connected with the match line MLout 1, and a source is grounded. A gate of the PMOS transistor P2 is provided with the inversion signal of pre-charge signal /PRC, and a source is connected with the electric power source voltage Vddsa of the sense amplifier. A gate of the PMOS transistor P3 is provided with the inversion signal of pre-charge signal /PRC. An input terminal of the BUF0 is connected with MLout 0, and an output terminal is connected with a gate of the transistor N4. A drain of the NMOS transistor N4 is connected with the Gnd terminal of the invertor N2, and a source is grounded. Here, even if the electric power source voltage Vddsa of the sense amplifier is not coincident with the electric power source voltage Vdd of the content addressable memory cell, a normal operation is secured.

In the comparison circuit 270, at a time of pre-charge, a level of the inversion signal of pre-charge signal /PRC is the Low level and each of levels of the match lines MLout 0 and MLout 1 is the Low level, and then the PMOS transistor P2 and the PMOS transistor P3 make each of levels of a node D and, a node /D the High level. Afterward, at a time of comparison, the level of the inversion signal of pre-charge signal /PRC is changed to the High level.

In the case that the level of the match line MLout 0 transits to the high level earlier than the match line MLout 1, a charge of the node D is discharged, and consequently the level of the node D is changed to the Low level. Meanwhile, the level of the node /D is the High level, and a level of the output signal SAOUT is the Low level.

In the case that the level of the match line MLout 1 transits to the High level earlier than the match line MLout 0, a charge of the node /D is discharged, and consequently the level of the node /D transits to the Low level. Meanwhile, the level of the node D is the High level, and the level of the output signal SAOUT is the High level.

In the case that the levels of the match line MLout 0 and MLout 1 transit almost simultaneously (that is, time variation is equal to 2σt or smaller than 2σt) to the High level, the NMOS transistor N2 and the NMOS transistor N3 turns on, and consequently the charges of the nodes D and /D start discharging. Afterward, the NMOS transistor N4 turns on after elapse of a delay time of the BUF0, and the levels of the nodes D and /D are changed to the Low level and the High level respectively, and the level of output signal SAOUT is changed to the Low level.

As mentioned above, according to the content addressable memory 2 in the modification 1 of the present exemplary embodiment, it is possible to carry out the calculation of the step function to the difference of the inner products. According to the content addressable memory 2 in the modification 1 of the present exemplary embodiment, two word circuits 24 to be compared each other work at the same environmental temperature and with the same electric power source voltage. As a result, it is possible to carry out an appropriate operation even if the environmental temperature and the electric power source voltage are changed. Moreover, according to the content addressable memory 2 in the modification 1, since a distance between two word circuits 24 to be compared each other is short, there is no global variation in characteristics of the transistor and a resistance value of MTJ (Magnetic Tunnel Junction), and there is only local variation. Therefore, according to the content addressable memory 2 in the modification 1, it is possible to carry out accurate comparison between the input data and the stored data and to prevent an error in reading the data.

Here, it is possible to consider that the content addressable memory 2 according to the second exemplary embodiment calculates an inner product of the three-level data of the content addressable memory cell 20, and the input data. Specifically, the content addressable memory cell 20 having three levels includes a content addressable memory cell of 2n'th row and p'th column, and a content addressable memory cell of 2n+1'th row and p'th column, and can be in three states as shown in a logical calculation table 29 of FIG. 24.

R1, which is shown in a first column of the logical calculation table 29, is a resistor of the content addressable memory cell of the 2n+1'th row and p'th column. R0, which is shown in a second column of the logical calculation table 29, is a resistor of the content addressable memory cell of the 2n'th row and p'th column. A third column of the logical calculation table 29 is the stored data A. Then, Formula 16 is rewritten by Formula 19.

$$SAOUTn = \begin{cases} 1 & \text{if } A_n * B > 0 \\ 0 & \text{if } A_n * B \leq 0 \end{cases} \quad (19)$$

Here, $A_n$ is a data which is stored in the three-level content addressable memory cell 20 of a n'th row, where n is a positive integer. B is the input data. SAOUTn is an output of the n'th comparison circuit 270. Accordingly, the content addressable memory 2 of the second exemplary embodiment can carry out the calculation of the step function to the inner product of the three-level stored-data and the input data.

Third Exemplary Embodiment

Figure 25:
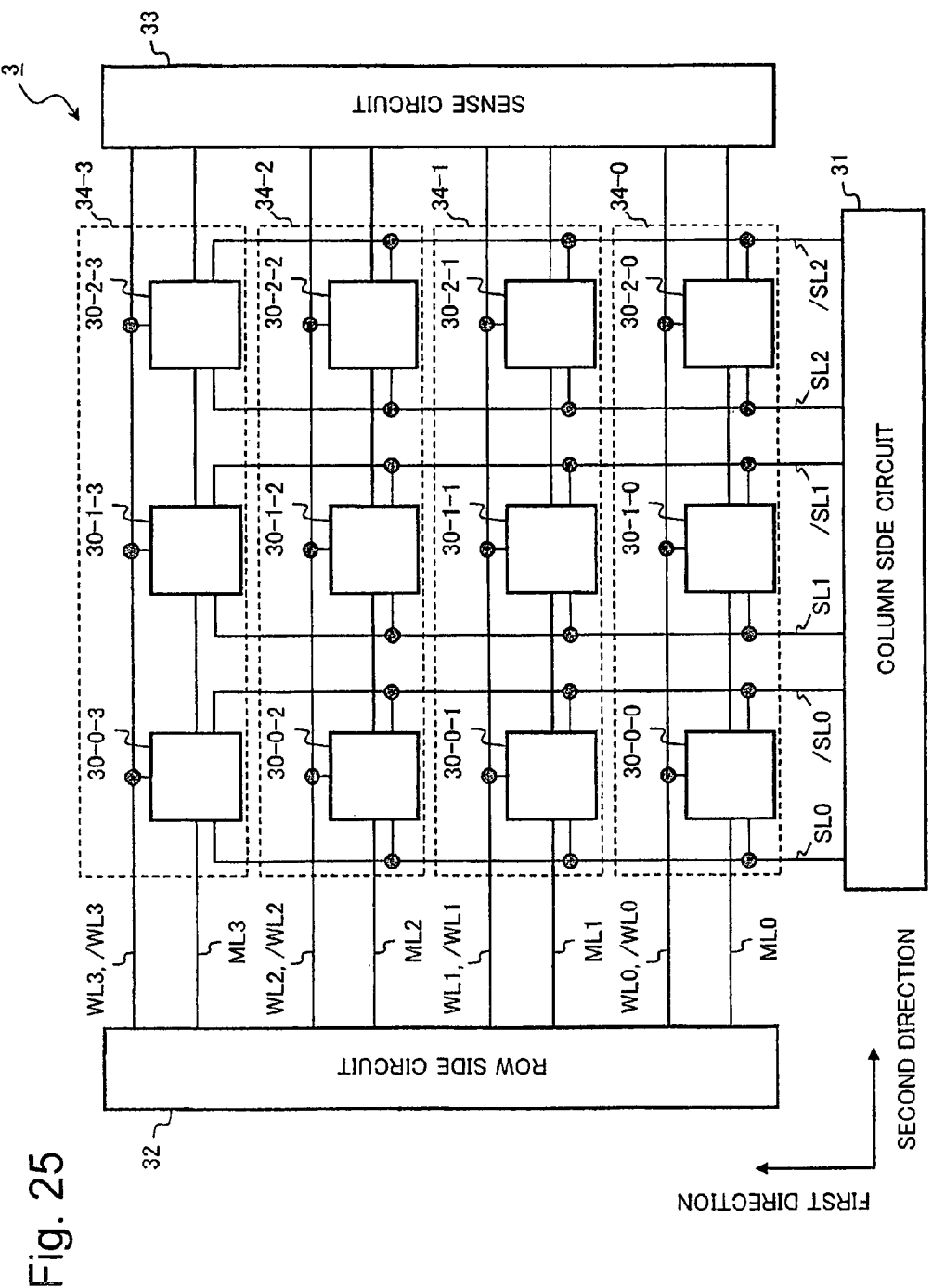
FIG. 25 is a block diagram showing schematic composition of a content addressable memory according to a third exemplary embodiment of the present invention.

FIG. 25 is a block diagram showing schematic composition of a content addressable memory 3 according to a third exemplary embodiment of the present invention. Here, explanation on composition which overlaps with the composition of the first and the second exemplary embodiments is omitted.

The content addressable memory 3 according to the third exemplary embodiment of the present invention includes a plurality of content addressable memory cells 30 which are arranged in a form of a two-dimensional, matrix, and the plural content addressable memory cells 30 which are arranged in the second direction compose a word circuit 34. Here, in FIG. 25, in order to distinguish the plural content addressable memory cells 30 and the plural word circuits 34, an end of a code, which is assigned to each component, includes a column number and a row number. In the case that the distinction is unnecessary, the end number of the code is omitted.

Moreover, the content addressable memory 3 includes a plurality of pairs of search lines SL and /SL, a plurality of match lines ML, and a plurality of pairs of word lines WL and /WL. Each pair of search lines SL and /SL is commonly connected with the content addressable memory cells 30 which are arranged in the first direction.

Each match line ML connects the content addressable memory cells 30, which are arranged in the second direction, in series. Each pair of word lines WL and /WL is commonly connected with the content addressable memory cells 30 which are arranged in the second direction. Here, in FIG. 25, in order to distinguish the plural wirings, an end of a code, which is assigned to each wiring, includes a column number or a row number. In the case that the distinction is unnecessary, the end number of the code is omitted.

Furthermore, the content addressable memory 3 includes a column side circuit 31, a row side circuit 32 and a sense circuit 33. The column side circuit 31 is connected with the plural pairs of search lines SL and /SL, and drives the pair of search lines SL and /SL according to input data at a time of calculation. The row side circuit 32 is connected with the plural match lines ML and the plural word lines WL, and drives the match line ML and the word line WL. The sense circuit 33 is connected with the plural match lines ML, and senses potential of the match line ML.

(Content Addressable Memory Cell)

Figure 26:
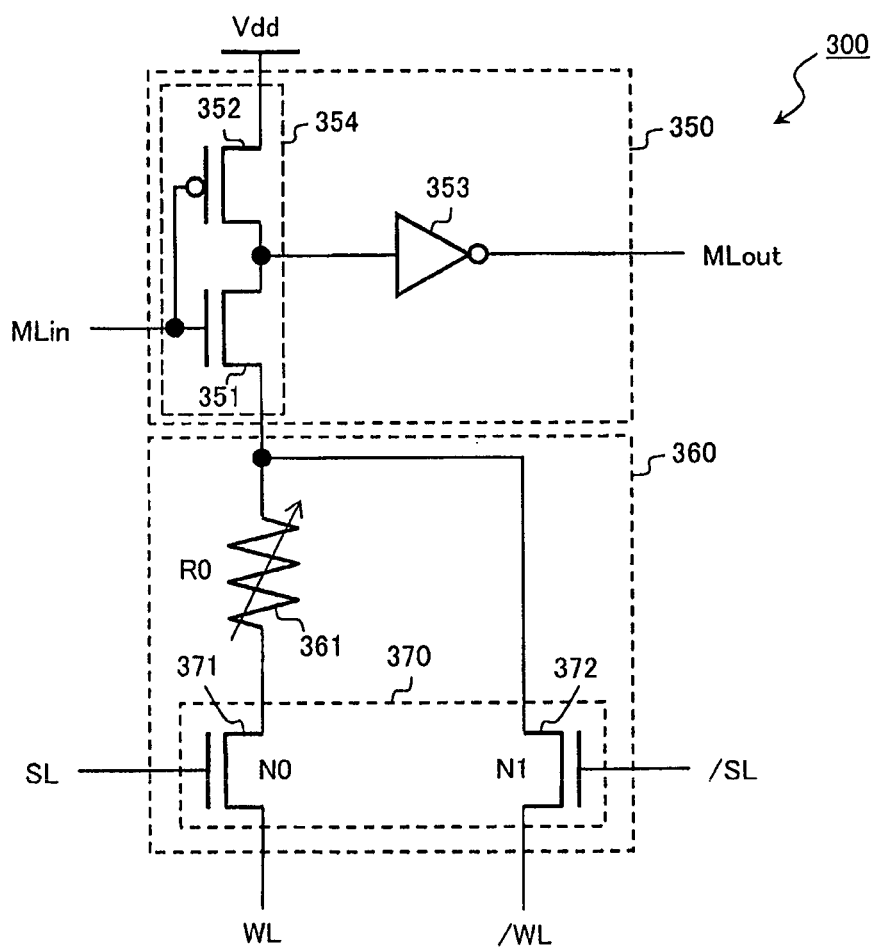
FIG. 26 is a circuit diagram of a content addressable memory cell according to the third exemplary embodiment of the present invention.

FIG. 26 is a specific circuit diagram of the content addressable memory cell 30 (content addressable memory cell 300) in the third exemplary embodiment of the present invention.

Similarly to the second exemplary embodiment, the word circuit 34, which includes the content addressable memory cell 300 having the above-mentioned circuit composition, can reflect an inner product of stored data and input data in a delay time of the word circuit 34.

A charge/discharge circuit 350 includes a NMOS transistor 351, a PMOS transistor 352 and an inverter 353. The NMOS transistor 351 and the PMOS transistor 352 form a CMOS inverter 354.

The match line input terminal MLin is connected with a gate of the NMOS transistor 351, and a gate of the PMOS transistor 352. An input terminal of the inverter 353 is connected with a drain of the PMOS transistor 352, and a drain of the NMOS transistor 351. An output terminal of the inverter 353 is connected with the match line output terminal MLout. A source of the PMOS transistor 352 is connected with an electric power source voltage Vdd, and a source of the NMOS transistor 351 is connected with one end of the variable-resistance-type non-volatile memory element R0 of a resistance network 360.

The resistance network 360 includes the variable-resistance-type non-volatile memory element R0 (361), and a NMOS logic circuit 370 (logic circuit). The NMOS logic circuit 370 (logic circuit) includes a NMOS transistor N0 (NMOS transistor 371) which is a first NMOS transistor, and a NMOS transistor N1 (NMOS transistor 372) which is a second NMOS transistor.

The one end of the variable-resistance-type non-volatile memory element R0 is connected with the source of the NMOS transistor 351 of the charge/discharge circuit 350, and a drain of the NMOS transistor N1. The other end is connected with a drain of the NMOS transistor N0. A gate of NMOS transistor N0 is connected with the search line SL, and a drain is connected with the other end of the variable-resistance-type non-volatile memory element R0, and a source is connected with the word line WL. A drain of NMOS transistor N1 is connected with the source of the NMOS transistor 351 of the charge/discharge circuit 350 and the one end of the variable-resistance-type non-volatile memory element R0, and a gate is connected with the search line /SL which forms a pair with the search line SL, and a source is connected with the word line /WL which forms a pair with the word line WL.

Since a logical calculation carried out in the content addressable memory 300 in the third exemplary embodiment of the present invention is the same as the logical calculation of the second exemplary embodiment except for a point that the pair of word lines WL and /WL is grounded at a time of the logical calculation, explanation on the logical calculation is omitted.

(Data Writing Operation)

An operation in which a data is written into the variable resistance element of the content addressable memory cell 30 in the third exemplary embodiment of the present invention will be explained in the following with reference to FIG. 25 and FIG. 26.

A resistance value of the variable-resistance-type non-volatile memory element R0 shown in FIG. 26 is changed dependently on a flowing direction of a data writing current whose current value is equal to a threshold value or larger than the threshold value. Specifically, in the case that the data writing current flows from the transistor N0 to the transistor N1 through the variable-resistance-type non-volatile memory element R0, the state of the variable-resistance-type non-volatile memory element R0 is changed to the low resistance state RL. On the other hand, in the case that the data writing current flows from the transistor N1 to the transistor N0 through the variable-resistance-type non-volatile memory element R0, the state of the variable-resistance-type non-volatile memory element R0 is changed to the high resistance state RH. In the present exemplary embodiment, the low resistance state RL is associated with a data '1', and the high resistance state RH is associated with a data '0'

When writing the data into the content addressable memory 30 in the present exemplary embodiment, each match line ML, each match line MLout, each pair of search lines SL and /SL which form a pair, and each pair of word lines WL and /WL which form a pair are set so as to have the High level. Next, the pair of the search lines SL and /SL connected with a selected cell into which data should be written is set so as to have the High level. Furthermore, the pair of word lines WL and /WL, which is connected with the selected cell, is driven according to the data which should be written.

In order to write the data '1', the word line WL and the word line /WL which form a pair are set so as to have the High level and the Low level respectively. The data writing current flows from WL to /WL through the transistor N0, the variable-resistance-type non-volatile memory element R0 and the transistor N1 of the selected cell. At this time, the variable-resistance-type non-volatile memory element R0 of the selected cell enters into the low resistance state RL.

In order to write the data '0', the word line WL is set so as to have the Low level, and the word line /WL which forms a pair with the word line WL is set so as to have the High level. The data writing current flows from /WL to WL through the transistor N1, the variable-resistance-type non-volatile memory element R0 and the transistor N0 of the selected cell. At this time, the variable-resistance-type non-volatile memory element R0 of the selected cell enters into the high resistance state RH.

(Data Reading Operation)

An operation in which a data is read from the variable resistance element of the content addressable memory cell 300 in the third exemplary embodiment of the present invention will be explained in the following with reference to FIG. 26.

At a time of reading the data, firstly, each MLin, each MLout, each pair of the search lines SL and /SL which form a pair, and each pair of the word lines WL and /WL which form a pair are set so as to have the Low level. Next, the pair of the search lines SL and /SL connected with a selected cell from which data should be read is set so as to have the High level. Furthermore, the word line WL is set so as to have a data reading voltage Vr. The word line /WL which forms a pair with the word line WL is set so as to have the Low level. A data reading current flows from the word line WL to /WL, which forms a pair with the word line WL, through the transistor N0, the variable-resistance-type non-volatile memory element R0 and the transistor N1. The data reading current is changed according to the resistance state of the variable-resistance-type non-volatile memory element R0, and then the row side circuit 32 judges the data.

As mentioned above, according to the third exemplary embodiment of the present invention, the transistor which is used for calculating the data can be used for making the data writing current flow at the time of writing the data, and can be used for making the data reading current flow at the time of reading the data. Therefore, it is possible to make a cell size small.

Fourth Exemplary Embodiment

Figure 27:
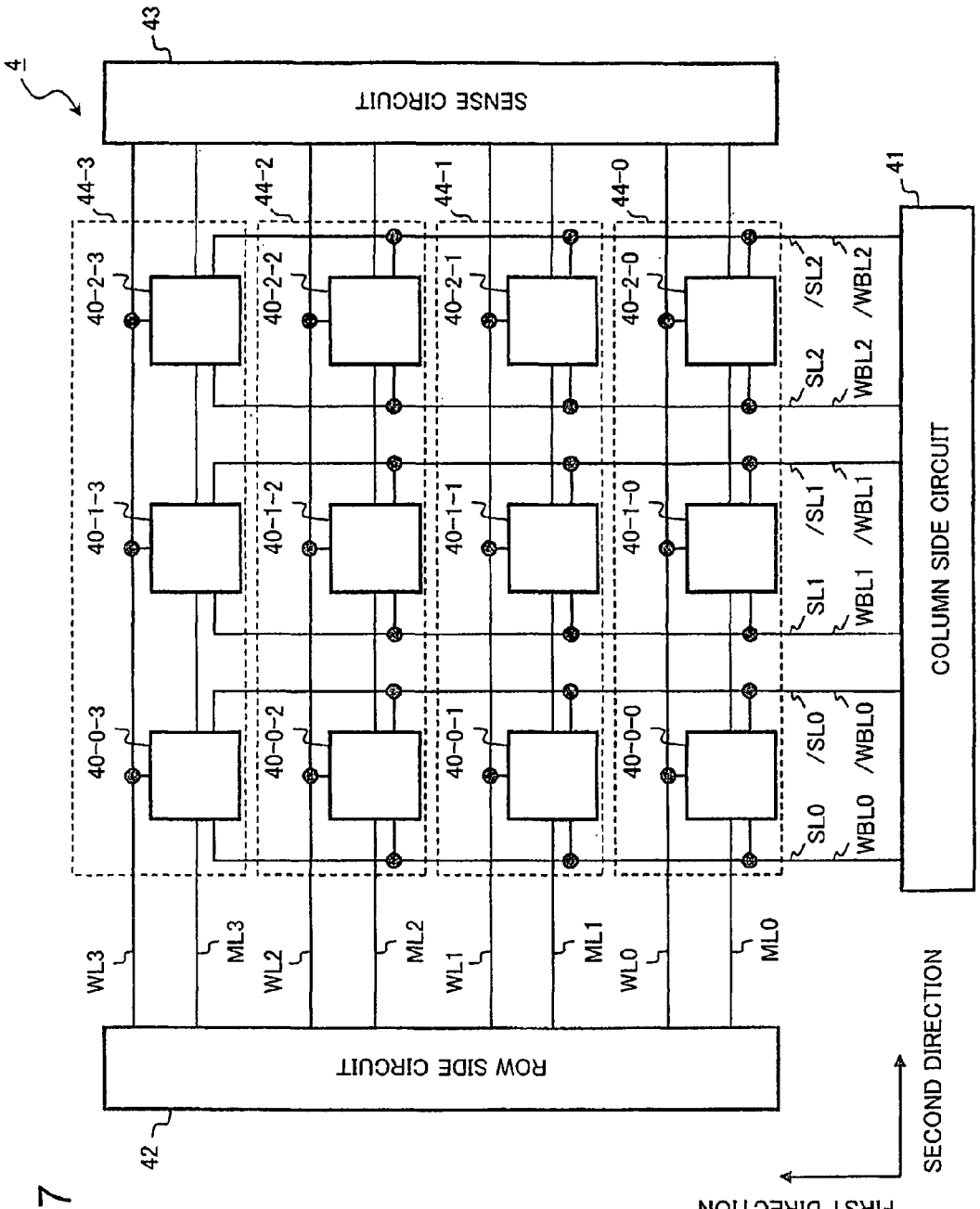
FIG. 27 is a block diagram showing schematic composition of a content addressable memory according to a fourth exemplary embodiment of the present invention.

FIG. 27 is a block diagram showing schematic composition of a content addressable memory 4 according to a fourth exemplary embodiment of the present invention. Here, explanation on composition which overlaps with the composition of the first to the third exemplary embodiments is omitted.

The content addressable memory 4 includes a plurality of content addressable memory cells 40 which are arranged in a form of a two-dimensional matrix, and the plural content addressable memory cells 40 which are arranged in the second direction compose a word circuit 44. Here, in FIG. 27, in order to distinguish the plural content addressable memory cells 40 and the plural word circuits 44, an end of a code, which is assigned to each component, includes a column number and a row number. In the case that the distinction is unnecessary, the end number of the code is omitted.

Moreover, the content addressable memory 4 includes a plurality of pairs of search lines SL and /SL, a plurality of writing bit lines WBL and /WBL, a plurality of match lines ML, and a plurality of word lines WL.

Each pair of search lines SL and /SL and each pair of writing bit lines WBL and /WBL are commonly connected with the content addressable memory cells 40 which are arranged in the first direction. Each match line ML connects the content addressable memory cells 40, which are arranged in the second direction, in series. Each word line WL is commonly connected with the content addressable memory cells which are arranged in the second direction. Here, in FIG. 27, in order to distinguish the plural wirings, an end of a code, which is assigned to each wiring, includes a column number and a row number. In the case that the distinction is unnecessary, the end number of the code is omitted.

Furthermore, the content addressable memory 4 includes a column side circuit 41, a row side circuit 42 and a sense circuit 43. The column side circuit 41 is connected with the plural pairs of search lines SL and /SL, and drives the pair of search lines SL and /SL according to an input data at a time of calculation. Furthermore, the column side circuit 41 is connected with the plural pairs of writing bit lines WBL and /WBL, and drives the pair of writing bit lines according to a writing data, which should be written, at a time of writing the data. The row side circuit 42 is connected with the plural match lines ML and the plural word lines WL, and drives the match line ML and the word line WL. The sense circuit 43 is connected with the plural match lines ML, and senses potential of the match line ML.

(Content Addressable Memory Cell)

Figure 28:
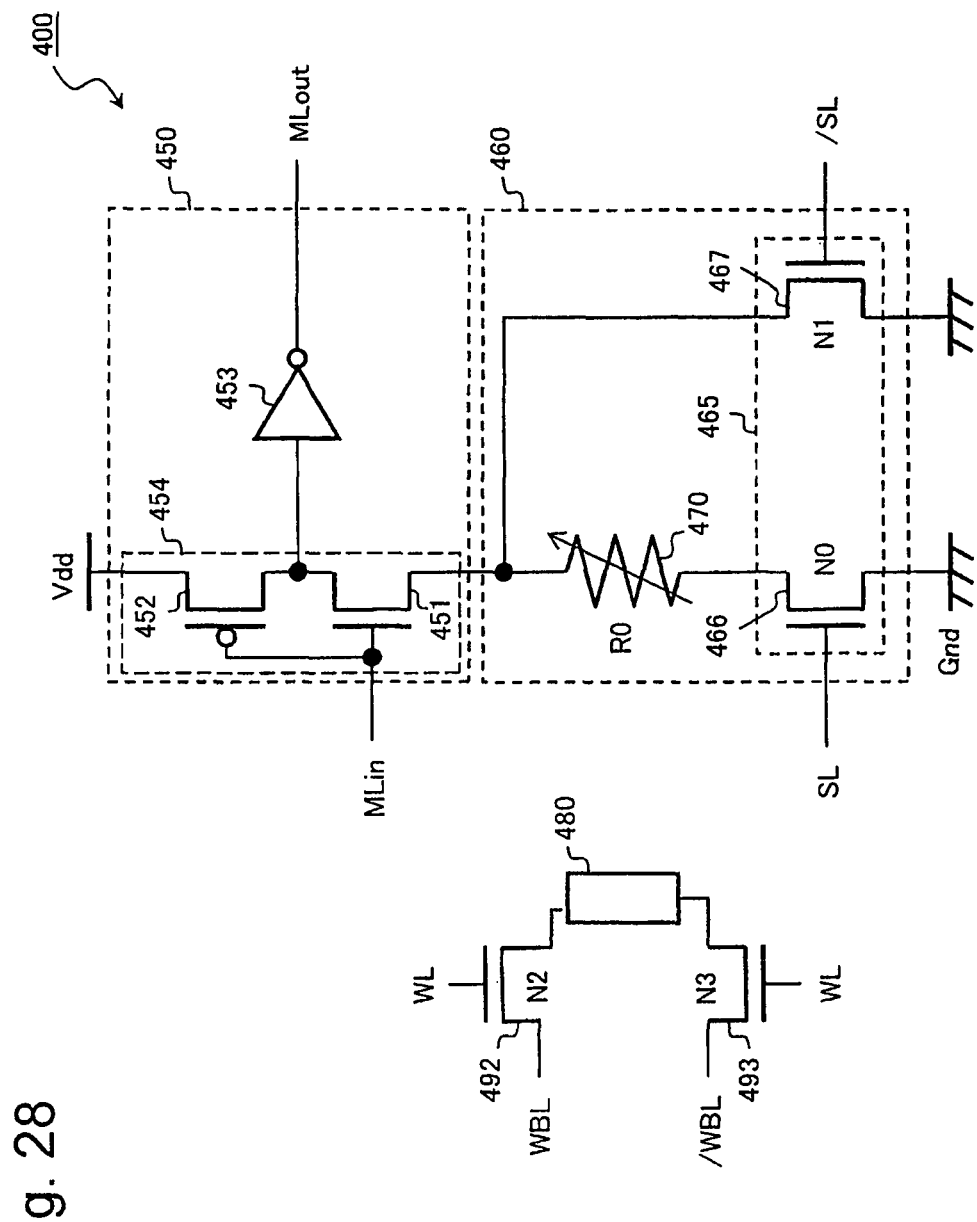
FIG. 28 is a circuit diagram of a content addressable memory cell according to the fourth exemplary embodiment of the present invention.

FIG. 28 is a specific circuit diagram of the content addressable memory cell 40 (content addressable memory cell 400) in the fourth exemplary embodiment of the present invention.

The content addressable memory cell 400 according to the fourth exemplary embodiment of the present invention includes a charge/discharge circuit 450, a resistance network 460 and a magnetic element section. Similarly to the second exemplary embodiment, the word circuit 44, which includes the content addressable memory cell 400 having the above-mentioned circuit composition, can reflect an inner product of stored data and the input data in a delay time of the word circuit.

The charge/discharge circuit 450 includes a NMOS transistor 451, a PMOS transistor 452 and an inverter 453. The NMOS transistor 451 and the PMOS transistor 452 form a CMOS inverter 454.

The match line input terminal MLin is connected with a gate of the NMOS transistor 451 and a gate of the PMOS transistor 452. An input terminal of the inverter 453 is connected with a drain of the PMOS transistor 452, and a drain of the NMOS transistor 451. An output terminal of the inverter 453 is connected with the match line output terminal MLout. A source of the PMOS transistor 452 is connected with an electric power source voltage Vdd, and a source of the NMOS transistor 451 is connected with one end of the variable-resistance-type non-volatile memory element R0 of the resistance network 460.

The resistance network 460 includes the variable-resistance-type non-volatile memory element R0, and a NMOS logic circuit 465 (logic circuit) having a NMOS transistor N0 and a NMOS transistor N1. Here, in FIG. 28, the variable-resistance-type non-volatile memory element R0 is a variable-resistance-type non-volatile memory element 470, and the NMOS transistor N0 is a NMOS transistor 466, and the NMOS transistor N1 is a NMOS transistor 467.

The one end of the variable-resistance-type non-volatile memory element R0 is connected with the source of the NMOS transistor 451 of the charge/discharge circuit 450, and the other end is connected with a drain of the NMOS transistor N0. A gate of the NMOS transistor N0 is connected with the search line SL, and a source is grounded. A drain of NMOS transistor N1 is connected with the source of the NMOS transistor 451 of the charge/discharge circuit 450, and the one end of the variable-resistance-type non-volatile memory element R0, and a gate is connected with the search line /SL which forms a pair with the search line SL, and a source is grounded.

(Magnetic Element Section)

The magnetic element section includes a NMOS transistor N2 (NMOS transistor 492), a NMOS transistor N3 (NMOS transistor 493) and a magnetic element 480.

A gate of the NMOS transistor N2 is connected with the word line WL, and one out of a drain and a source is connected with the writing bit line WBL, and the other is connected with the magnetic element 480. A gate of the NMOS transistor N3 is connected with the word line WL, and one out of a drain and a source is connected with the writing bit line /WBL which forms a pair with the writing bit line WBL, and the other out of the drain and the source is connected with the magnetic element 480.

Figure 29:
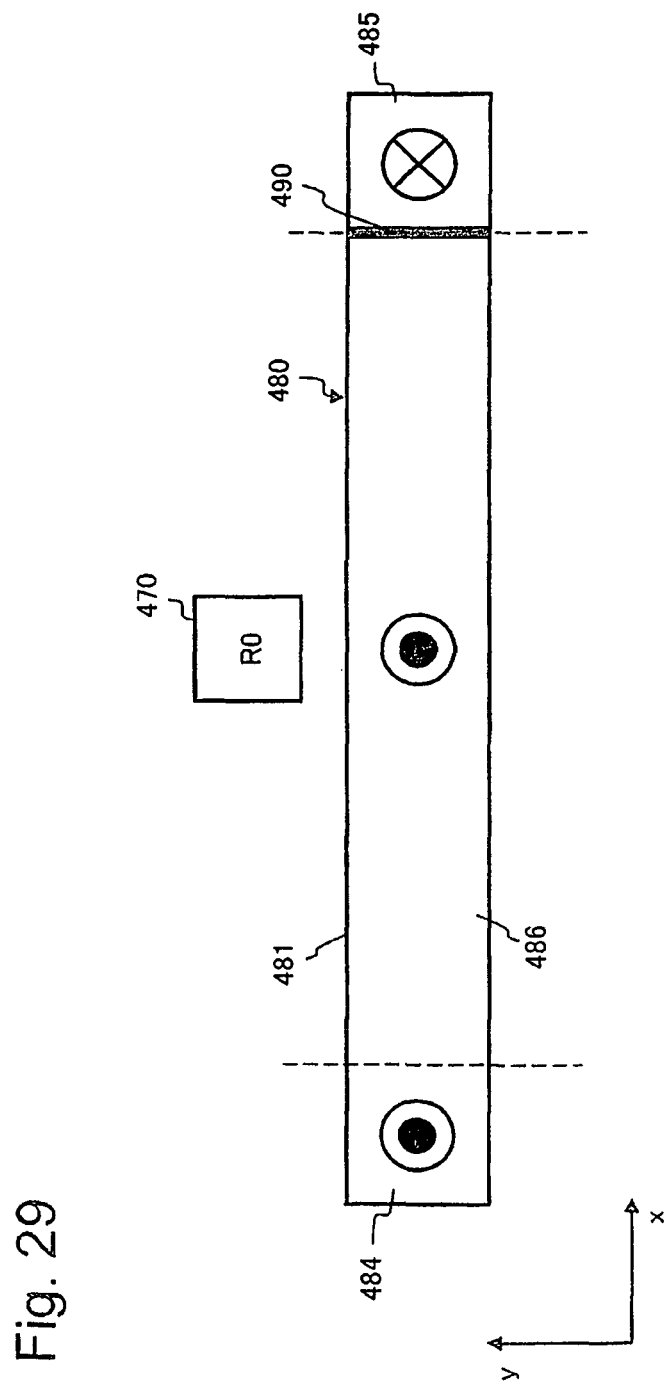
FIG. 29 is a schematic plan view of a magnetic element and a variable-resistance-type non-volatile memory element R0 according to the fourth exemplary embodiment of the present invention.
Figure 30:
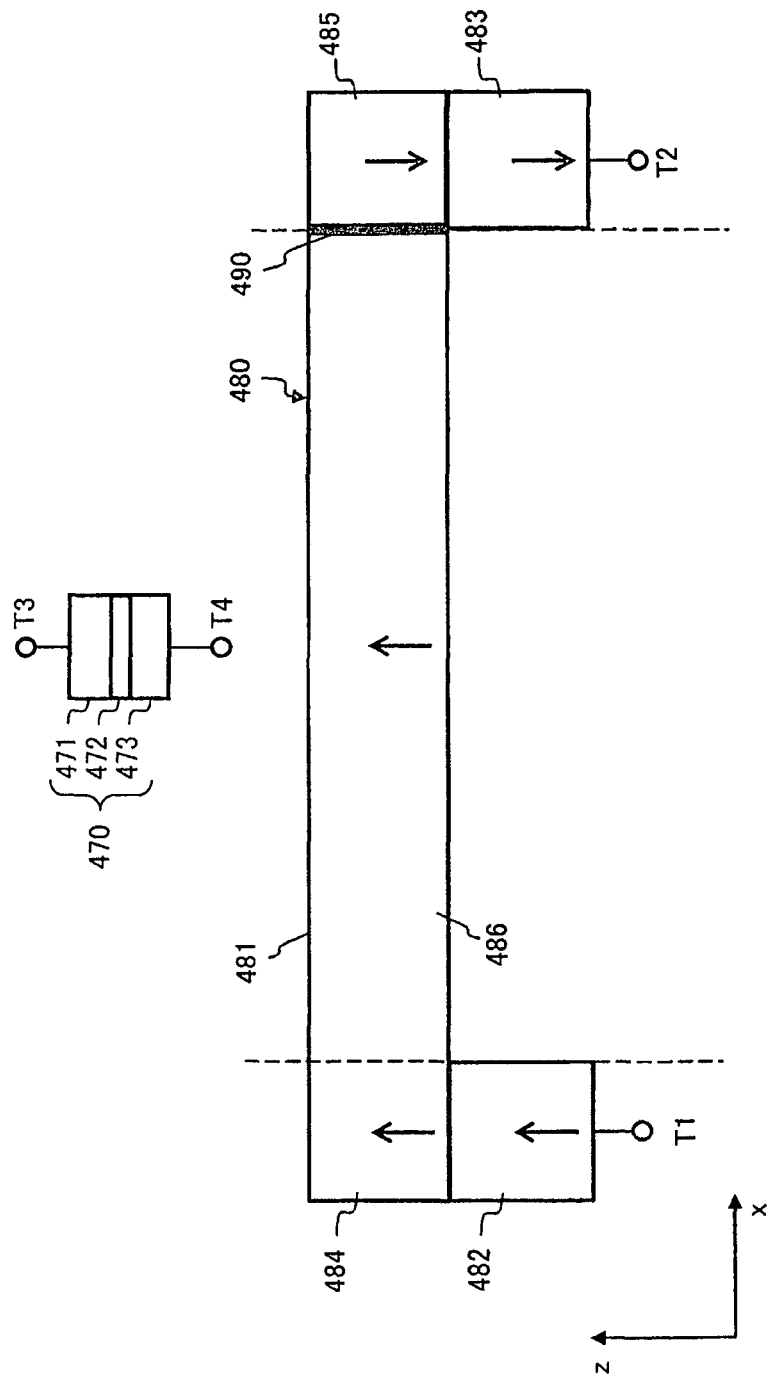
FIG. 30 is a schematic cross section view of the magnetic element and the variable-resistance-type non-volatile memory element R0 according to the fourth exemplary embodiment of the present invention.

FIG. 29 is a schematic plan view of the magnetic element 480 and the variable-resistance-type non-volatile memory element R0 (variable-resistance-type non-volatile memory element 470) according to the fourth exemplary embodiment of the present invention. FIG. 30 is a schematic cross section view of the magnetic element 480 and the variable-resistance-type non-volatile memory element R0 (variable-resistance-type non-volatile memory element 470).

The magnetic element 480 according to the present exemplary embodiment is a magnetic domain wall moving element which includes a record layer 481, a first fixation layer 482, a second fixation layer 483, a first terminal T1 and a second terminal T2.

The variable-resistance-type non-volatile memory element R0 is a MTJ (Magnetic Tunnel Junction) element which includes a sense layer 471, a tunnel barrier layer 472, a reference layer 473, a third terminal T3 and a fourth terminal T4. Here, in FIG. 29 and FIG. 30, the variable-resistance-type non-volatile memory element R0 is the variable-resistance-type non-volatile memory element 470.

Here, in FIG. 29, a +Z direction is defined as a direction vertical to this sheet, that is, a direction from a rear surface of this sheet toward a front surface. Then, each of a X direction and a Y direction is vertical to the Z direction. Furthermore, the X direction is defined as a direction of a long side of the element, and the Y direction is defined as a direction which is vertical to the X direction and the Z direction. Moreover, an arrow shown in the drawing indicates a magnetization direction of each magnetic layer.

The record layer 481 is a ferromagnetic material. More specifically, the record layer 481 is formed by a perpendicular magnetization film which has the perpendicular magnetic anisotropy. It is desirable that a material of the record layer 481 includes at least one which is selected out of Iron (Fe), Cobalt (Co) and Nickel (Ni). As the record layer 481, a thin film, which has the perpendicular magnetic anisotropy, such as a Co/Ni laminated film, a Co/Pd laminated film, a Co/Pt laminated film, a Co—Cr—Pt alloy, Co—Fe—B alloy or the like, is used.

Each of the first fixation layer 482 and the second fixation layer 483 is formed by a ferromagnetic material. More specifically, each of the first fixation layer 482 and the second fixation layer 483 is formed by a perpendicular magnetization film which has the perpendicular magnetic anisotropy. A material of each of the first fixation layer 482 and the second fixation film 483 is the same as one of the record layer 481. Here, magnetization of the first fixation layer 482 and magnetization of the second fixation film 483 are fixed, and are not changed by the data writing operation and the data reading operation.

The sense layer 471 is formed by a ferromagnetic material. More specifically, the sense layer 471 is formed by an in-plane magnetic film which has the in-plane magnetic anisotropy. It is desirable that a material of the sense layer 471 includes at least one which is selected out of Fe, Co and Ni. As the sense layer 471, a thin film, which has the in-plane magnetic anisotropy, such as a Ni—Fe alloy, a Co—Fe—B alloy, a Co—Fe alloy or the like is used. A magnetization direction of the sense layer 471 can be changed to either a +Y direction or a -Y direction.

The reference layer 473 is formed by a ferromagnetic material. More specifically, the reference layer 473 is formed by an in-plane magnetic film which has the in-plane magnetic anisotropy. A material of the reference layer 473 is the same as one of the sense layer 471. Here, magnetization of the reference layer 473 is fixed, and is not changed by the data writing operation and the data reading operation. Therefore, for example, an antiferromagnetic layer (not shown in the drawing) may be laminated on the reference layer 473. Moreover, the reference layer 473 may be a laminated film which includes a ferromagnetic layer, a non-magnetic layer and a ferromagnetic layer. Magnetization of one ferromagnetic layer, and magnetization of the other ferromagnetic layer of the laminated film may be set so as to be antiparallel each other.

The tunnel barrier layer 472 is a non-magnetic layer. The tunnel barrier layer 472 is formed by an insulation film, and it is preferable to use Mg—O, Al—O, Ni—O or Hf—O as a material of the tunnel barrier layer 472. The tunnel barrier layer 472 is interposed between the sense layer 471 and the reference layer 473. The sense layer 471, the tunnel barrier layer 472 and the reference layer 473 form MTJ (Magnetic Tunnel Junction). As a material of the tunnel barrier layer 472, a non-magnetic semiconductor or a non-magnetic metal material is formed.

A magnetic domain wall can move inside the record layer 481. As shown in FIG. 30, the record layer 481 includes a first fixation area 484, a second fixation area 485 and an inversion area 486.

In the first fixation area 484, magnetization is held in the +Z direction by the first fixation layer 482, and is not changed by the data writing operation and the data reading operation. In the second fixation area 485, magnetization is held in the -Z direction by the second fixation layer 483, and is not changed by the data writing operation and the data reading operation. The inversion area 486 is arranged between the first fixation area 484 and the second fixation area 485, and a magnetization direction in the inversion area 486 can be changed to either a +Z direction or a -Z direction.

The first terminal T1 is a current terminal which is connected with the first fixation area 484 (first fixation layer 482), and is connected with the NMOS transistor N3. The second terminal T2 is a current terminal which is connected with the second fixation area 485 (second fixation layer 483), and is connected with the NMOS transistor N2. The third terminal T3 is a current terminal which is connected with the sense layer 471, and is connected with the charge/discharge circuit 450. The fourth terminal T4 is a current terminal which is connected with the reference layer 473, and is connected with the NMOS transistor N0.

(Magnetization State in the Case of Data '0' and '1')

Figure 31:
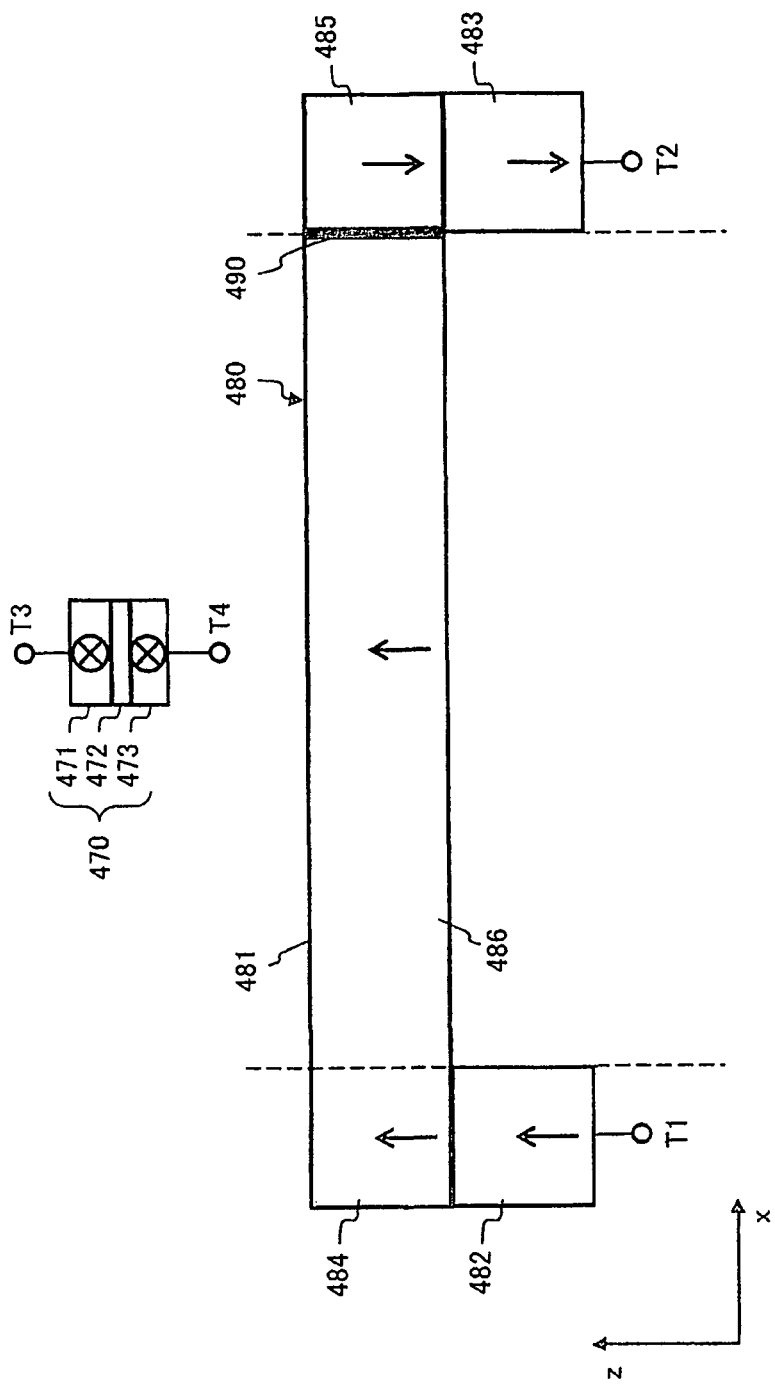
FIG. 31 is a diagram showing a magnetization state to which a magnetic domain wall moving element transits in the case of a data '1' according to the fourth exemplary embodiment of the present invention.
Figure 32:
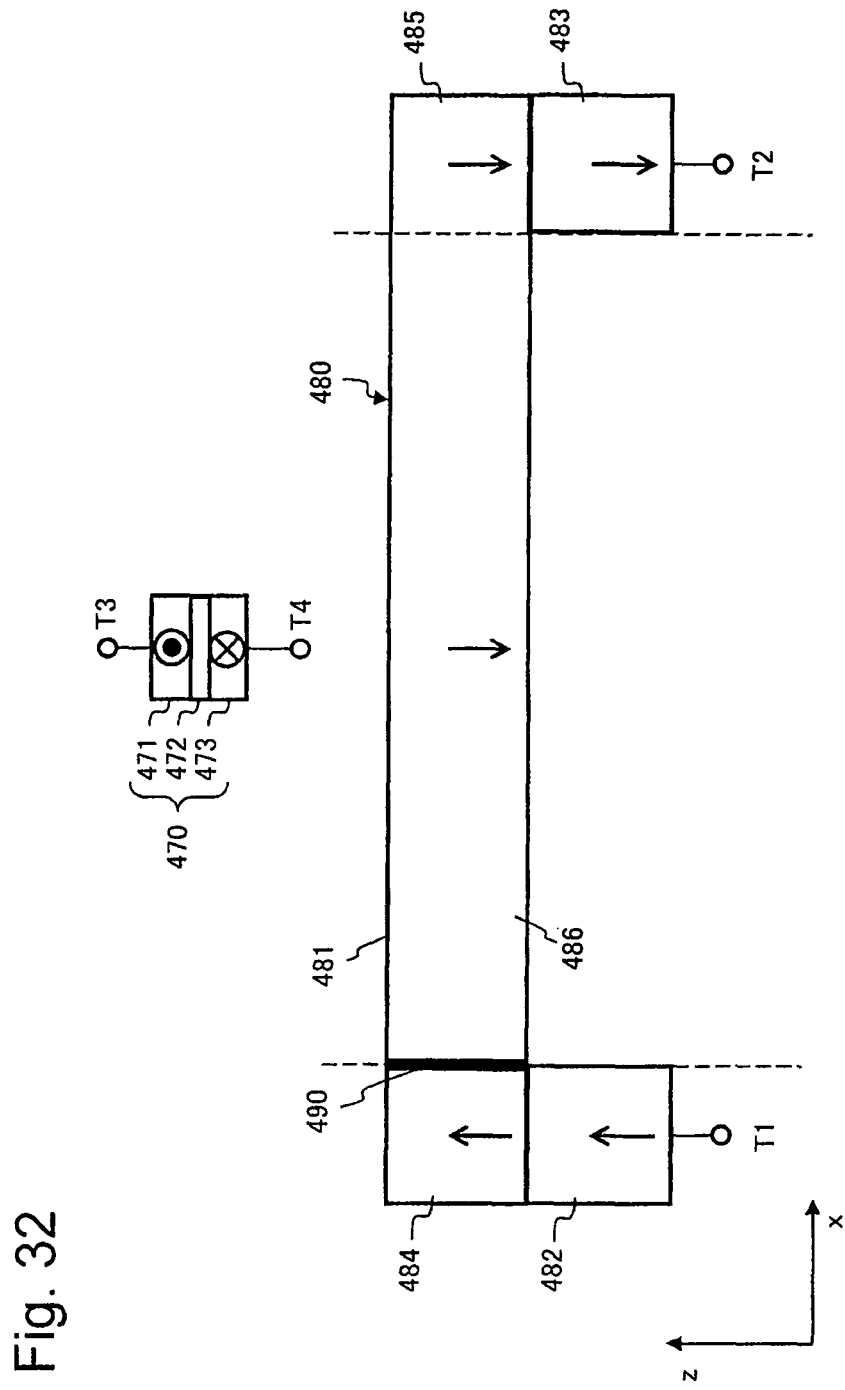
FIG. 32 is a diagram showing a magnetization state to which the magnetic domain wall moving element transits in the case of a data '0' according to the fourth exemplary embodiment of the present invention.

FIG. 31 shown a first magnetization state out of two magnetization states into which a magnetic domain wall moving element according to the present exemplary embodiment can enter, and FIG. 32 shows a second magnetization state out of the two magnetization states.

The first magnetization state is corresponding to one out of the stored data '0' and the stored data '1' and the second magnetization state is corresponding to the other. For example, it is assumed that a magnetization direction of the first fixation area 484 is held in the +Z direction, and a magnetization direction of the second fixation area 485 is held in the −Z direction, and a magnetization direction of the reference layer 473 is fixed to the +Y direction.

In the case that a magnetization direction of the inversion area 486 is the +Z direction as shown in FIG. 31, a magnetic domain wall 490 is formed in a neighborhood of a boundary between the inversion area 486 and the second fixation area 485. A leaked magnetic field from the inversion area 486 has a component, whose magnetization direction is the +Y direction, at a position of the sense layer 471, and a magnetization direction of the sense layer 471 turns to the +Y direction according to the direction of the leaked magnetic field. In this case, the magnetization direction of the sense layer 471 and the magnetization direction of the reference layer 473 are parallel, and a resistance value of the variable-resistance-type non-volatile memory element R0 becomes low (low resistance state). Here, the low resistance state of the variable-resistance-type non-volatile memory element R0 is corresponding to the data '1'.

In the case that the magnetization direction of the inversion area 486 is the −Z direction as shown in FIG. 32, the magnetic domain wall 490 is formed in a neighborhood of a boundary between the inversion area 486 and the first fixation area 484. The leaked magnetic field from the inversion area 486 has a component, whose magnetization direction is the −Y direction, at the position of the sense layer 471, and the magnetization direction of the sense layer 471 turns to the −Y direction according to the direction of the leaked magnetic field. In this case, the magnetization direction of the sense layer 471 and the magnetization direction of the reference layer 473 are antiparallel, and the resistance value of the variable-resistance-type non-volatile memory element R0 becomes high (high resistance state). Here, the high resistance state of the variable-resistance-type non-volatile memory element R0 is corresponding to the data '0'.

(Data Writing Operation)

Next, a data writing operation in a magnetic domain wall moving element according to the present exemplary embodiment will be explained.

To rewrite the stored data is carried out by moving the magnetic domain wall 490 to invert the magnetization direction of the inversion area 486. To move the magnetic domain wall, a data writing current is provided in an in-plane direction of the record layer 481. The magnetic domain wall 490 is moved in the record layer according to a flowing direction of a conductive electron which carries the data writing current.

For example, it is assumed that the magnetization direction of the first fixation area 484 is held in the +Z direction, and the magnetization direction of the second fixation area 485 is held in the −Z direction. At a time of rewriting, the data writing current, whose value is larger than a threshold current value that is required for moving the magnetic domain wall 490 in the inversion area 486 according to 'current-driven magnetic movement', is provided.

At a time of rewriting data from the data '0' to the data '1', the data writing current flows from the second terminal T2 to the first terminal T1 through the record layer 481. In this case, a spin-polarized electron is injected from the first fixation area 484 to the inversion area 486. The spin of the injected electron drives the magnetic domain wall 490, which exists in the boundary between the first fixation area 484 and the inversion area 486, toward the second fixation area 485. As a result, it is possible to write the data '1' just as intended.

At a time of rewriting data from the data '1' to the data '0', the data writing current flows from the first terminal T1 to the second terminal i'2 through the record layer 481. In this case, a spin-polarized electron is injected from the second fixation area 485 to the inversion area 486. The spin of the injected electron drives the magnetic domain wall 490, which exists in the boundary between the second fixation area 485 and the inversion area 486, toward the first fixation area 484. As a result, it is possible to write the data '0' just as intended.

Since a logical calculation of the content addressable memory 40 in the fourth exemplary embodiment of the present invention is the same as one in the second exemplary embodiment, explanation on the logical calculation is omitted.

The data writing operation in the variable resistance element of the content addressable memory cell 400 according to the fourth exemplary embodiment of the present invention will be explained in the following with reference to FIG. 27 and FIG. 28.

When writing a data into the content addressable memory 4 in the present exemplary embodiment, each match line MLin, each match line MLout, each pair of search lines SL and /SL, each pair of bit lines WBL and /WBL, and each word line WL are set so as to have the Low level.

Next, the word line WL connected with the selected cell into which data should be written is set so as to have the High level.

Furthermore, the pair of writing bit lines WBL and /WBL, which is connected with the selected cell, is driven according to the data which should be written.

In order to write a data '1', the writing bit line WBL and the writing bit line /WBL which forms a pair with the writing bit line WBL are set so as to have the High level and the Low level respectively. A data writing current flows from WBL to /WBL through the transistor N2, the magnetic element 480 and the transistor N3 of the selected cell. At this time, the variable-resistance-type non-volatile memory element R0 of the selected cell enters into the low resistance state RL.

In order to write a data '0', the writing bit line WBL and the writing bit line /WBL which forms a pair with the writing bit line WBL are set so as to have the Low level and the High level respectively. The data writing current flows from /WBL to WBL through the transistor N3, the magnetic element 480 and the transistor N2 of the selected cell. At this time, the variable-resistance-type non-volatile memory element R0 of the selected cell enters into the high resistance state RH.

According to the content addressable memory 400 of the present exemplary embodiment, it is possible to physically separate the path through which the sense current flows at the time of calculating the data, and the path through which the data writing current flows at the time of writing the data. Accordingly, it is possible to set the resistance value of the variable-resistance-type non-volatile memory element R0 so as to be suitable for calculating the data, and to set a resistance value of the magnetic element 480 so as to be suitable for writing the data. As the resistance value of the variable-resistance-type non-volatile memory element R0 becomes large, a time interval between adjacent distributions of timing, at which the level of the match line ML shown in FIG. 27 is changed to the High level, becomes long, and consequently it is possible to reduce number of cases of causing erroneous detection. Moreover, as the resistance value of the magnetic element 480 becomes low, a data writing voltage, which is necessary to write the data, can be lowered, and consequently it is desirable that the magnetic element 480 has the low resistance value from a view point of electric power consumption.

As mentioned above, according to the fourth exemplary embodiment of the present invention, it is possible to physically separate the path through which the sense current flows at the time of calculating the data, and the path through which the data writing current flows at the time of writing the data. Therefore, it is possible to realize reduction of number of the cases of causing the erroneous detection, and reduction of the consumed electric power.

(Modification)

Next, a modification of the content addressable memory 4 according to the fourth exemplary embodiment will be explained.

Figure 33:
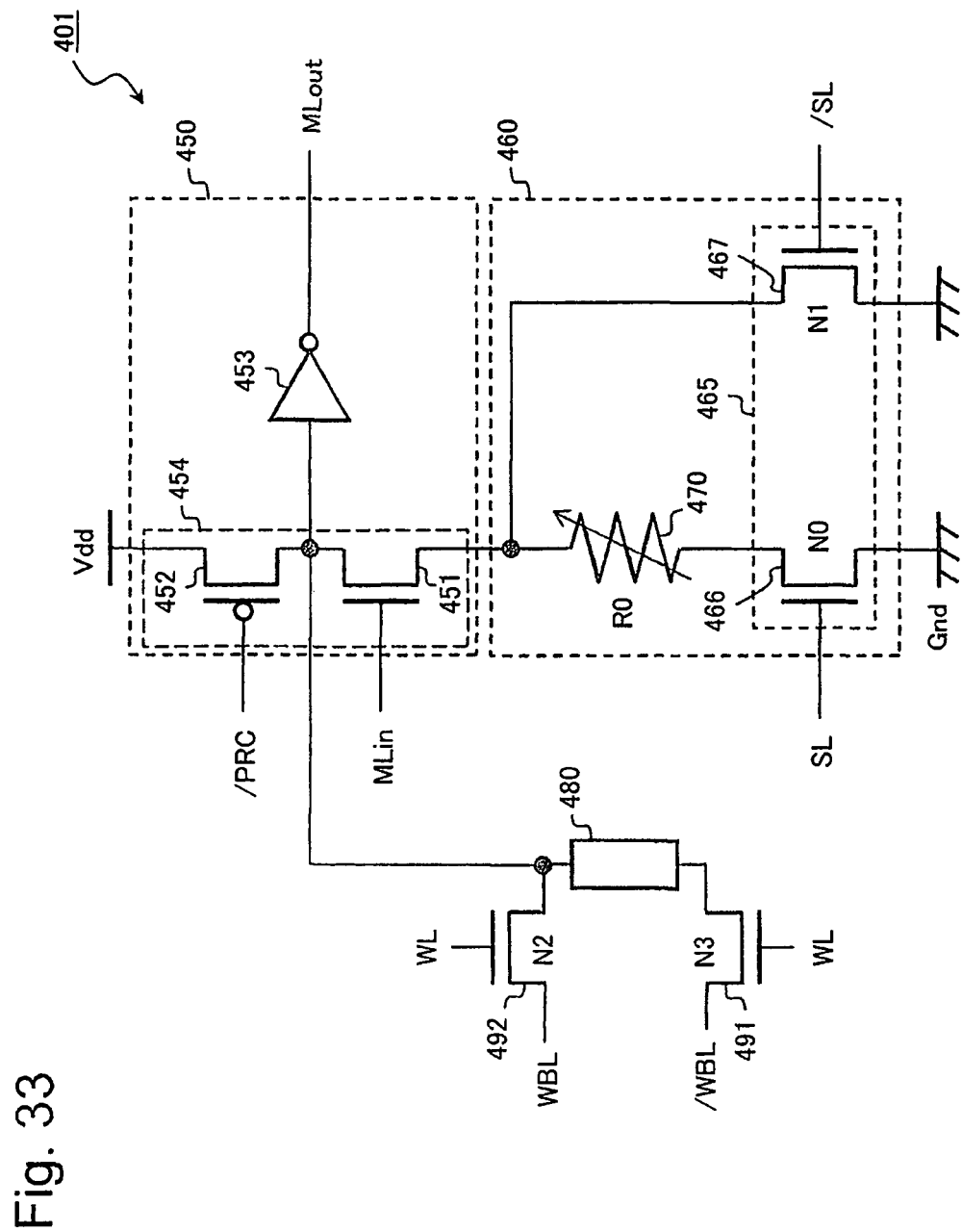
FIG. 33 is a circuit diagram of a content addressable memory cell of a modification according to the fourth exemplary embodiment of the present invention.

A content addressable memory cell 401 of the modification has circuit composition shown in FIG. 33. The content addressable memory cell 401 is different from the content addressable memory cell 400 shown in FIG. 28 only in a point that the transistor N2 and the one end of the magnetic element 480 are connected with the charge/discharge circuit 450. Therefore, a code in FIG. 33 is the same as the code in FIG. 28. Here, explanation which overlaps is omitted appropriately.

In addition to the composition of the content addressable memory 40, the content addressable memory cell 401 of the modification has composition that a node, which is connected with the transistor N2 and the magnetic element 480, is connected with the drain of the PMOS transistor 452 and the drain of the NMOS transistor 451 of the charge/discharge circuit 450. According to the modification, the charge/discharge circuit 450 can use stray capacities of the transistor N2 and the transistor N3 as a capacity which accumulates a charge.

The delay time depends on not only the resistance value of the variable-resistance-type non-volatile memory element R0 but also the capacity which accumulates the charge. If it is possible to use the stray capacity of the data writing transistor as a design parameter when setting the delay time, it is possible to widen flexibility of design without having an excessive area. For example, as the capacity becomes large, the time interval between the adjacent distributions of timing, at which the level of the match line ML shown in FIG. 27 is changed to the High level, becomes long, and consequently it is possible to reduce number of cases of causing the sense circuit 43 the erroneous detection.

As mentioned above, according to the fourth exemplary embodiment of the present invention, the charge/discharge circuit can use the stray capacity of the data writing transistor as the capacity which accumulates the charge, and it is possible to reduce number of cases of causing the sense circuit the erroneous detection.

Fifth Exemplary Embodiment

Figure 34:
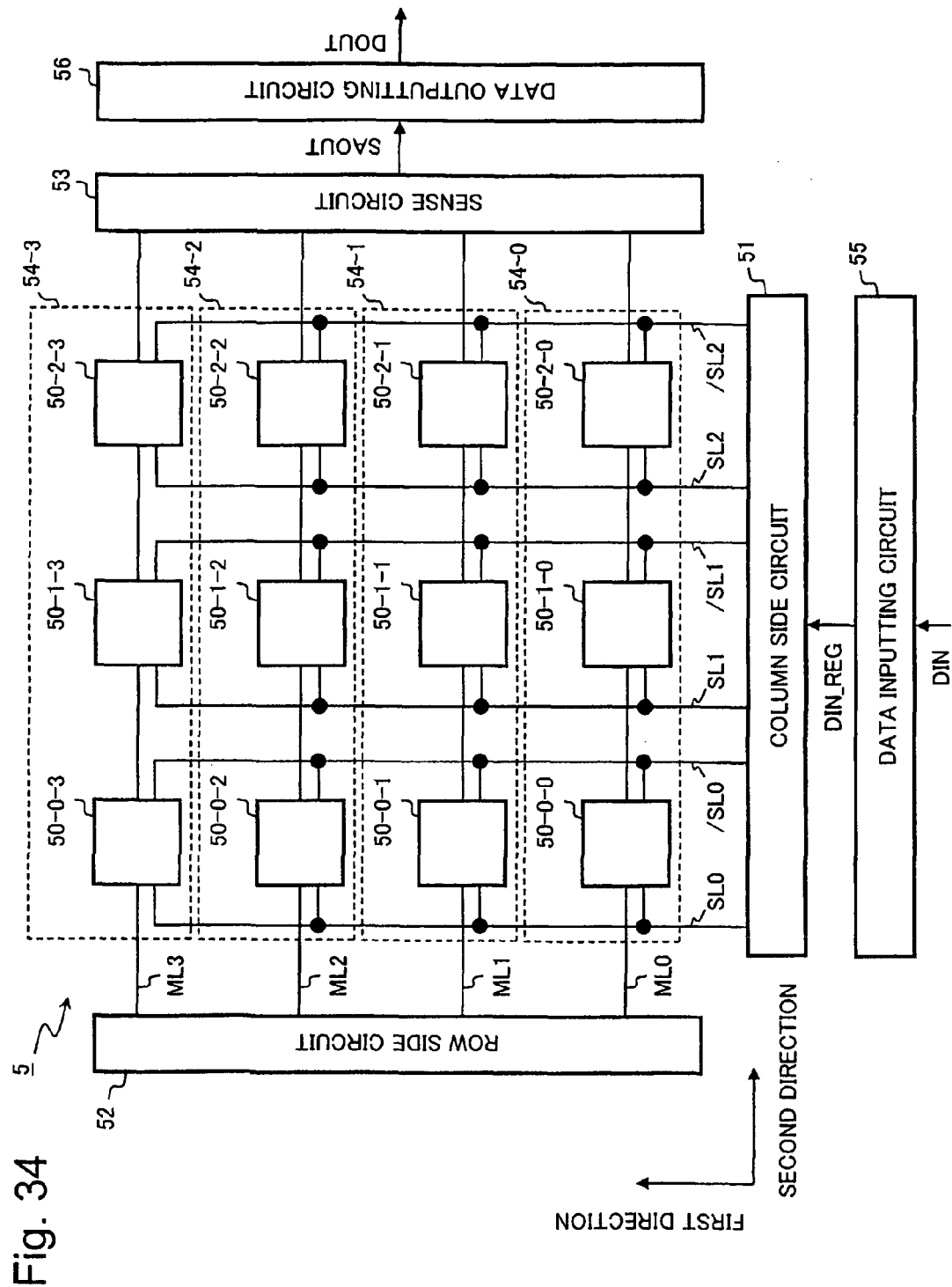
FIG. 34 is a block diagram showing schematic composition of a content addressable memory according to a fifth exemplary embodiment of the present invention.

FIG. 34 is a block diagram showing schematic composition of a content addressable memory 5 according to a fifth exemplary embodiment of the present invention. Here, explanation which overlaps with the explanation of the first exemplary embodiment is omitted appropriately.

The content addressable memory 5 includes a plurality of content addressable memory cells 50 which are arranged in a form of a two-dimensional matrix, and the plural content addressable memory cells 50 which are arranged in the second direction compose a word circuit 54. Here, in FIG. 34, in order to distinguish the plural content addressable memory cells 50 and the plural word circuits 54, an end of a code, which is assigned to each component, includes a column number and a row number. In the case that the distinction is unnecessary, the end number of the code is omitted.

Moreover, the content addressable memory 5 includes a plurality of pairs of search lines SL and /SL, and a plurality of match lines ML. Each pair of search lines SL and /SL are commonly connected with the content addressable memory cells 50 which are arranged in the first direction, and each match line ML connects the content addressable memory cells 50, which are arranged in the second direction, in series.

Furthermore, the content addressable memory 5 includes a column side circuit 51, a row side circuit 52, a sense circuit 53, a data inputting circuit 55 and a data outputting circuit 56. The column side circuit 51 is connected with the plural pairs of search lines SL and /SL, and drives the pair of search lines SL and /SL according to an input data at a time of calculation. The row side circuit 52 is connected with the plural match lines ML, and drives the match line ML. The sense circuit 53 is connected with the plural match lines ML, and senses potential of the match line ML.

Furthermore, the data inputting circuit 55 and the data outputting circuit 56 are arranged so as to extend in the second direction and in the first direction respectively. Then, the data inputting circuit 55 and the data outputting circuit 56 are arranged so as to be vertical each other in substance. The data inputting circuit 55 inputs a plurality of input data DIN in parallel or in series.

The data inputting circuit 55 holds the input data DIN. The data inputting circuit 55 outputs a plurality of input data DIN_REG to the column side circuit 51.

The data outputting circuit 56 inputs a sense result SAOUT, which is provided by the sense circuit 53, in parallel. The data outputting circuit 56 outputs a data output DOUT to the outside of the content addressable memory 5 in parallel or in series on the basis of the SAOUT data.

Figure 35:
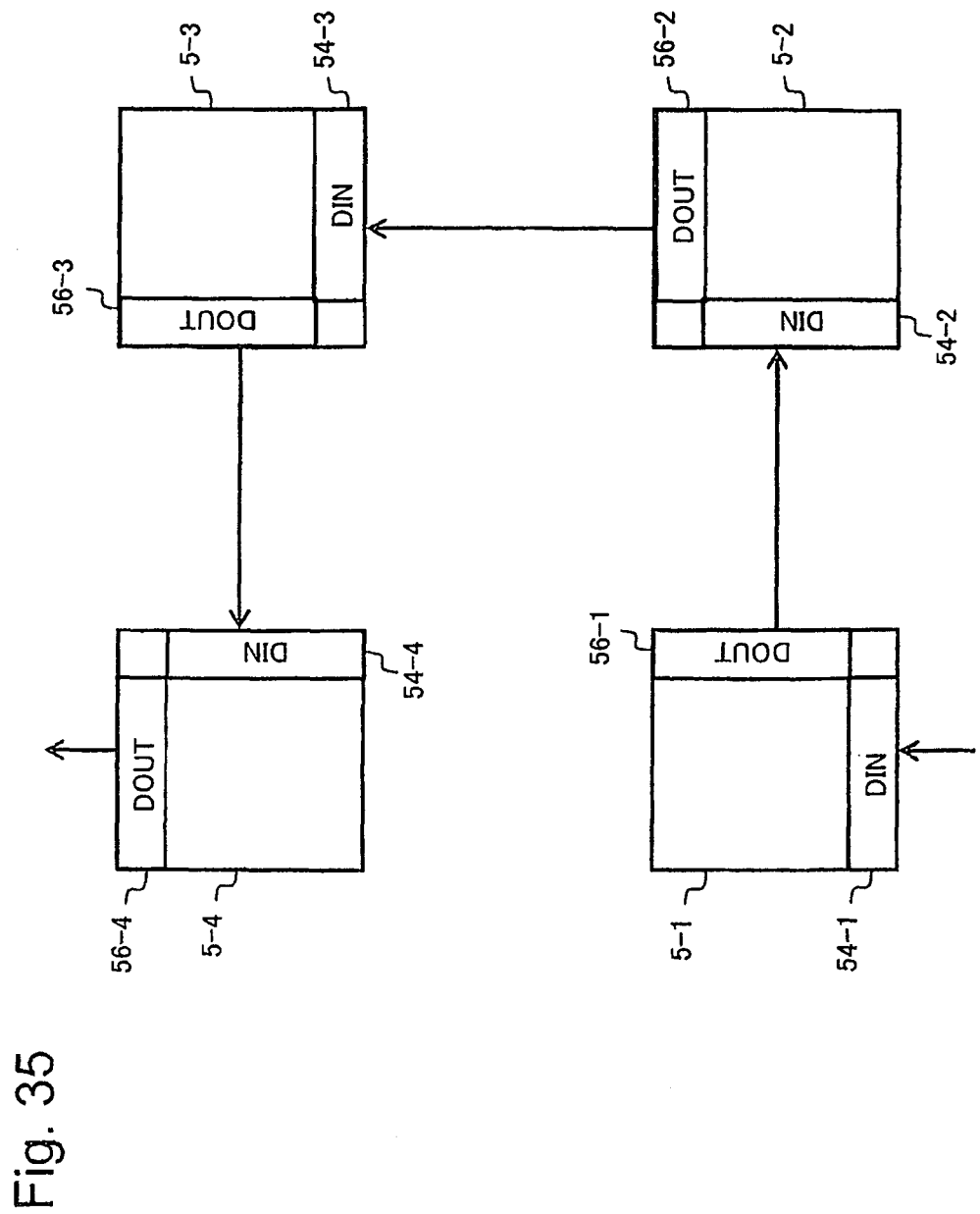
FIG. 35 is a circuit diagram of a logic circuit which includes the plural content addressable memories according to the fifth exemplary embodiment of the present invention.

FIG. 35 shows a logic circuit which includes the plural content addressable memories 5 in the fifth exemplary embodiment of the present invention. In FIG. 35, the four content addressable memories 5 (5-1 to 5-4) are connected in series. Specifically, the data outputting circuit 56 of the content addressable memory which exists at a front position, and the data inputting circuit 55 of the content addressable memory which exists at a rear position are arranged so as to be physically parallel each other, and an output of the outputting circuit 56 of the content addressable memory 5, which exists at the front position, is inputted into the data inputting circuit 55 of the content addressable memory 5 which exists at the rear position That is, a long side of the data outputting circuit 56 of the content addressable memory 5, which exists at the front position, out of the content addressable memories 5 adjacent each other, and a long side of the data inputting circuit 55 of the content addressable memory 5 which exists at the rear position are arranged so as to be opposite and close each other.

Accordingly, all of or a part of input/output data can be easily transferred between the content addressable memories 5 adjacent each other, and it is possible to realize widening a bus width. Moreover, it is possible to realize the pipe line process, whose one stage is one content addressable memory 5, with ease.

As mentioned above, according to the fifth exemplary embodiment, it is possible to connect the content addressable memories in series, and to realize widening the bus width. Moreover, it is possible to realize the pipe line process, whose one stage is one content addressable memory, with ease.

(Modification)

Next, a modification of the logic circuit which includes the content addressable memory 5 according to the fifth exemplary embodiment will be shown.

Figure 36:
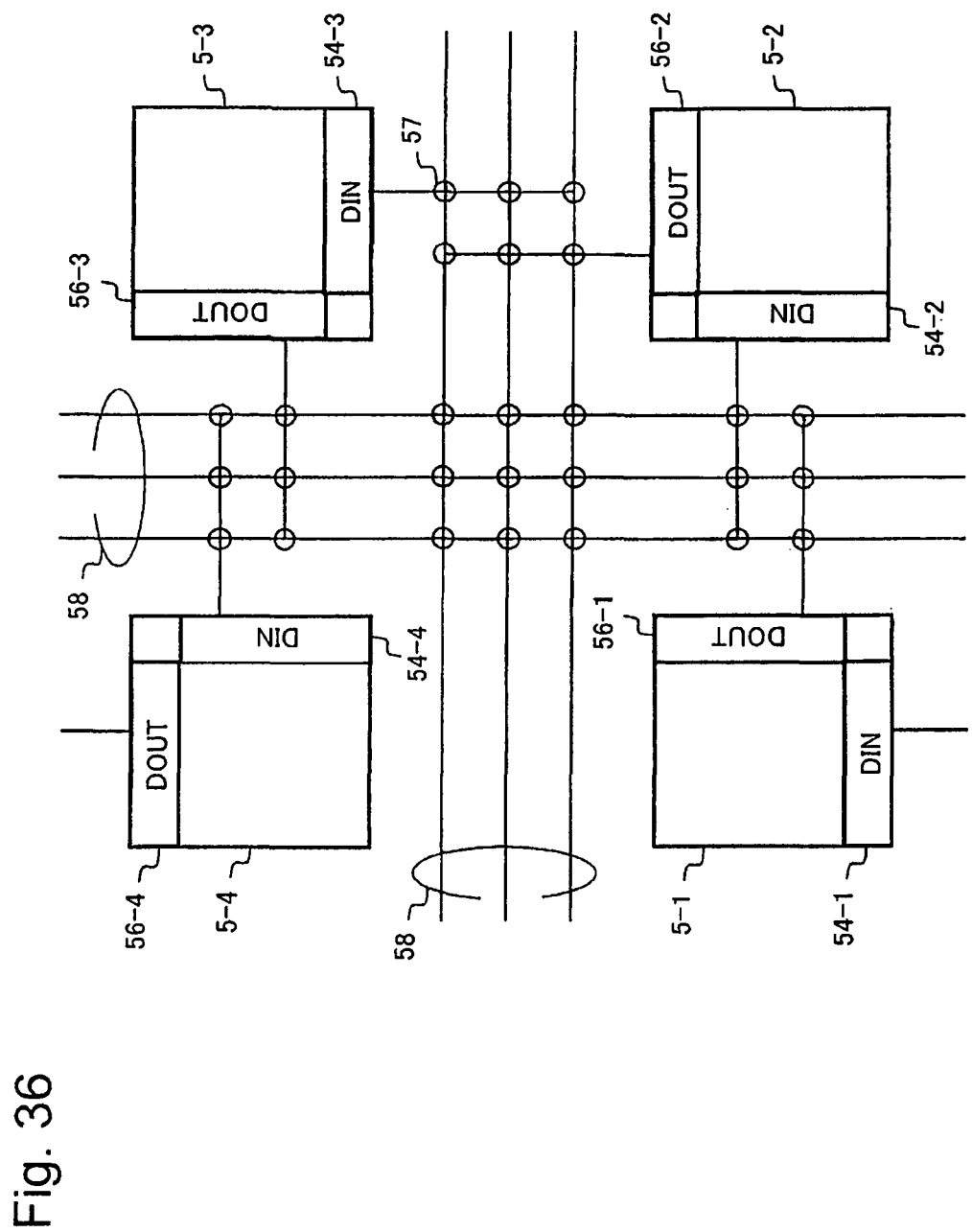
FIG. 36 is a circuit diagram of a logic circuit which includes a plurality of content addressable memories in a modification according to the fifth exemplary embodiment of the present invention.

FIG. 36 shows a logic circuit which includes the plural content addressable memories 5 in the fifth exemplary embodiment of the present invention. In FIG. 36, the four content addressable memories 5 (5-1 to 5-4) are connected with wirings 58 through a programmable switch 57. Here, the logic circuit shown in FIG. 36 includes a plurality of programmable switches, and each of the plural programmable switches has a collective code (57).

As the programmable switch 57, a SRAM-based switch, which is used in FPGA (Field Programmable Gate Array), may be used. Or, a CBRAM (Conductive Bridging Random Access Memory) element which is the variable-resistance-type non-volatile memory element, or the like may be used.

Differently from the logic circuit shown in FIG. 3, the logic circuit in FIG. 36, which includes the plural content addressable memories 5, exchanges data through the programmable switch 57 and the wiring 58. Therefore, in the case of the logic circuit shown in FIG. 36, it is possible to exchange data between the content addressable memories 5, which are not adjacent each other, and to improve generality furthermore, while the logic circuit has a limitation in a data bit width.

As mentioned above, according to the logic circuit of the modification of the fifth exemplary embodiment of the present invention, it is possible to exchange data between the content addressable memories 5 which are not adjacent each other and to improve generality furthermore.

Sixth Exemplary Embodiment

Figure 37:
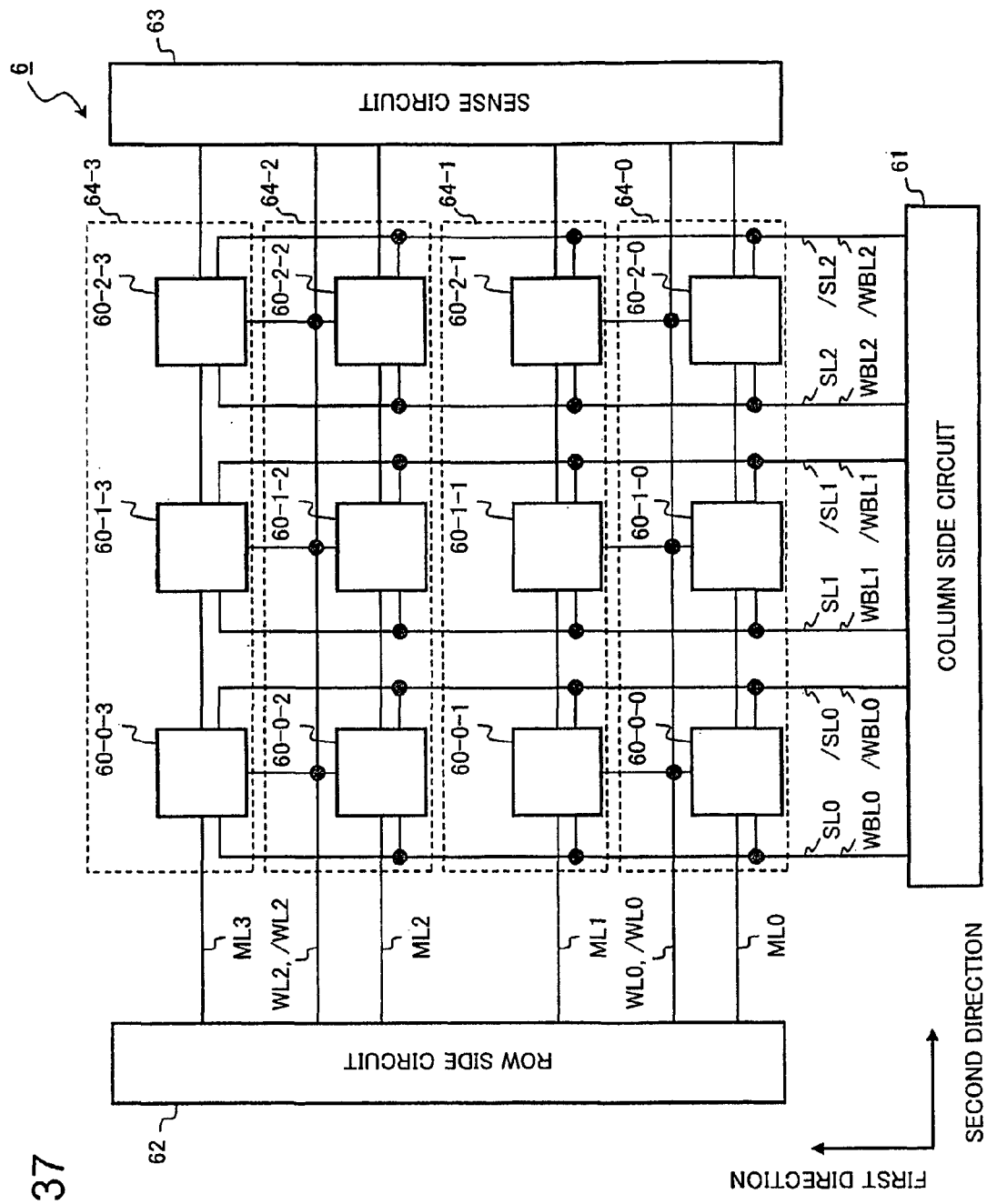
FIG. 37 is a block diagram showing schematic composition of a content addressable memory according to a sixth exemplary embodiment of the present invention.

FIG. 37 is a block diagram showing schematic composition of a content addressable memory 6 according to a sixth exemplary embodiment of the present invention. Here, explanation which overlaps with the explanations of the first to the fifth exemplary embodiments is omitted appropriately.

The content addressable memory 6 includes a plurality of content addressable memory cells 60 which are arranged in a form of a two-dimensional matrix, and the plural content addressable memory cells 60 which are arranged in the second direction compose a word circuit 64. Moreover, two cell circuits, which are adjacent each other in the first direction, compose a three-level cell circuit. The three-level cell can be in three states of '−1', '0' and '1'. Details of FIG. 37 will be explained when FIG. 38 will be explained later. Here, in FIG. 37, in order to distinguish the plural content addressable memory cells 60 and the plural word circuits 64, an end of a code, which is assigned to each component, includes a column number and a row number. In the case that the distinction is unnecessary, the end number of the code is omitted.

Moreover, the content addressable memory 6 includes a plurality of pairs of search lines SL and /SL, a plurality of writing bit lines WBL and /WBL, and a plurality of match lines ML, and a plurality of word lines WL.

Each pair of search lines SL and /SL, each writing bit line WBL and each writing bit line /WBL are commonly connected with the content addressable memory cells 60 which are arranged in the first direction. Each match line ML connects the content addressable memory cells 40, which are arranged in the second direction, in series. Each word line WL is commonly connected with the content addressable memory cells which are arranged in the second direction. Each word line WL is connected with the content addressable memory cells 60 of two rows. Here, in FIG. 37, in order to distinguish the plural wirings, an end of a code, which is assigned to each wiring, includes a column number and a row number. In the case that the distinction is unnecessary, the end number of the code is omitted.

Furthermore, the content addressable memory 6 includes a column side circuit 61, a row side circuit 62 and a sense circuit 63. The column side circuit 61 is connected with the plural pairs of search lines SL and /SL, and drives the pair of search lines SL and /SL according to an input data at a time of calculation. Furthermore, the column side circuit 61 is connected with the plural pairs of writing bit lines WBL and /WBL, and drives the pair of writing bit lines WBL and /WBL according to a writing data, which should be written, at a time of writing a data. The row side circuit 62 is connected with the plural match lines ML and the plural word lines WL, and drives the match line ML and the word line WL. The sense circuit 63 is connected with the plural match lines ML, and senses potential of the match line ML.

(Content Addressable Memory Cell)

The content addressable memory 6 in the sixth exemplary embodiment of the present invention has the same composition as the content addressable memory 1 according to the second exemplary embodiment shown in FIG. 22 has. As shown in FIG. 22, the sense circuit 27 of the present exemplary embodiment includes the comparison circuit 270. Here, details of the sense circuit 27 of the present exemplary embodiment have been described in the modification 1 according to the second exemplary embodiment.

Figure 38:
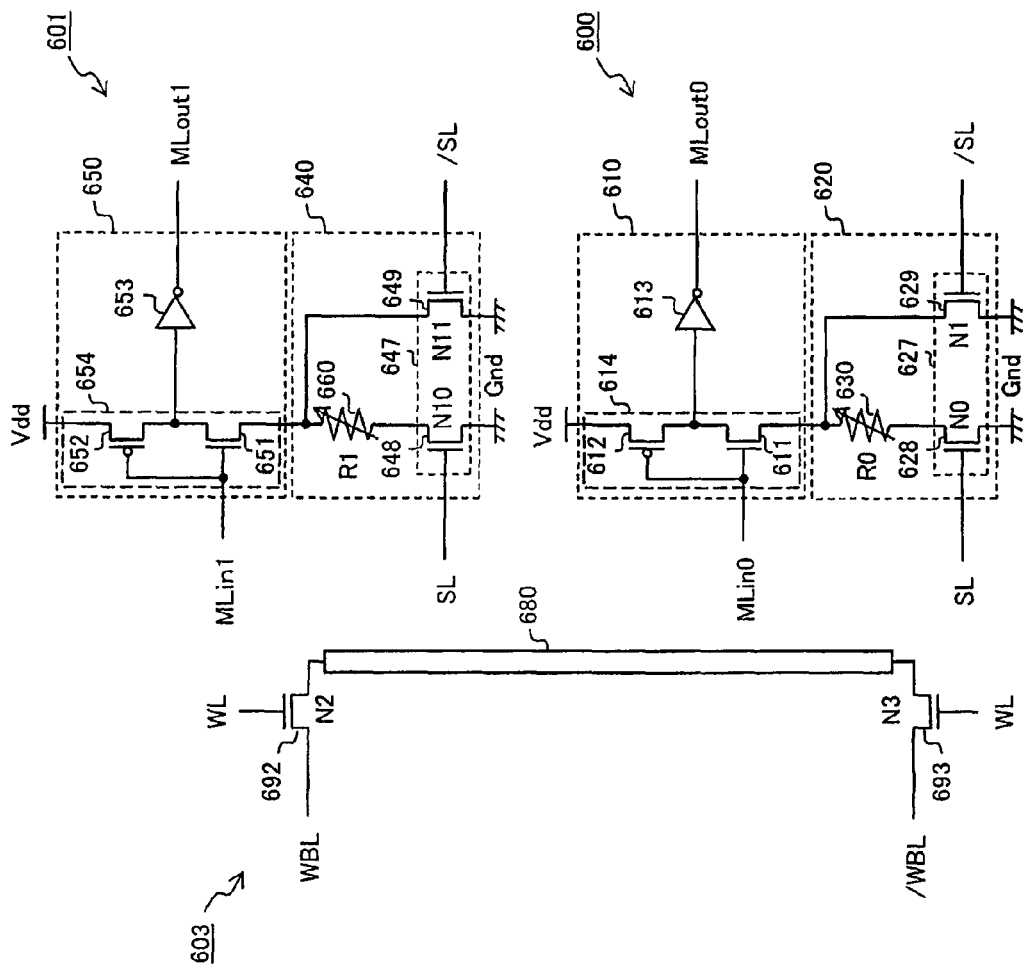
FIG. 38 is a circuit diagram of a three-level cell circuit according to the sixth exemplary embodiment of the present invention.

FIG. 38 is a circuit diagram showing the three-level cell circuit in the sixth exemplary embodiment. The three-level circuit, which has the above-mentioned circuit composition, can reflect an inner product of the stored data and the input data in a delay time of the word circuit 64. The three-level circuit includes a content addressable memory cell 600 and a content addressable memory 601.

The content addressable memory cell 600 includes a charge/discharge circuit 610, a resistance network 620 and a magnetic element section.

The charge/discharge circuit 610 of the content addressable memory cell 600 includes a NMOS transistor 611, a PMOS transistor 612 and an inverter 613. The NMOS transistor 611 and the PMOS transistor 612 form a CMOS inverter 614.

A match line input terminal MLin 0 is connected with a gate of the NMOS transistor 611 and a gate of the PMOS transistor 612, and an input terminal of the inverter 613 is connected with a drain of the PMOS transistor 612, and a drain of the NMOS transistor. An output terminal of the inverter 613 is connected with a match line output terminal MLout 0. A source of the PMOS transistor 612 is connected with an electric power source voltage Vdd, and a source of the NMOS transistor 611 is connected with one end of the variable-resistance-type non-volatile memory element R0 of the resistance network 620.

The resistance network 620 of the content addressable memory cell 600 includes the variable-resistance-type non-volatile memory element R0, and a NMOS logic circuit 629 having a NMOS transistor N0 and a NMOS transistor N1. Here, in FIG. 38, the variable-resistance-type non-volatile memory element R0 is a variable-resistance-type non-volatile memory element 630, and the NMOS transistor N0 is a NMOS transistor 628, and the NMOS transistor N1 is a NMOS transistor 627.

The one end of the variable-resistance-type non-volatile memory element R0 is connected with the source of the NMOS transistor 611 of the charge/discharge circuit 610 and a drain of the NMOS transistor N1, and the other end is connected with a drain of the NMOS transistor N0. A gate of the NMOS transistor N0 is connected with the search line SL, and a drain is connected with the other end of the variable-resistance-type non-volatile memory element R0, and a source is grounded. A drain of the NMOS transistor N1 is connected with the source of the NMOS transistor 611 of the charge/discharge circuit 610, and the one end of the variable-resistance-type non-volatile memory element R0, and a gate is connected with the search line /SL which forms a pair with the search line SL, and a source is grounded.

The content addressable memory cell 601 includes a charge/discharge circuit 650, a resistance network 660 and the magnetic element section. Here, the magnetic element section is shared by the content addressable memory cell 600 and the content addressable memory cell 601.

The charge/discharge circuit 650 of the content addressable memory cell 601 includes a NMOS transistor 651, a PMOS transistor 652 and an inverter 653. The NMOS transistor 651 and the PMOS transistor 652 form a CMOS inverter 654.

A match line input terminal MLin 1 is connected with a gate of the NMOS transistor 651 and a gate of the PMOS transistor 652, and an input terminal of the inverter 653 is connected with a drain of the PMOS transistor 652, and a drain of the NMOS transistor 651. An output terminal of the inverter 653 is connected with a match line output terminal MLout 1. A source of the PMOS transistor 652 is connected with an electric power source voltage Vdd, and a source of the NMOS transistor 651 is connected with one end of a variable-resistance-type non-volatile memory element R1 of the resistance network 640.

The resistance network 640 of the content addressable memory cell 601 includes the variable-resistance-type non-volatile memory element R1, and a NMOS logic circuit 647 having a NMOS transistor N10 and a NMOS transistor N11. Here, in FIG. 38, the variable-resistance-type non-volatile memory element R1 is a variable-resistance-type non-volatile memory element 660, and the NMOS transistor N10 is a NMOS transistor 648, and the NMOS transistor N11 is a NMOS transistor 649.

The one end of the variable-resistance-type non-volatile memory element R1 is connected with the source of the NMOS transistor 651 of the charge/discharge circuit 610 and a drain of the NMOS transistor N11, and the other end is connected with a drain of the NMOS transistor N10. A gate of the NMOS transistor N10 is connected with the search line SL, and a drain is connected with the other end of the variable-resistance-type non-volatile memory element R1, and a source is grounded. A drain of NMOS transistor N11 is connected with the source of the NMOS transistor 651 of the charge/discharge circuit 650, and the one end of the variable-resistance-type non-volatile memory element R1, and a gate is connected with the search line /SL which forms a pair with the search line SL, and a source is grounded.

Moreover, the magnetic element section includes a NMOS transistor N2 (NMOS transistor 692), a NMOS transistor N3 (NMOS transistor 693) and a magnetic element 680.

A gate of the NMOS transistor N2 is connected with the word line WL, and one out of a drain and a source is connected with the writing bit line WBL, and the other out of the drain and the source is connected with the magnetic element 680. A gate of the NMOS transistor N3 is connected with the word line WL, and one out of a drain and a source is connected with the writing bit line /WBL which forms a pair with the writing bit line WBL, and the other out of the drain and the source is connected with the magnetic element 680.

Figure 39:
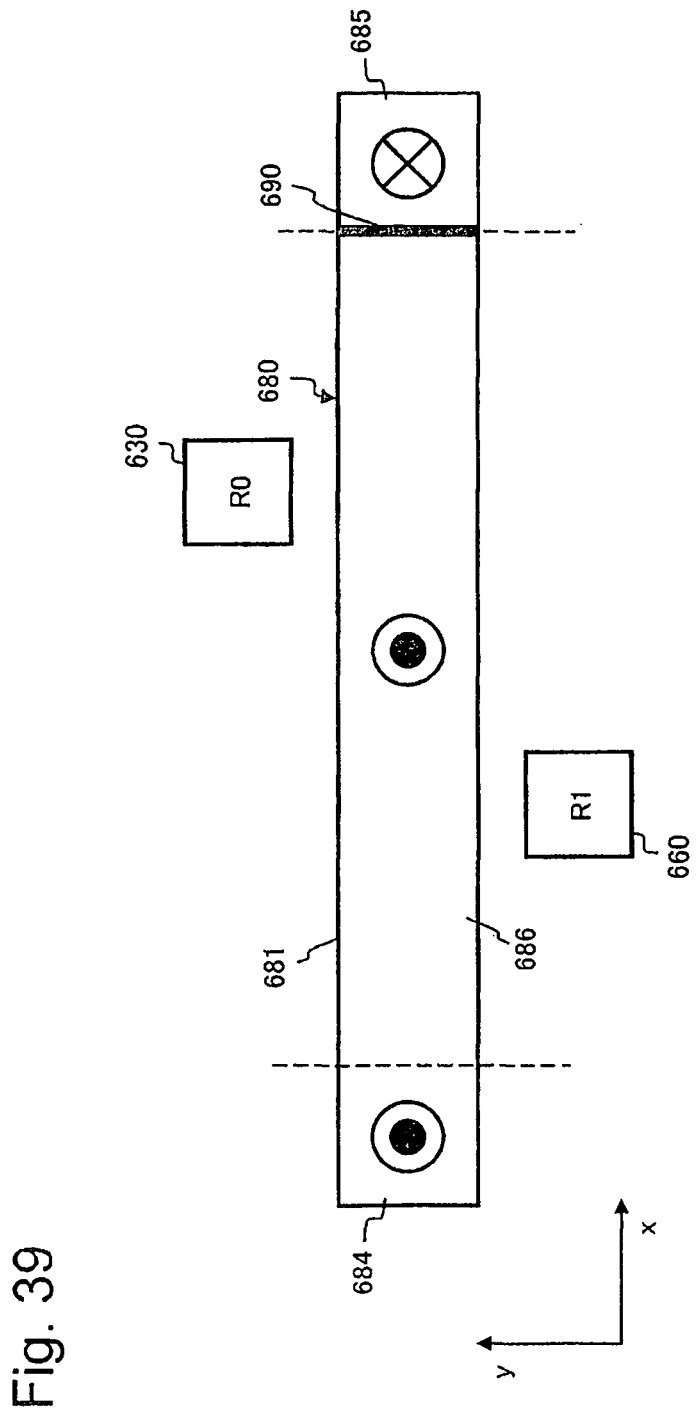
FIG. 39 is a schematic plan view of a magnetic element and a variable-resistance-type non-volatile memory element according to the sixth exemplary embodiment of the present invention.
Figure 40:
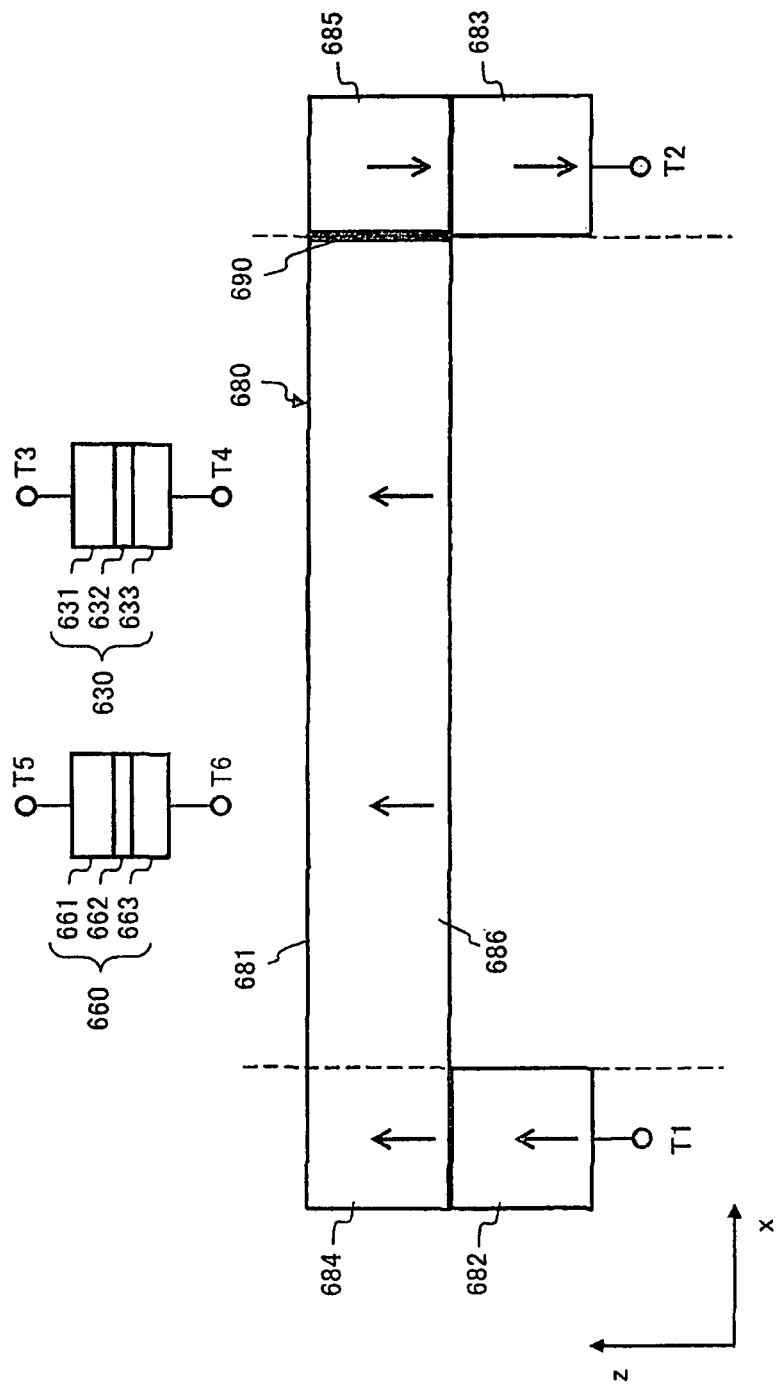
FIG. 40 is a schematic cross section view of the magnetic element and the variable-resistance-type non-volatile memory element according to the sixth exemplary embodiment of the present invention.

FIG. 39 is a schematic plan view of the magnetic element 680, the variable-resistance-type non-volatile memory element R0 and the variable-resistance-type non-volatile memory element R1 according to the sixth exemplary embodiment of the present invention, and FIG. 40 is a schematic cross section view of the magnetic element 680, the variable-resistance-type non-volatile memory element R0 and the variable-resistance-type non-volatile memory element R1. Here, in FIG. 39 and FIG. 40, the variable-resistance-type non-volatile memory element R0 is the variable-resistance-type non-volatile memory element 630, and the variable-resistance-type non-volatile memory element R1 is the variable-resistance-type non-volatile memory element 660.

The magnetic element 680 according to the present exemplary embodiment is a magnetic domain wall moving element which includes a record layer 681, a first fixation layer 682, a second fixation layer 683, a first terminal T1 and a second terminal T2.

The variable-resistance-type non-volatile memory element R0 is a MTJ (Magnetic Tunnel Junction) element which includes a sense layer 631, a tunnel barrier layer 632, a reference layer 633, a third terminal T3 and a fourth terminal T4. The variable-resistance-type non-volatile memory element R1 is a MTJ (Magnetic Tunnel Junction) element which includes a sense layer 661, a tunnel barrier layer 662, a reference layer 663, a fifth terminal T5 and a sixth terminal T6.

Here, a +Z direction is defined as a direction vertical to a substrate, that is, as a direction from a rear surface of the substrate toward a front surface. Then, a X direction and a Y direction are defined as directions vertical to the Z direction respectively, that is, as horizontal directions. Furthermore, the X direction is defined as a direction of a long side of the element, and the Y direction is defined as a direction which is vertical to the X direction and the Z direction. Moreover, an arrow shown in the drawing indicates a magnetization direction of each magnetic layer.

The record layer 681 is a ferromagnetic material. More specifically, the record layer 681 is formed by a perpendicular magnetization film which has the perpendicular magnetic anisotropy. It is desirable that a material of the record layer

681 includes at least one which is selected out of Iron (Fe), Cobalt (Co) and Nickel (Ni). As the record layer 681, a thin film, which has the perpendicular magnetic anisotropy, such as a Co/Ni laminated film, a Co/Pd laminated film, a Co/Pt laminated film, a Co—Cr—Pt alloy, a Co—Fe—B alloy or the like, is used.

The first fixation layer 682 and the second fixation layer 683 are formed by a ferromagnetic material. More specifically, the first fixation layer 682 and the second fixation layer 683 are formed by a perpendicular magnetization film which has the perpendicular magnetic anisotropy. A material of the first fixation layer 682 and the second fixation film 683 is the same as one of the record layer 681. Here, magnetization of the first fixation layer 682 and magnetization of the second fixation film 683 are fixed, and are not changed by the data writing operation and the data reading operation.

The sense layer 631 and the sense layer 661 are formed by a ferromagnetic material. More specifically, the sense layer 631 and the sense layer 661 are formed by an in-plane magnetic film which has the in-plane magnetic anisotropy. It is desirable that each material of the sense layer 631 and the sense layer 661 includes at least one which is selected out of Fe, Co and Ni. As the sense layer 631 and the sense layer 661, a thin film, which has the in-plane magnetic anisotropy, such as a Ni—Fe alloy, a Co—Fe—B alloy, a Co—Fe alloy or the like is used. A magnetization direction of each of the sense layer 631 and the sense layer 661 can be changed to either a +Y direction or a −Y direction.

The reference layer 633 and the reference layer 663 are formed by a ferromagnetic material. More specifically, the reference layer 633 and the reference layer 663 are formed by an in-plane magnetic film which has the in-plane magnetic anisotropy. Each material of the reference layer 633 and the reference layer 663 is the same as the material of each of the sense layer 631 and the sense layer 661. Here, magnetization of the reference layer 633 and magnetization of the reference layer 663 are fixed, and are not changed by the data writing operation and the data reading operation. Therefore, for example, an antiferromagnetic layer (not shown in the drawing) may be laminated on the reference layer 633 and the reference layer 663. Moreover, the reference layer 633 and the reference layer 663 may be a laminated film which includes a ferromagnetic layer, a non-magnetic layer and a ferromagnetic layer. Magnetization of one ferromagnetic layer, and magnetization of the other ferromagnetic layer of the laminated film may be set so as to be antiparallel.

Each of the tunnel barrier layer 632 and the tunnel barrier layer 662 is a non-magnetic layer. The tunnel barrier layer 632 and the tunnel barrier layer 662 are formed by an insulation film, and it is preferable to use Mg—O, Al—O, Ni—O, Hf—O or the like as a material of each of the tunnel barrier layer 632 and the tunnel barrier layer 662. The tunnel barrier layer 632 is interposed between the sense layer 631 and the reference layer 633, and the tunnel barrier layer 662 is interposed between the sense layer 661 and the reference layer 663. The sense layer 631, the tunnel barrier layer 632 and the reference layer 633 form MTJ (Magnetic Tunnel Junction), and the sense layer 661, the tunnel barrier layer 662 and the reference layer 663 form another MTJ. As a material of each of the tunnel barrier layer 632 and the tunnel barrier layer 662, a non-magnetic semiconductor or a non-magnetic metal material is formed.

A magnetic domain wall can move inside the record layer 681. As shown in FIG. 40, the record layer 681 includes a first fixation area 684, a second fixation area 685 and an inversion area 686.

In the first fixation area 684, magnetization is held in the +Z direction by the first fixation layer 682, and is not changed by the data writing operation and the data reading operation. In the second fixation area 685, magnetization is held in the −Z direction by the second fixation layer 683, and is not changed by the data writing operation and the data reading operation. The inversion area 686 is arranged between the first fixation area 684 and the second fixation area 685, and a magnetization direction in the inversion area 686 can be changed to either the +Z direction or the −Z direction.

The first terminal T1 is a current terminal which is connected with the first fixation area 684 (first fixation layer 682), and is connected with the NMOS transistor N2. The second terminal T2 is a current terminal which is connected with the second fixation area 685 (second fixation layer 683), and is connected with the NMOS transistor N3. The third terminal T3 is a current terminal which is connected with the sense layer 631, and is connected with the charge/discharge circuit 610 of the content addressable memory cell 600. The fourth terminal T4 is a current terminal which is connected with the reference layer 633, and is connected with the NMOS transistor N0. The fifth terminal T5 is a current terminal which is connected with the sense layer 631, and is connected with the charge/discharge circuit 650 of the content addressable memory cell 601. The fourth terminal T6 is a current terminal which is connected with the reference layer 663, and is connected with the NMOS transistor N10.

(Magnetization State in the Cases of Data '−1', '0' and '1')

Figure 41:
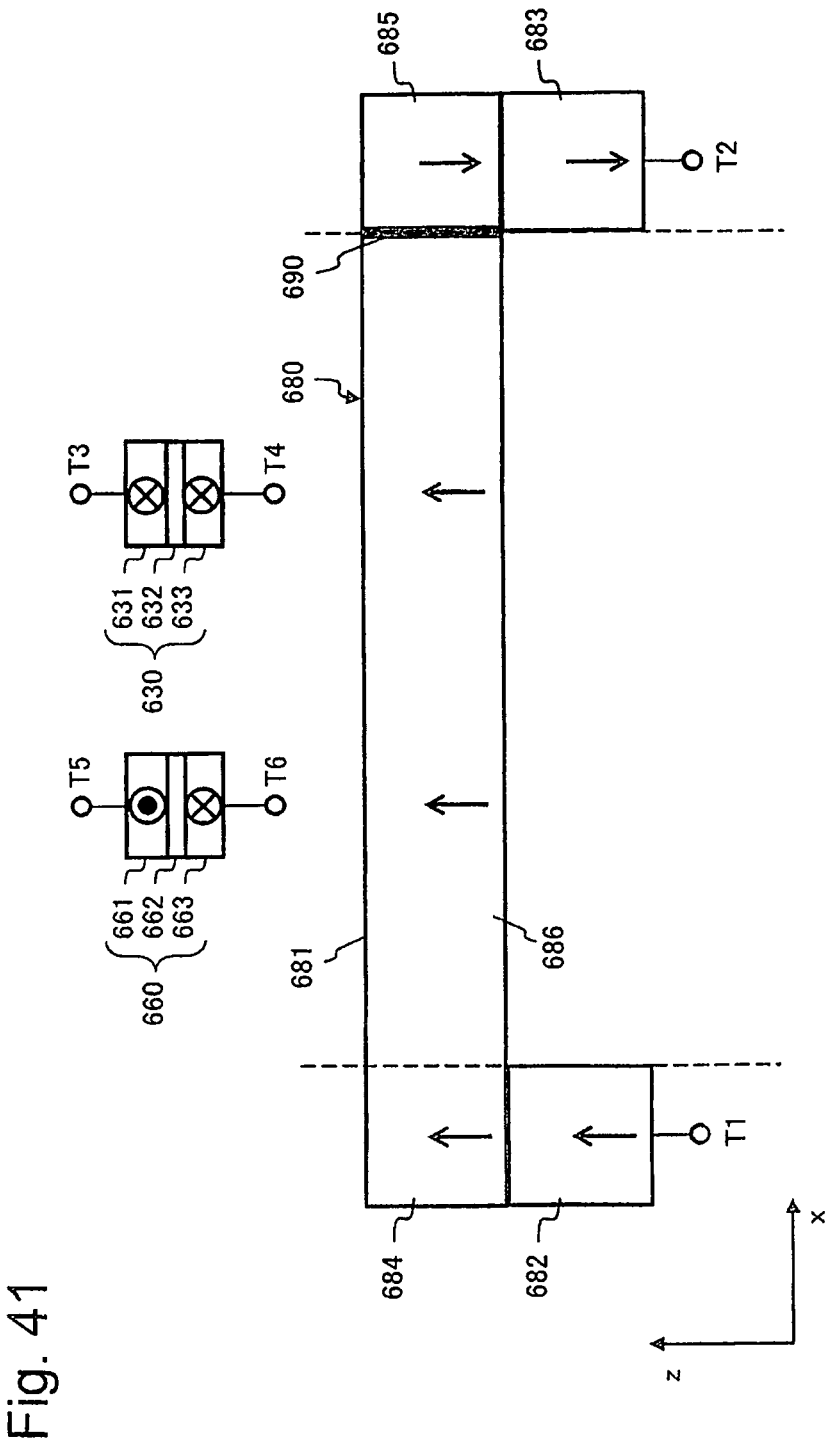
FIG. 41 is a diagram showing a magnetization state to which a magnetic domain wall moving element transits in the case of a data '−1' according to the sixth exemplary embodiment of the present invention.
Figure 42:
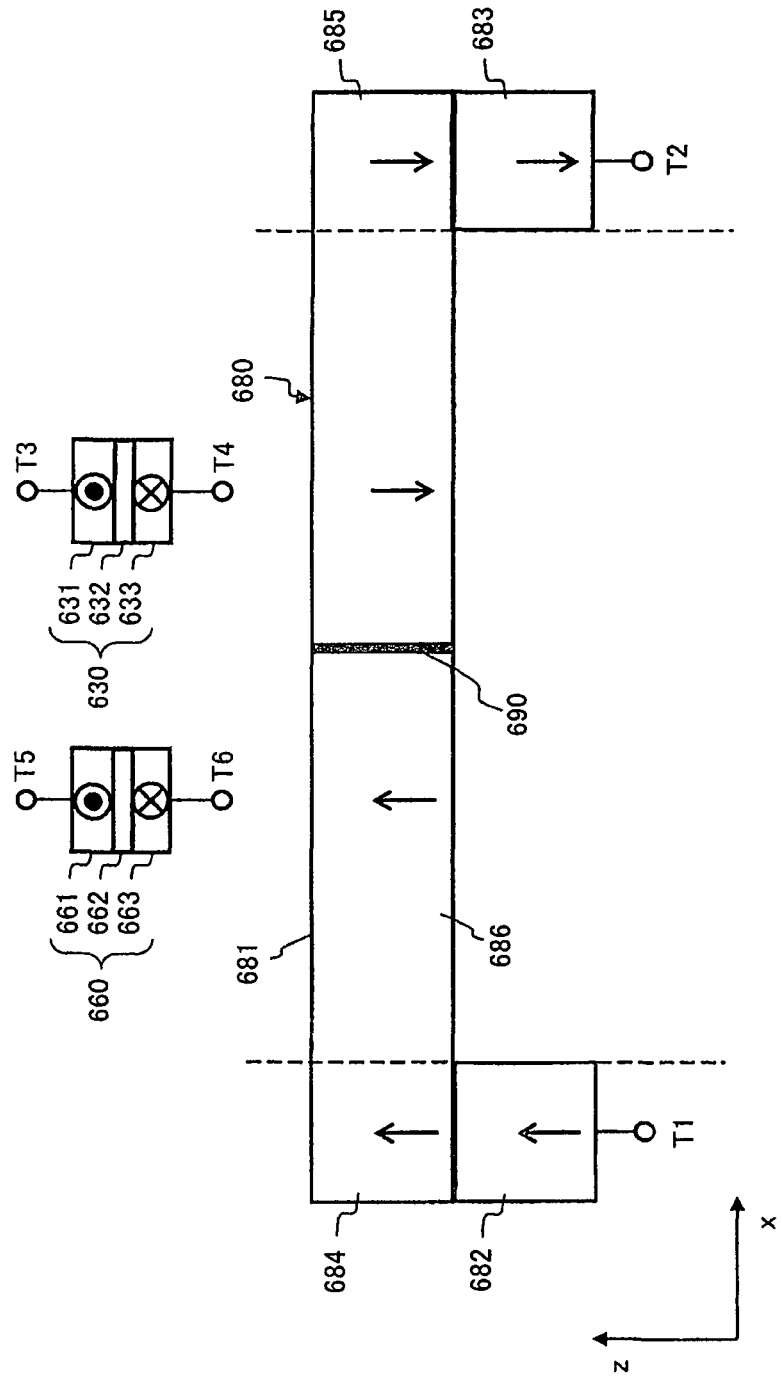
FIG. 42 is a diagram showing a magnetization state to which the magnetic domain wall moving element transits in the case of a data '0' according to the sixth exemplary embodiment of the present invention.
Figure 43:
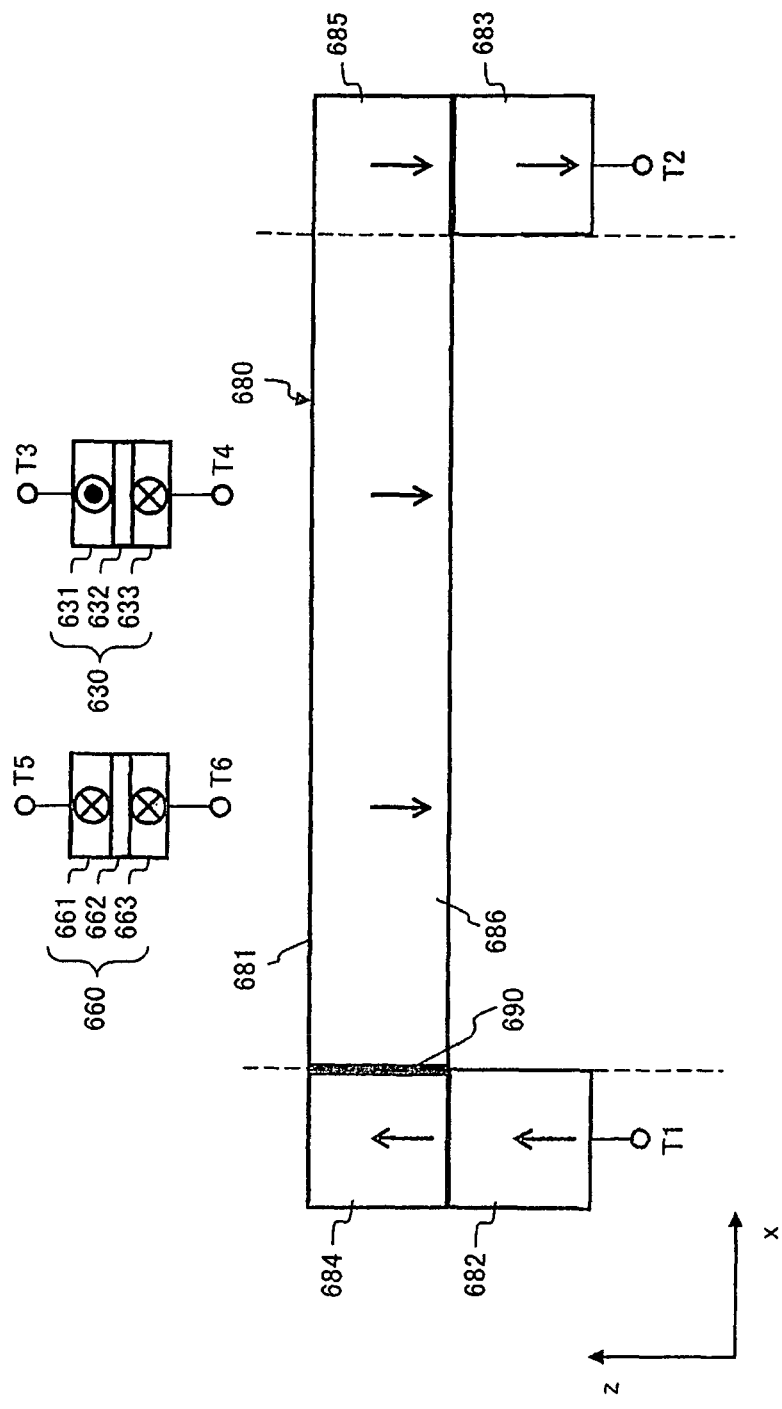
FIG. 43 is a diagram showing a magnetization state to which the magnetic domain wall moving element transits in the case of a data '1' according to the sixth exemplary embodiment of the present invention.

FIG. 41 shows a first magnetization state out of three magnetization states into which the magnetic domain wall moving element according to the present exemplary embodiment can enter, and FIG. 42 shows a second magnetization state, and FIG. 43 shows a third magnetization state. The first magnetization state is corresponding to the stored data '−1' and the second magnetization state is corresponding to the stored data '0', and the third magnetization state is corresponding to the stored data '1' For example, it is assumed that a magnetization direction of the first fixation area 684 is held in the +Z direction, and a magnetization direction of the second fixation area 685 is held in the −Z direction, and each of magnetization directions of the reference layer 633 and the reference layer 663 is fixed to the +Y direction. FIG. 44 shows a relation among the variable-resistance-type non-volatile memory element R0, the variable-resistance-type non-volatile memory element R1 and the stored data.

In the case that the magnetization direction of the inversion area 686 layer is the +Z direction, a magnetic domain wall 690 is formed in a neighborhood of a boundary between the inversion area 686 and the second fixation area 685 as shown in FIG. 41. A leaked magnetic field from the inversion area 686 has a component, whose magnetization direction is the +Y direction, at a position of the sense layer 631 of R0, and the magnetization direction of the sense layer 631 turns to the +Y direction according to the direction of the leaked magnetic field. In this case, the magnetization directions of the sense layer 631 and the reference layer 633 of the variable-resistance-type non-volatile memory element R0 are parallel each other, and a resistance value of MTJ becomes low (low resistance state). The leaked magnetic field from the inversion area 686 has a component, whose magnetization direction is the −Y direction, at a position of the sense layer of the variable-resistance-type non-volatile memory element R1, and the magnetization direction of the sense layer turns to the −Y direction according to the direction of the leaked magnetic field. In this case, the magnetization directions of the sense layer 661 and the reference layer 663 of the variable-resistance-type non-volatile memory element R1 are antiparallel each other, and a resistance value of MTJ becomes high (high resistance state). Here, the above-mentioned state is corresponding to the data '−1'.

In the case that the magnetization direction of the inversion area 686, which exists on a first fixation area 684 side, is the +Z direction, and the magnetization direction of the inversion area 686, which exists on a second fixation area 685 side, is the −Z direction, the magnetic domain wall 690 is formed in a neighborhood of a center of the inversion area 686 as shown in FIG. 42. The leaked magnetic field from the inversion area 686 has a component, whose magnetization direction is the −Y direction, at a position of the sense layer 631 of the variable-resistance-type non-volatile memory element R0, and the magnetization direction of the sense layer 631 turns to −Y direction according to the direction of the leaked magnetic field. In this case, the magnetization directions of the sense layer 631 and the reference layer 633 of the variable-resistance-type non-volatile memory element R0 are antiparallel each other, and the resistance value of MTJ becomes high (high resistance state). The leaked magnetic field from the inversion area 686 has a component, whose magnetization direction is the −Y direction, at the position of the sense layer 661 of the variable-resistance-type non-volatile memory element R1, and the magnetization direction of the sense layer 661 turns to the −Y direction according to the direction of the leaked magnetic field. In this case, the magnetization directions of the sense layer 661 and the reference layer 663 are antiparallel each other, and the resistance value of MTJ becomes high (high resistance state). Here, the above-mentioned state is corresponding to the data '0'.

In the case that the magnetization direction of the inversion area 686 is the −Z direction, the magnetic domain wall 690 is formed in a neighborhood of a boundary between the inversion area 686 and the first fixation area 684 as shown in FIG. 43. The leaked magnetic field from the inversion area 686 has a component, whose magnetization direction is the −Y direction, at the position of the sense layer 631 of R0, and the magnetization direction of the sense layer 631 turns to −Y direction according to the direction of the leaked magnetic field. In this case, the magnetization directions of the sense layer 631 and the reference layer 633 of the variable-resistance-type non-volatile memory element R0 are antiparallel each other, and the resistance value of MTJ becomes high (high resistance state). The leaked magnetic field from the inversion area 686 has a component, whose magnetization direction is the +Y direction, at the position of the sense layer 661 of the variable-resistance-type non-volatile memory element R1, and the magnetization direction of the sense layer 661 turns to the +Y direction according to the direction of the leaked magnetic field. In this case, the magnetization directions of the sense layer 661 and the reference layer 663 of the variable-resistance-type non-volatile memory element R1 are parallel each other, and the resistance value of MTJ becomes low (low resistance state). Here, the above-mentioned state is corresponding to the data '1'.

(Data Writing Operation)

Next, a data writing operation in the magnetic domain wall moving element according to the present exemplary embodiment will be explained.

To rewrite the stored data is carried out by moving the magnetic domain wall 690 to invert the magnetization direction of the inversion area 686. To move the magnetic domain wall, a data writing current is provided in an in-plane direction of the record layer 681. The magnetic domain wall 690 is moved in the record layer according to a flowing direction of a conductive electron which carries the data writing current.

For example, it is assumed that the magnetization direction of the first fixation area 684 is held in the +Z direction, and the magnetization direction of the second fixation area 685 is held in the −Z direction. A notch or the like is formed in a neighbor of a center of the record area 681 so that the notch or the like may work as a trap site. At a time of rewriting, the data writing current, whose value is larger than a threshold current value that is required for moving the magnetic domain wall 690 in the inversion area 686 according to 'current-driven magnetic movement', is provided. Here, since it takes a time for the magnetic domain wall 690 to escape from the trap site which is arranged in the inversion area 686, it is possible to control the position of the magnetic domain wall 690 by a period of time for applying the current.

At a time of rewriting data from the data '−1' to the data '0', the data writing current flows from the terminal T1 to the second terminal T2 through the record layer 681. In this case, a spin-polarized electron is injected from the second fixation area 685 to the inversion area 686. The spin of the injected electron drives the magnetic domain wall 690, which exists in the boundary between the second fixation area 685 and the inversion area 686, to the center of the inversion area 686. At a period of time when the magnetic domain wall 690 is trapped in the trap site which is arranged at the center of the inversion area 686, the data writing current is stopped. As a result, it is possible to write the data '0' just as intended.

At a time of rewriting data from the data '0' to the data '1', the data writing current flows from the first terminal T1 to the second terminal T2 through the record layer 681. In this case, the spin-polarized electron is injected from the second fixation area 685 to the inversion area 686. The spin of the injected electron drives the magnetic domain wall 690, which exists at the center of the inversion area 686, toward the first fixation area 684. As a result, it is possible to write the data '1' just as intended.

At a time of rewriting data from the data '1' to the data '0', the data writing current flows from the second terminal T2 to the first terminal T1 through the record layer 681. In this case, the spin-polarized electron is injected from the first fixation area 684 to the inversion area 686. The spin of the injected electron drives the magnetic domain wall 690, which exists in the boundary between the first fixation area 684 and the inversion area 686, to a neighbor of the center of the inversion area 686. At the period of time when the magnetic domain wall 690 is trapped in the trap site which is arranged at the center of the inversion area 686, the data writing current is stopped. As a result, it is possible to write the data '0' just as intended.

At a time of rewriting data from the data '0' to the data '−1', the data writing current flows from the second terminal T2 to the first terminal T1 through the record layer 681. In this case, the spin-polarized electron is injected from the first fixation area 684 to the inversion area 686. The spin of the injected electron drives the magnetic domain wall 690, which exists in the neighbor of the center of the inversion area 686, toward the inversion area 686 and the second fixation area 685. As a result, it is possible to write the data '−1' just as intended.

As mentioned above, according to the logic circuit which includes the content addressable memory according to the sixth exemplary embodiment, by composing the three-level cell circuit so that the adjacent content addressable memory cells may commonly use the magnetic element, it is possible to make number of transistors, which flow the data writing current, half. Therefore, it is possible to make a chip cost cheap.

Here, while the content addressable memory in the present exemplary embodiment has been explained by exemplifying the three-level cell circuit, it is not always necessary that number of levels is three. A n-level cell circuit may be composed, where n is an odd integer which is equal to 3 or larger than 3.

As the sense circuit in the exemplary embodiment of the present invention, the data flip flop or the comparison circuit has been exemplified. A winner-take-all type sense circuit, which detects only a word circuit having the shortest delay time, may be used as the sense circuit.

Moreover, by using the content addressable memory cell circuit according to the exemplary embodiment of the present invention, a ring oscillator whose frequency depends on the resistance value of the variable-resistance-type non-volatile memory element or the like may be composed.

While the present invention has been explained with reference to the above-mentioned exemplary embodiment, the present invention is not limited to the exemplary embodiment. Various changes, which are within the scope of the present invention and can be understood by a person skilled in the art, can be made to the composition and details of the present invention.

A part of or all of the above-mentioned exemplary embodiment can be described like the following Supplementary note, but is not limited to the following Supplementary note.

(Supplementary Note 1)
A content addressable memory cell, comprising:
a resistance network which includes a plurality of current paths, a logic circuit that is connected with the plural current paths and a pair of search lines and selects the current path in response to input data provided through the pair of search lines, and a variable-resistance-type non-volatile memory element that is arranged on at least one current path out of the plural current paths and stores data and whose resistance value is changed according to a result of logical calculation based on the input data and the stored data; and
a charge/discharge circuit which is connected with the resistance network and a match line and whose delay time from inputting a signal through the match line until outputting the signal is changed according to the result of logical calculation based on the input data and the stored data.

(Supplementary Note 2)
The content addressable memory cell according to Supplementary note 1, characterized in that:
the charge/discharge circuit, comprising:
a CMOS inverter which includes a PMOS transistor whose source is connected with an end of an electrode, and a NMOS transistor whose drain is connected with a drain of the PMOS transistor and whose source is connected with one end of the variable-resistance-type non-volatile memory element; and
an inverter whose input terminal is connected with the drains of the PMOS transistor and the NMOS transistor;
when a signal is inputted into a gate of the PMOS transistor, the CMOS inverter is reset or preset according to the inputted signal; and
the CMOS inverter outputs a signal, which is inputted into a gate of the NMOS transistor, to the inverter which is at a rear position.

(Supplementary Note 3)
The content addressable memory cell according to Supplementary note 1, characterized in that:
the charge/discharge circuit, comprising:
a CMOS inverter that includes a PMOS transistor whose source is connected with an end of an electrode, and a NMOS transistor whose drain is connected with a drain of the PMOS transistor and whose source is connected with the one end of the variable-resistance-type non-volatile memory element; and
an inverter whose input terminal is connected with the drains of the PMOS transistor and the NMOS transistor;
when an inverted pre-charge signal is inputted into a gate of the PMOS transistor, the CMOS inverter is reset or preset according to the inputted pre-charge signal; and
the CMOS inverter outputs a signal, which is inputted into a gate of the NMOS transistor, to the inverter which is at a rear position.

(Supplementary Note 4)
The content addressable memory cell according to Supplementary note 2 or 3, characterized in that:
the logic circuit includes a first and a second NMOS transistors;
the variable-resistance-type non-volatile memory element includes a first and a second variable-resistance-type non-volatile memory elements;
one end of the first variable-resistance-type non-volatile memory element and one end of the second variable-resistance-type non-volatile memory element are connected with the source of the NMOS transistor of the charge/discharge circuit;
the other end of the first variable-resistance-type non-volatile memory element is connected with a drain of the first NMOS transistor, and the other end of the second variable-resistance-type non-volatile memory element is connected with a drain of the second NMOS transistor; and
sources of the first and the second NMOS transistors are grounded.

(Supplementary Note 5)
The content addressable memory cell according to Supplementary note 2 or 3, characterized in that:
the logic circuit includes a first and a second NMOS transistors;
the one end of the variable-resistance-type non-volatile memory element is connected with the source of the NMOS transistor of the charge/discharge circuit and a drain of the second NMOS transistor;
the other end of the variable-resistance-type non-volatile memory element is connected with a drain of the first NMOS transistor; and
sources of the first and the second NMOS transistors are grounded.

(Supplementary Note 6)
The content addressable memory cell according to Supplementary note 2 or 3, characterized in that:
the logic circuit includes a first and a second NMOS transistors;

the one end of the variable-resistance-type non-volatile memory element is connected with the source of the NMOS transistor of the charge/discharge circuit and a drain of the second NMOS transistor;

the other end of the variable-resistance-type non-volatile memory element is connected with a drain of the first NMOS transistor;

a source of the first NMOS transistor is connected with one word line which is included in a pair of word lines, and a source of the second NMOS transistor is connected with the other word line of the pair; and the stored data is read and written according to a change in a state of the pair of word lines.

(Supplementary Note 7)

The content addressable memory cell according to Supplementary note 5, comprising:

a magnetic element section which includes:

a magnetic element which is arranged at a position where magnetic coupling between the variable-resistance-type non-volatile memory element and the magnetic element can work;

a third NMOS transistor whose one terminal out of a source and a drain is connected with one end of the magnetic element and whose the other terminal out of the source and the drain is connected with a writing bit line and whose gate is connected with a word line; and a fourth NMOS transistor whose one terminal out of a source and a drain is connected with the other end of the magnetic element and whose the other terminal out of the source and the drain is connected with a writing bit line and whose gate is connected with a word line.

(Supplementary Note 8)

The content addressable memory cell according to Supplementary note 7, wherein the one end of the magnetic element is connected with the drains of the PMOS transistor and the NMOS transistor of the charge/discharge circuit.

(Supplementary Note 9)

The content addressable memory cell according to Supplementary note 7, wherein the magnetic element is arranged so as to be shared by the content addressable memories which are different each other.

(Supplementary Note 10)

The content addressable memory cell according to any one of Supplementary notes 1 to 9, characterized in that:

the variable-resistance-type non-volatile memory element has a plurality of resistance states.

(Supplementary Note 11)

The content addressable memory cell according to any one of Supplementary notes 1 to 9, characterized in that:

the variable-resistance-type non-volatile memory element has two resistance states.

(Supplementary Note 12)

A content addressable memory, comprising:

a plurality of content addressable memory cells which are arranged in a form of grid, wherein the content addressable memory cell includes:

a resistance network which includes a plurality of current paths, a logic circuit that is connected with the plural current paths and a pair of search lines and selects the current path in response to input data provided through the pair of search lines, and a variable-resistance-type non-volatile memory element that is arranged on at least one current path out of the plural current paths and stores data and whose resistance value is changed according to a result of logical calculation based on the input data and the stored data; and a charge/discharge circuit which is connected with the resistance network and a match line and whose delay time from inputting a signal through the match line until outputting the signal is changed according to the result of logical calculation based on the input data and the stored data.

(Supplementary Note 13)

The content addressable memory according to Supplementary note 12, characterized in that:

the charge/discharge circuit, comprising:

a CMOS inverter that includes a PMOS transistor whose source is connected with an end of an electrode, and a NMOS transistor whose drain is connected with a drain of the PMOS transistor and whose source is connected with one end of the variable-resistance-type non-volatile memory element; and an inverter whose input terminal is connected with the drains of the PMOS transistor and the NMOS transistor;

when a signal is inputted into a gate of the PMOS transistor, the CMOS inverter is reset or preset according to the inputted signal; and the CMOS inverter outputs a signal, which is inputted into a gate of the NMOS transistor, to the inverter which is at a rear position.

(Supplementary Note 14)

The content addressable memory according to Supplementary note 12, characterized in that:

the charge/discharge circuit, comprising:

a CMOS inverter that includes a PMOS transistor whose source is connected with an end of an electrode, and a NMOS transistor whose drain is connected with a drain of the PMOS transistor and whose source is connected with one end of the variable-resistance-type non-volatile memory element; and an inverter whose input terminal is connected with the drains of the PMOS transistor and the NMOS transistor;

when an inverted pre-charge signal is inputted into a gate of the PMOS transistor, the CMOS inverter is reset or preset according to the inputted pre-charge signal; and the CMOS inverter outputs a signal, which is inputted into a gate of the NMOS transistor, to the inverter which is at a rear position.

(Supplementary Note 15)

The content addressable memory according to Supplementary note 13 or 14, characterized in that:

the logic circuit includes a first and a second NMOS transistors;

the variable-resistance-type non-volatile memory element includes a first and a second variable-resistance-type non-volatile memory elements;

one end of the first variable-resistance-type non-volatile memory element and one end of the second variable-resistance-type non-volatile memory element are connected with the source of the NMOS transistor of the charge/discharge circuit;

the other end of the first variable-resistance-type non-volatile memory element is connected with a drain of the first NMOS transistor, and the other end of the second variable-resistance-type non-volatile memory element is connected with a drain of the second NMOS transistor; and sources of the first and the second NMOS transistors are grounded.

(Supplementary Note 16)

The content addressable memory according to Supplementary note 13 or 14, characterized in that:

the logic circuit includes a first and a second NMOS transistors;

the one end of the variable-resistance-type non-volatile memory element is connected with the source of the NMOS transistor of the charge/discharge circuit and a drain of the second NMOS transistor; and the other end of the variable-resistance-type non-volatile memory element is connected with a drain of the first NMOS transistor.

(Supplementary Note 17)

The content addressable memory according to Supplementary note 16, characterized in that:

sources of the first and the second NMOS transistors are grounded.

(Supplementary Note 18)

The content addressable memory according to Supplementary note 16, characterized in that:

a source of the first NMOS transistor is connected with one word line which is included in a pair of word lines, and a source of the second NMOS transistor is connected with the other word line of the pair; and the stored data is read and written according to a change in a state of the pair of word lines.

(Supplementary Note 19)

The content addressable memory according to Supplementary note 16 or 17, comprising:

a magnetic element section which includes:

a magnetic element which is arranged at a position where magnetic coupling between the variable-resistance-type non-volatile memory element and the magnetic element can work;

a third NMOS transistor whose one terminal out of a source and a drain is connected with one end of the magnetic element and whose the other terminal out of the source and the drain is connected with a writing bit line and whose gate is connected with a word line; and a fourth NMOS transistor whose one terminal out of a source and a drain is connected with the other end of the magnetic element and whose the other terminal out of the source and the drain is connected with a writing bit line and whose gate is connected with a word line.

(Supplementary Note 20)

The content addressable memory according to Supplementary note 19, wherein the one end of the magnetic element is connected with the drains of the PMOS transistor and the NMOS transistor of the charge/discharge circuit.

(Supplementary Note 21)

The content addressable memory according to Supplementary note 19, wherein the magnetic element is arranged so as to be shared by the content addressable memories which are different each other.

(Supplementary Note 22)

The content addressable memory according to any one Supplementary notes 12 to 21, characterized in that:

the content addressable memory includes:

a plurality of pairs of search lines which are connected with the plural content addressable memory cells arranged in a first direction;

a plurality of match lines which connect the plural content addressable memory cells, that are arranged in a second direction, in series;

a column side circuit which is connected with the plural pairs of search lines and drives the pair of search lines according to the input data at a time of calculation;

a row side circuit which is connected with the plural match lines and drives the plural match lines; and a sense circuit which is connected with the plural match lines and senses potential of the plural match lines;

a word circuit is composed by the plural content addressable memory cells which are arranged in the second direction, and the match line; and when carrying out a logical calculation based on the input data and the stored data, the word circuit changes a delay time of the match line according to the input data on the pair of search lines, and the stored data of the word circuit, and the sense circuit samples potential of the match line according to a clock signal which the sense circuit inputs.

(Supplementary Note 23)

A content addressable memory, characterized by comprising:

a plurality of content addressable memory cells which are arranged in a form of grid;

a plurality of pairs of search lines which are connected with the plural content addressable memory cells arranged in a first direction;

a plurality of match lines which connect the plural content addressable memory cells, that are arranged in a second direction, in series;

a word circuit which includes the plural content addressable memory cells that are arranged in the second direction, and the match line;

a column side circuit which is connected with the plural search lines and drives the pair of search lines according to the input data at a time of calculation;

a row side circuit which is connected with the plural match lines and drives the plural match lines; and a sense circuit which is connected with the plural match lines and senses potential of the plural match lines;

a resistance network which includes a plurality of current paths, a logic circuit that is connected with the plural current paths and the pair of search lines and selects the current path in response to the input data provided through the pair of search lines, and a variable-resistance-type non-volatile memory element that is arranged on at least one current path out of the plural current paths and stores data and whose resistance value is changed according to a result of logical calculation based on the input data and the stored data; and a charge/discharge circuit which is connected with the resistance network and the match line and whose delay time from inputting a signal through the match line until outputting the signal is changed according to the result of logical calculation based on the input data and the stored data.

(Supplementary Note 24)

The content addressable memory according to Supplementary note 22 or 23, characterized in that:

the content addressable memory includes a replica circuit which inputs a calculation start signal inputted into the row side circuit and which generates the clock signal inputted into the sense side circuit; and the sense circuit samples potential of the match line according to the clock signal which the sense circuit inputs.

(Supplementary Note 25)

The content addressable memory according to Supplementary note 22 or 23, characterized in that:

the sense circuit includes a comparison circuit which compares delay times of two different match lines out of the plural match lines, and detects which delay time out of the two different delay times is longer.

(Supplementary Note 26)

The content addressable memory according to Supplementary note 22 or 23, characterized in that:

the content addressable memory includes a data inputting circuit which inputs the input data and outputs the input data to the column side circuit, and a data outputting circuit which outputs at least a part of the input data outputted by the plural sense circuits.

(Supplementary Note 27)

The content addressable memory according to Supplementary note 26, characterized in that:

a long side of the data outputting circuit of the content addressable memory which is arranged at a front position, and a long side of the data inputting circuit of the content addressable memory which is arranged at a rear position are arranged so as to be opposite each other.

(Supplementary Note 28)

The content addressable memory according to Supplementary note 22 or 23, characterized in that:

the content addressable memory includes a data inputting circuit which inputs the input data and outputs the input data to the column side circuit, and a data outputting circuit which outputs at least a part of the input data outputted by the plural sense circuits; and a long side of the data outputting circuit of the content addressable memory which is arranged at a front position, and a long side of the data inputting circuit of the content addressable memory which is arranged at a rear position are arranged so as to be opposite each other.

(Supplementary Note 29)

The content addressable memory according to any one of Supplementary notes 26 to 28, characterized in that:

the data inputting circuits and the data outputting circuits, which are included in a plurality of content addressable memories, are connected with programmable switches which are arranged on a plurality of wirings, and data are sent and received between any two content addressable memories which are different each other.

(Supplementary Note 30)

The content addressable memory according to any one of Supplementary notes 12 to 29, characterized in that:

the variable-resistance-type non-volatile memory element has a plurality of resistance states.

(Supplementary Note 31)

The content addressable memory according to any one of Supplementary notes 12 to 30, characterized in that: the variable-resistance-type non-volatile memory element has two resistance states.

This application is based upon and claims the benefit of priority from Japanese Patent Application No. 2013-133483, filed on Jun. 26, 2013, the disclosure of which is incorporated herein in its entirety by reference.

REFERENCE SIGNS LIST 1, 2, 3, 4, 5 and 6 content addressable memory
10, 20, 30, 40, 50 and 60 content addressable memory cell
11, 21, 31, 41, 51 and 61 column side circuit
12, 22, 32, 42, 52 and 62 row side circuit
13, 23, 27, 33, 43, 53 and 63 sense circuit
14, 24, 34, 44, 54 and 64 word circuit
15 charge/discharge circuit
16 resistance network
17 replica circuit
54 data inputting circuit
56 data outputting circuit
57 programmable switch
68 wiring
100, 101, 121, 122, 200, 300, 400, 401, 600 and 601 content addressable memory
120, 130, 220, 230 and 283 buffer
150, 155, 175, 250, 350, 450, 610 and 650 charge/discharge circuit
151, 156, 166, 167, 191, 196, 251, 266, 267, 275, 276, 277, 278, 279, 351, 371, 372, 451, 466, 467, 491, 492, 611, 628, 629, 648, 649 and 651 NMOS transistor
152, 157, 177, 252, 271, 272, 273, 274, 352, 452, 612 and 652 PMOS transistor
153, 158, 178, 253, 280, 282, 353, 453, 613 and 653 inverter
160, 180, 185, 260, 360, 460, 620 and 640 resistance network
165, 190, 195, 265, 370, 465, 627 and 647 NMOS logic circuit
171 replica cell circuit A
172 replica cell circuit B
270 comparison circuit
471, 631 and 661 sense layer
472, 632 and 662 tunnel barrier layer
473, 633 and 663 reference layer
480 and 680 magnetic element
481 and 681 record layer
482 and 682 first fixation layer
483 and 683 second fixation layer
484 and 684 first fixation area
485 and 685 second fixation area
486 and 686 inversion area
490 and 690 magnetic domain wall

The invention claimed is:

1. A content addressable memory cell, comprising:
a resistance network which includes a plurality of current paths, a logic circuit that is connected with the plurality of current paths and a pair of search lines and selects one of the plurality of current paths in response to input data provided through the pair of search lines, and a variable-resistance-type non-volatile memory element that is arranged on at least one current path out of the plurality of current paths and stores data and whose resistance value is changed according to a result of logical calculation based on the input data and the stored data; and
a charge/discharge circuit which is connected with the resistance network and a match line and whose delay time from inputting a signal through the match line until outputting the signal is changed according to the result of logical calculation based on the input data and the stored data.

2. The content addressable memory cell according to claim 1, wherein the charge/discharge circuit comprising:
a CMOS inverter that includes a PMOS transistor whose source is connected with an end of an electrode, and a NMOS transistor whose drain is connected with a drain of the PMOS transistor and whose source is connected with one end of the variable-resistance-type non-volatile memory element; and
an inverter whose input terminal is connected with the drains of the PMOS transistor and the NMOS transistor;
when a signal is inputted into a gate of the PMOS transistor, the CMOS inverter is reset or preset according to the inputted signal; and
the CMOS inverter outputs a signal, which is inputted into a gate of the NMOS transistor, to the inverter which is at a rear position.

3. The content addressable memory cell according to claim 2, wherein the logic circuit includes a first and a second NMOS transistors; wherein
the variable-resistance-type non-volatile memory element includes a first and a second variable-resistance-type non-volatile memory elements; wherein
one end of the first variable-resistance-type non-volatile memory element and one end of the second variable-resistance-type non-volatile memory element are connected with the source of the NMOS transistor of the charge/discharge circuit;
the other end of the first variable-resistance-type non-volatile memory element is connected with a drain of the first NMOS transistor, and the other end of the second variable-resistance-type non-volatile memory element is connected with a drain of the second NMOS transistor; and
sources of the first and the second NMOS transistors are grounded.

4. The content addressable memory cell according to claim 2, wherein the logic circuit includes a first and a second NMOS transistors; wherein
the one end of the variable-resistance-type non-volatile memory element is connected with the source of the NMOS transistor of the charge/discharge circuit and a drain of the second NMOS transistor;
the other end of the variable-resistance-type non-volatile memory element is connected with a drain of the first NMOS transistor; and
sources of the first and the second NMOS transistors are grounded.

5. The content addressable memory cell according to claim 4, further comprising a magnetic element section which includes:
a magnetic element which is arranged at a position where magnetic coupling between the variable-resistance-type non-volatile memory element and the magnetic element can work;
a third NMOS transistor whose one terminal out of a source and a drain is connected with one end of the magnetic element and whose other terminal out of the source and the drain is connected with a writing bit line and whose gate is connected with a word line; and
fourth NMOS transistor whose one terminal out of a source and a drain is connected with the other end of the magnetic element and whose other terminal out of the source and the drain is connected with a writing bit line and whose gate is connected with a word line.

6. The content addressable memory cell according to claim 5, wherein
the magnetic element is arranged so as to be shared by content addressable memory cells which are different each other.

7. A content addressable memory, wherein the content addressable memory includes:
a plurality of content addressable memory cells which are arranged in a form of grid;
a plurality of pairs of search lines each of which is connected with the plurality of content addressable memory cells arranged in a first direction;
a plurality of match lines connecting the plurality of content addressable memory cells, which are arranged in a second direction, in series;
a column side circuit which is connected with the plurality of pairs of search lines and drives the plurality of pairs of search lines according to input data at a time of calculation;
a row side circuit which is connected with the plurality of match lines and drives the plurality of match lines; and
a sense circuit which is connected with the plurality of match lines and senses potential of the plurality of match lines; wherein
the plurality of content addressable memory cells each include:
a resistance network which includes a plurality of current paths, a logic circuit that is connected with the plurality of current paths and one of the plurality of pairs of search lines and selects one of the plurality of current paths in response to the input data provided through the one of the plurality of pairs of search lines, and a variable-resistance-type non-volatile memory element that is arranged on at least one current path out of the plurality of current paths and stores data and whose resistance value is changed according to a result of logical calculation based on the input data and the stored data; and
a charge/discharge circuit which is connected with the resistance network and one of the plurality of match lines and whose delay time from inputting a signal through the one of the plurality of match lines until outputting the signal is changed according to the result of logical calculation based on the input data and the stored data.

8. The content addressable memory according to claim 7, wherein the content addressable memory comprises a replica circuit which inputs a calculation start signal inputted into the row side circuit and which generates a clock signal inputted into the sense circuit; wherein
the sense circuit samples potential of the one of the plurality of match lines according to the clock signal which the sense circuit inputs.

9. The content addressable memory according to claim 7, wherein the sense circuit includes a comparison circuit which compares a first delay time of a first match line of the plurality of match lines to a second delay time of a second match line of the plurality of match lines and detects which of the first delay time and the second delay time is longer.

10. The content addressable memory according to claim 7, wherein the content addressable memory includes
a plurality of sense circuits, the sense circuit being one of the plurality of sense circuits,
a data inputting circuit which inputs the input data and outputs the input data to the column side circuit, and
a data outputting circuit which outputs at least a part of the input data which the plurality of sense circuits output; wherein
a long side of the data outputting circuit of the content addressable memory which is arranged at a front position, and a long side of the data inputting circuit of the content addressable memory which is arranged at a rear position are arranged so as to be opposite each other.

* * * * *

UNITED STATES PATENT AND TRADEMARK OFFICE
CERTIFICATE OF CORRECTION

PATENT NO. : 10,262,738 B2
APPLICATION NO. : 14/392273
DATED : April 16, 2019
INVENTOR(S) : Ryusuke Nebashi, Noboru Sakimura and Tadahiko Sugibayashi Page 1 of 1

It is certified that error appears in the above-identified patent and that said Letters Patent is hereby corrected as shown below:

In the Specification

Column 7, Description of Embodiments, Line 10; Delete "NO" and insert --N0-- therefor Column 15, Description of Embodiments, Line 42; Delete "NO," and insert --N0,-- therefor Column 18, Description of Embodiments, Line 32; After "B", insert --.--

Column 25, Description of Embodiments, Line 20; Delete "two-dimensional," and insert --two-dimensional-- therefor Column 32, Description of Embodiments, Line 25; Delete "i'2" and insert --T2-- therefor Column 37, Description of Embodiments, Line 15; Delete "NO" and insert --N0-- therefor Column 37, Description of Embodiments, Line 18; Delete "NO" and insert --N0-- therefor Column 47, Description of Embodiments, Line 59; After "one", insert --of--

Signed and Sealed this
Twentieth Day of August, 2019

Andrei Iancu
*Director of the United States Patent and Trademark Office*